(12) United States Patent
Sukegawa et al.

(10) Patent No.: US 8,981,472 B2
(45) Date of Patent: Mar. 17, 2015

(54) MOS TRANSISTOR AND FABRICATION METHOD OF SEMICONDUCTOR INTEGRATED CIRCUIT DEVICE

(75) Inventors: Takae Sukegawa, Yokohama (JP); Youichi Momiyama, Yokohmama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 79 days.

(21) Appl. No.: 13/293,252

(22) Filed: Nov. 10, 2011

(65) Prior Publication Data

US 2012/0193709 A1 Aug. 2, 2012

(30) Foreign Application Priority Data

Jan. 27, 2011 (JP) ................. 2011-015515

(51) Int. Cl.
*H01L 29/78* (2006.01)
*H01L 21/8238* (2006.01)
(Continued)

(52) U.S. Cl.
CPC .... *H01L 29/7816* (2013.01); *H01L 21/823807* (2013.01); *H01L 21/823814* (2013.01);
(Continued)

(58) Field of Classification Search
CPC ............... H01L 21/823807; H01L 21/823814; H01L 29/66659; H01L 29/66689; H01L 29/7816; H01L 29/7835; H01L 27/0922; H01L 29/0653; H01L 29/0847; H01L 29/086; H01L 29/0878; H01L 29/456; H01L 29/4933; H01L 29/665; H01L 29/0696; H01L 29/78
USPC .................. 257/343, 337, E29.268, E21.417; 438/289, 290, 286
See application file for complete search history.

(56) References Cited

U.S. PATENT DOCUMENTS

| | | | |
|---|---|---|---|
| 5,981,997 | A | 11/1999 | Kitamura |
| 6,451,640 | B1 | 9/2002 | Ichikawa |
| 6,700,160 | B1 | 3/2004 | Merchant |
| 6,780,713 | B2 | 8/2004 | Bromberger et al. |
| 7,301,185 | B2 | 11/2007 | Chen |

(Continued)

FOREIGN PATENT DOCUMENTS

| | | |
|---|---|---|
| JP | 09-223793 A | 8/1997 |
| JP | 9-260651 A | 10/1997 |

(Continued)

OTHER PUBLICATIONS

Japanese Office Action mailed Apr. 8, 2014 for corresponding Japanese Application No. 2011-015515, with Partial English Translation, 6 pages.

*Primary Examiner* — Asok K Sarkar
*Assistant Examiner* — Dmitry Yemelyanov
(74) *Attorney, Agent, or Firm* — Fujitsu Patent Center

(57) ABSTRACT

A high-voltage MOS transistor has a semiconductor substrate formed with a first well of a first conductivity type in which a drain region and a drift region are formed and a second well of a second, opposite conductivity type in which a source region and a channel region are formed, a gate electrode extends over the substrate from the second well to the first well via a gate insulation film, wherein there is formed a buried insulation film in the drift region underneath the gate insulation film at a drain edge of the gate electrode, there being formed an offset region in the semiconductor substrate between the channel region and the buried insulation film, wherein the resistance of the offset region is reduced in a surface part thereof by being introduced with an impurity element of the first conductivity type with a concentration exceeding the first well.

10 Claims, 48 Drawing Sheets

(51) Int. Cl.
   *H01L 29/66*       (2006.01)
   *H01L 27/092*      (2006.01)
   *H01L 29/06*       (2006.01)
   *H01L 29/08*       (2006.01)
   *H01L 29/45*       (2006.01)
   *H01L 29/49*       (2006.01)

(52) U.S. Cl.
   CPC .... *H01L29/66659* (2013.01); *H01L 29/66689* (2013.01); *H01L 29/7835* (2013.01); *H01L 27/0922* (2013.01); *H01L 29/0653* (2013.01); *H01L 29/0847* (2013.01); *H01L 29/086* (2013.01); *H01L 29/0878* (2013.01); *H01L 29/456* (2013.01); *H01L 29/4933* (2013.01); *H01L 29/665* (2013.01); *H01L 29/0696* (2013.01)
   USPC ............ 257/335; 257/337; 257/339; 257/327

(56) References Cited

U.S. PATENT DOCUMENTS

| | | | |
|---|---|---|---|
| 8,143,130 B1 * | 3/2012 | Huang | 438/289 |
| 8,507,982 B2 | 8/2013 | Yamashina et al. | |
| 2003/0022452 A1 * | 1/2003 | Petti | 438/302 |
| 2003/0127694 A1 * | 7/2003 | Morton et al. | 257/371 |
| 2004/0222488 A1 * | 11/2004 | Abadeer et al. | 257/510 |
| 2005/0253191 A1 * | 11/2005 | Pendharkar et al. | 257/335 |
| 2010/0117150 A1 * | 5/2010 | Pendharkar et al. | 257/337 |
| 2010/0140699 A1 | 6/2010 | Ko | |

FOREIGN PATENT DOCUMENTS

| | | |
|---|---|---|
| JP | 10-189762 A | 7/1998 |
| JP | 2003-60204 A | 2/2003 |
| JP | 2006-156990 A | 6/2006 |
| JP | 2010-135800 A | 6/2010 |
| JP | 2011-187853 A | 9/2011 |

\* cited by examiner

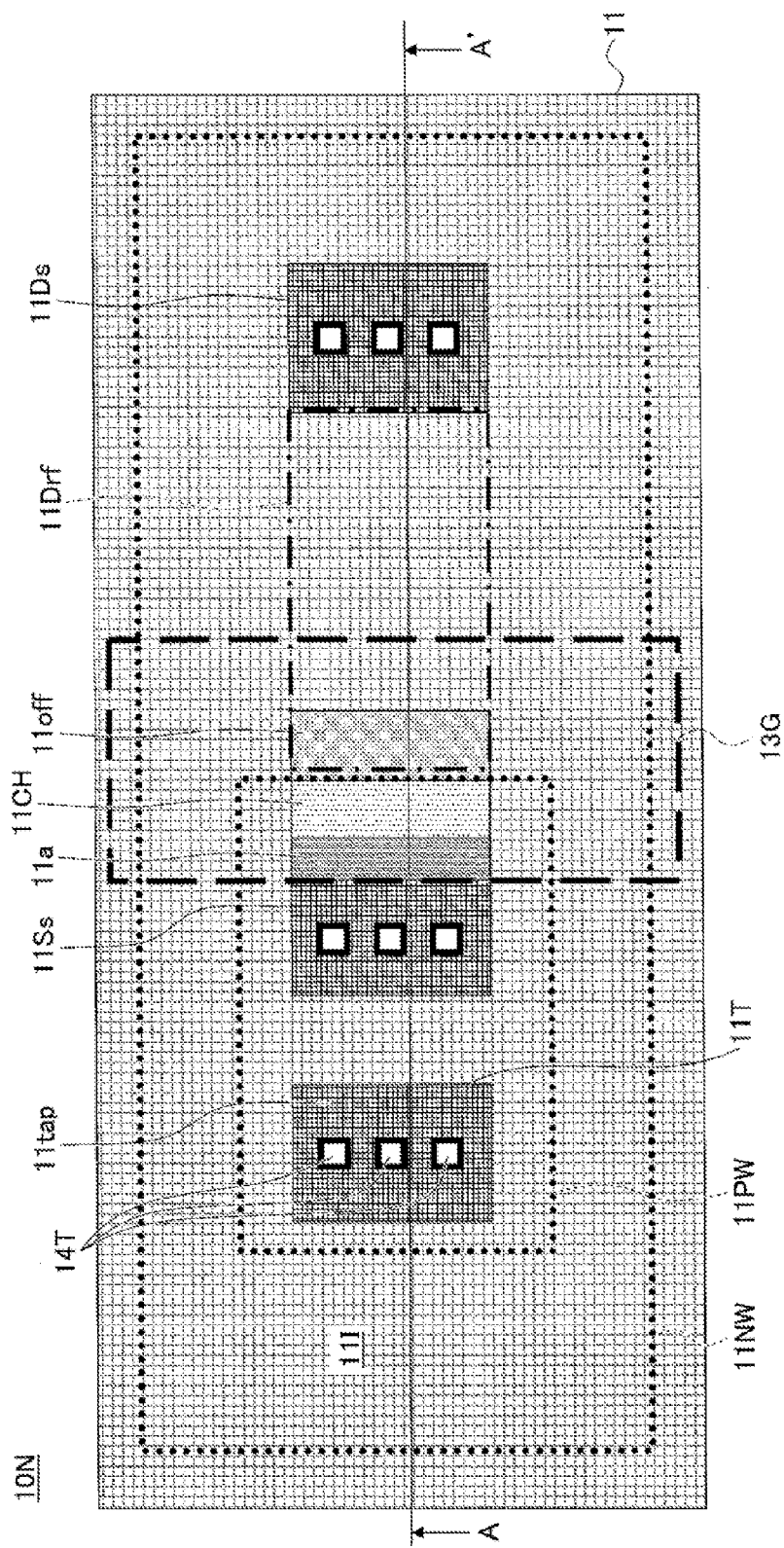

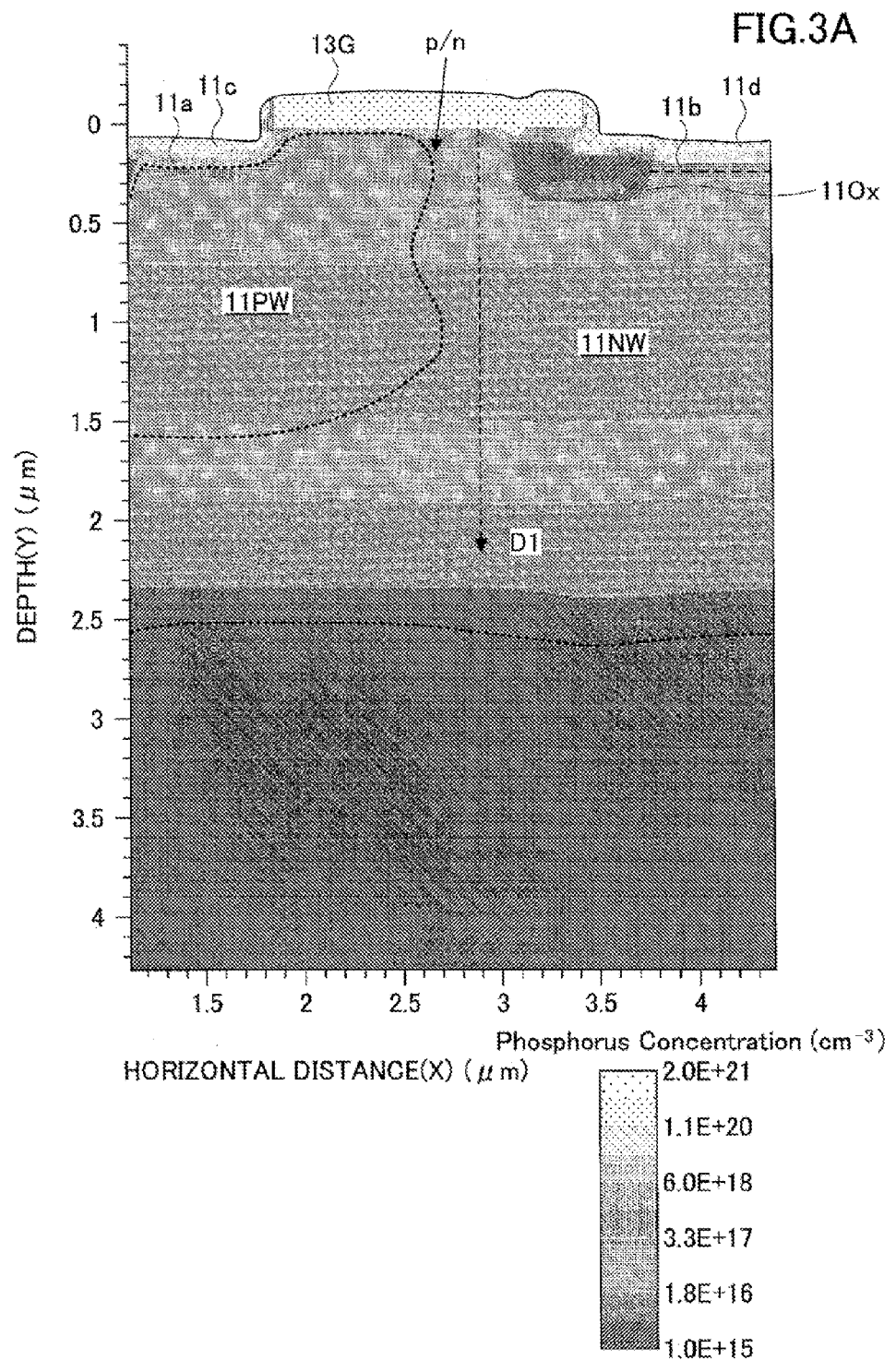

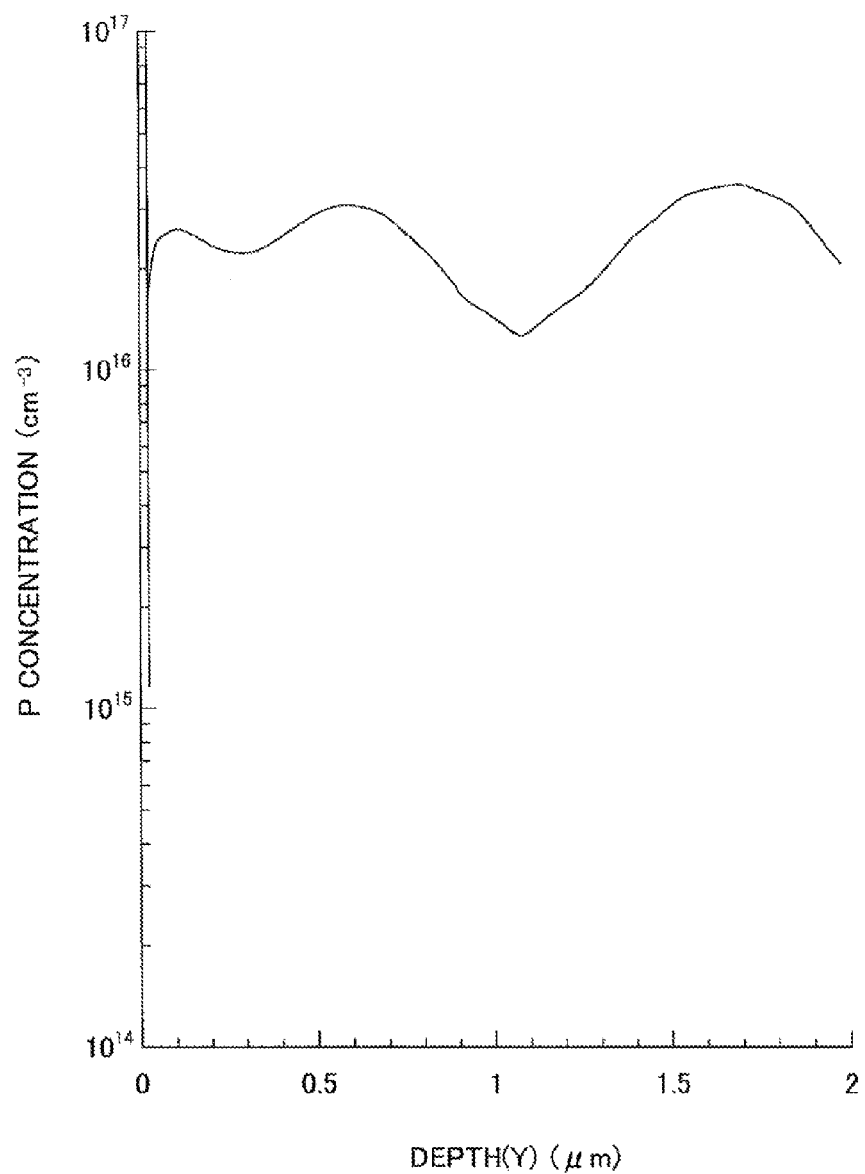

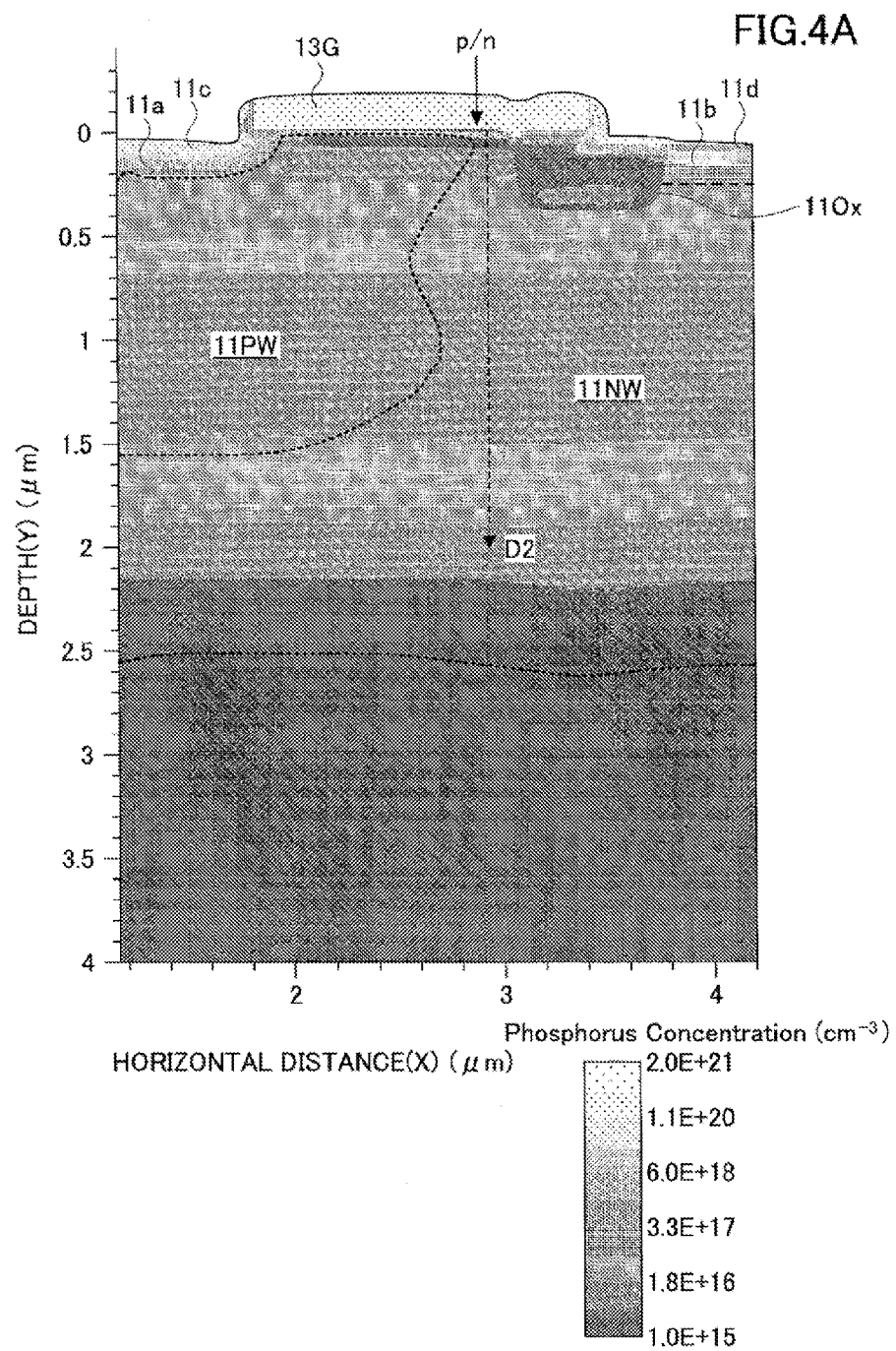

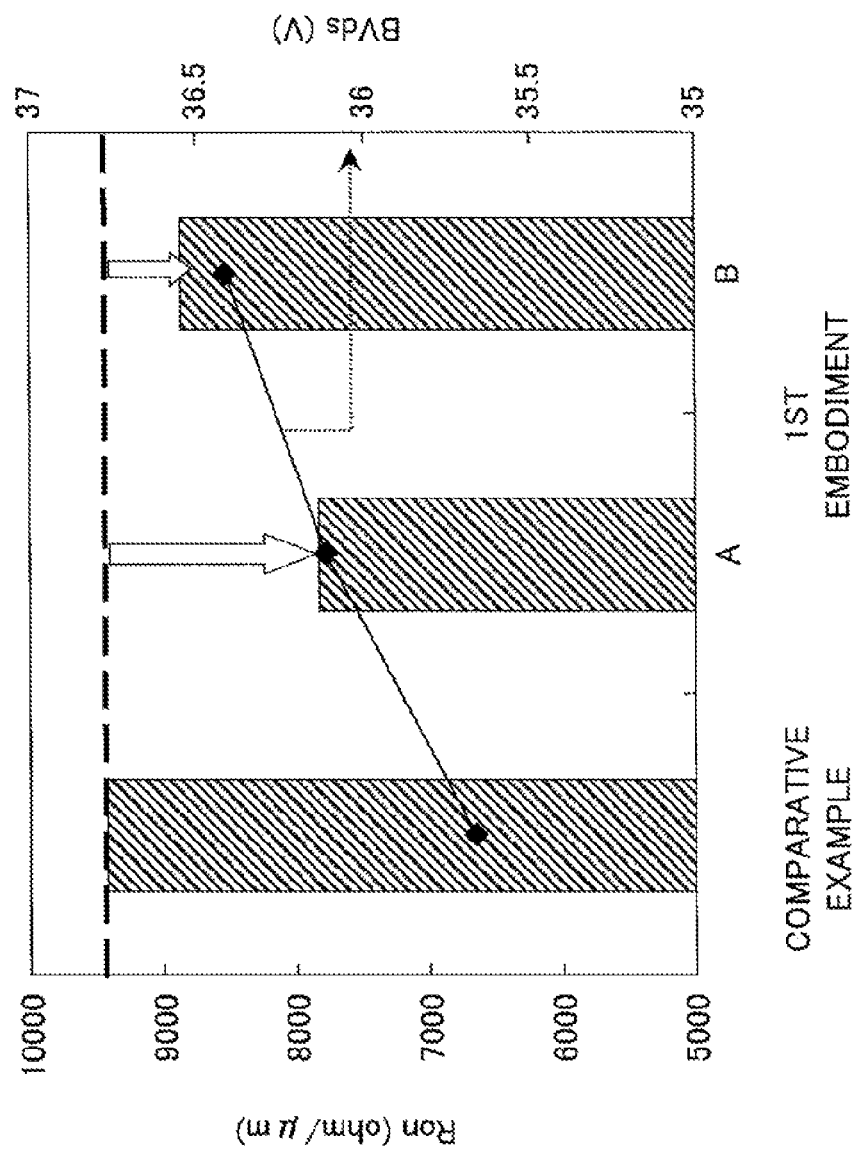

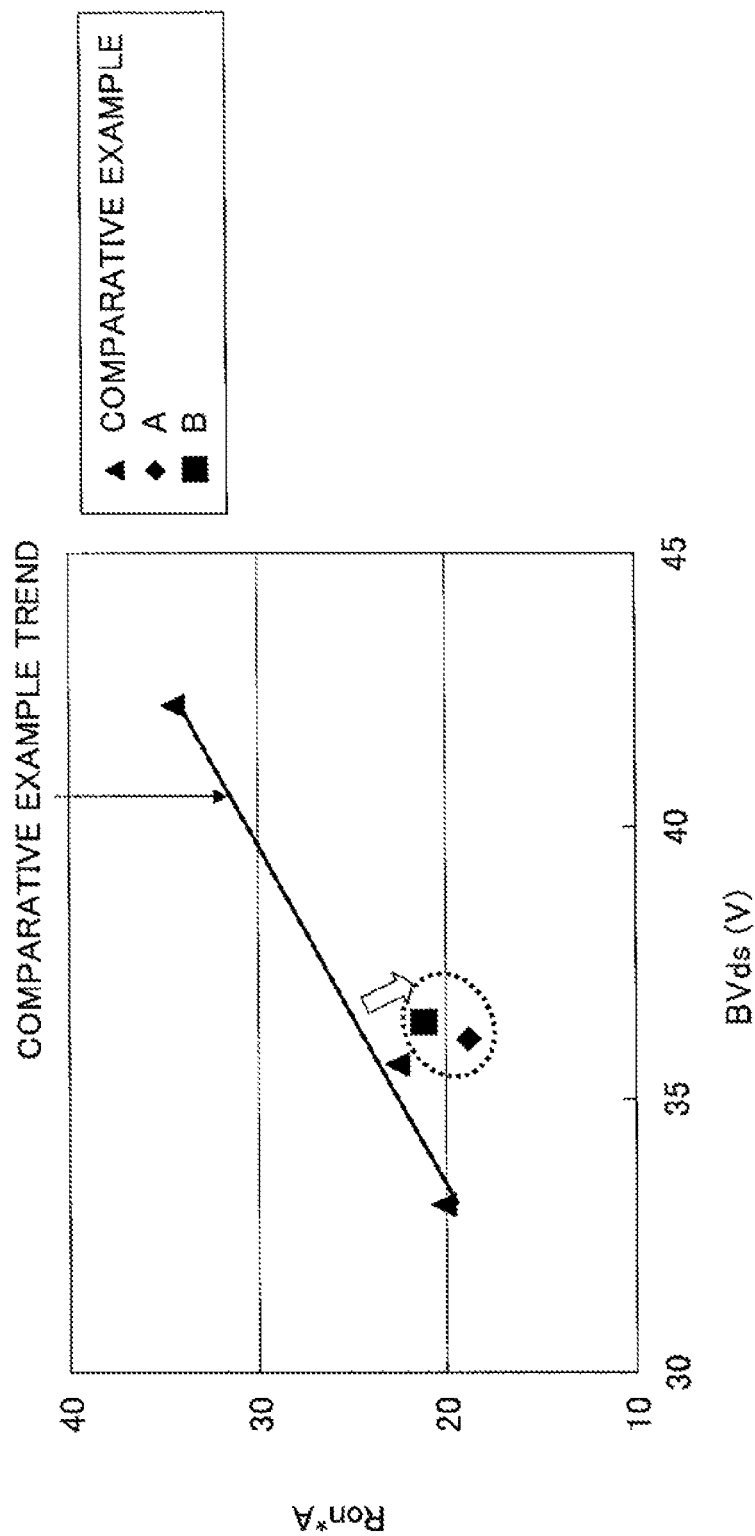

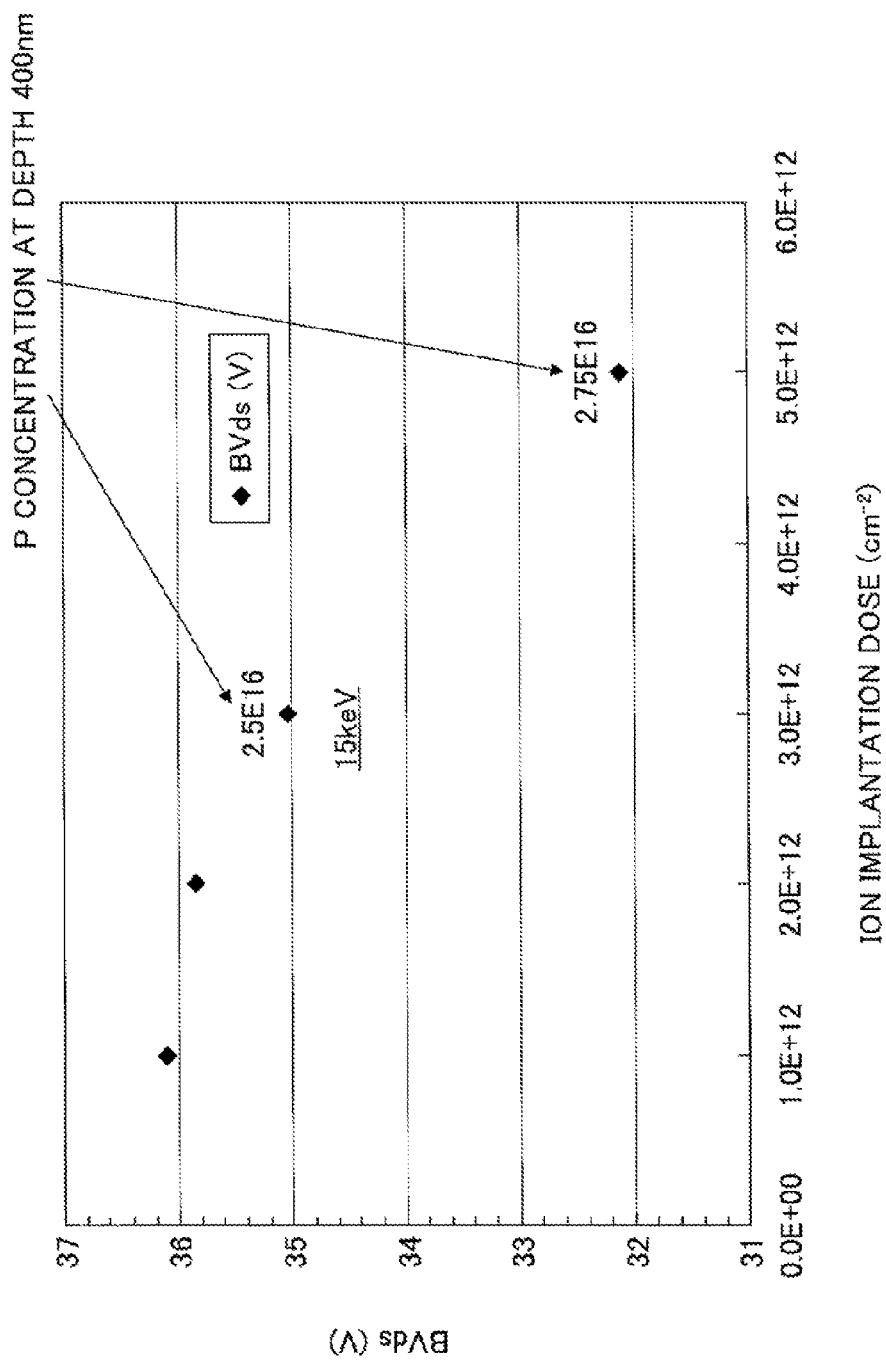

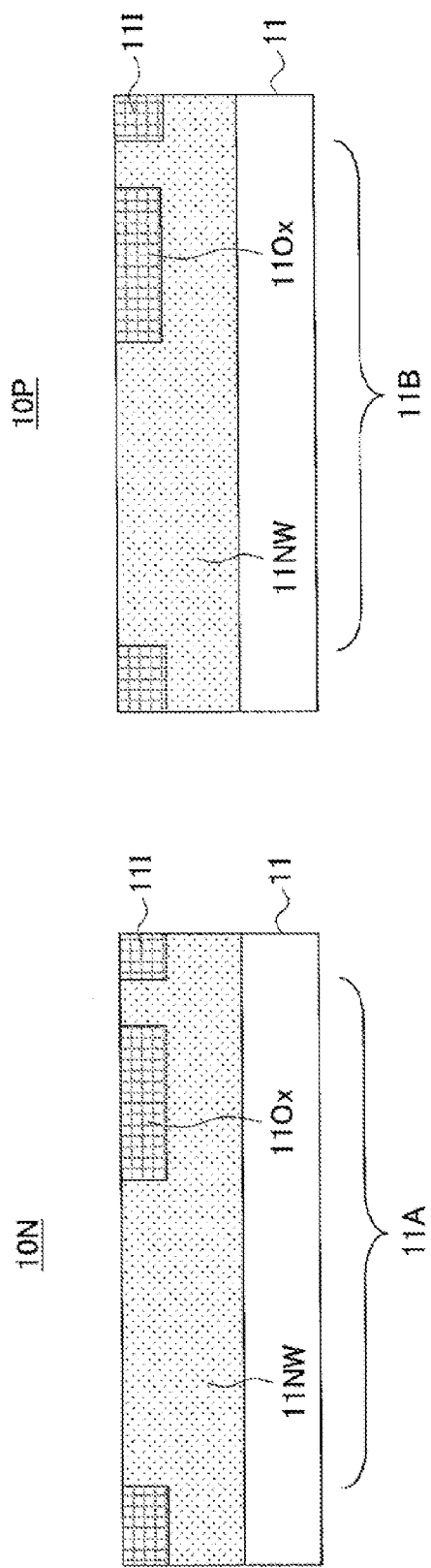

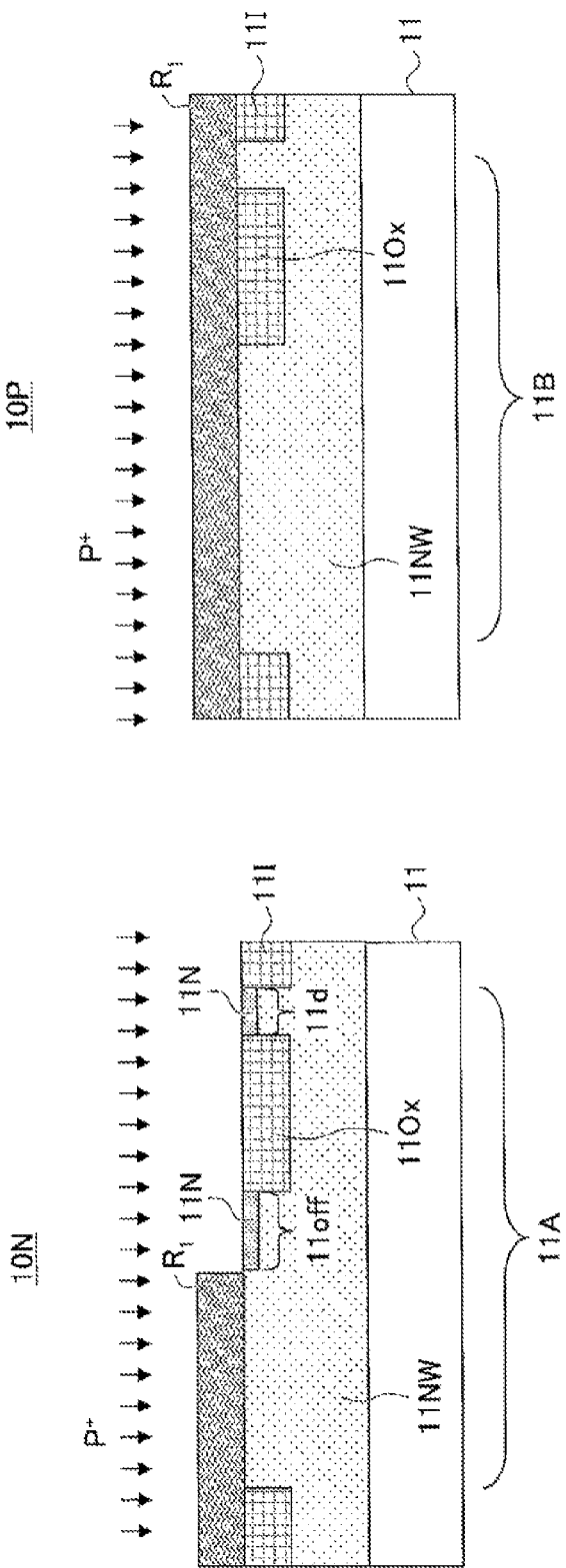

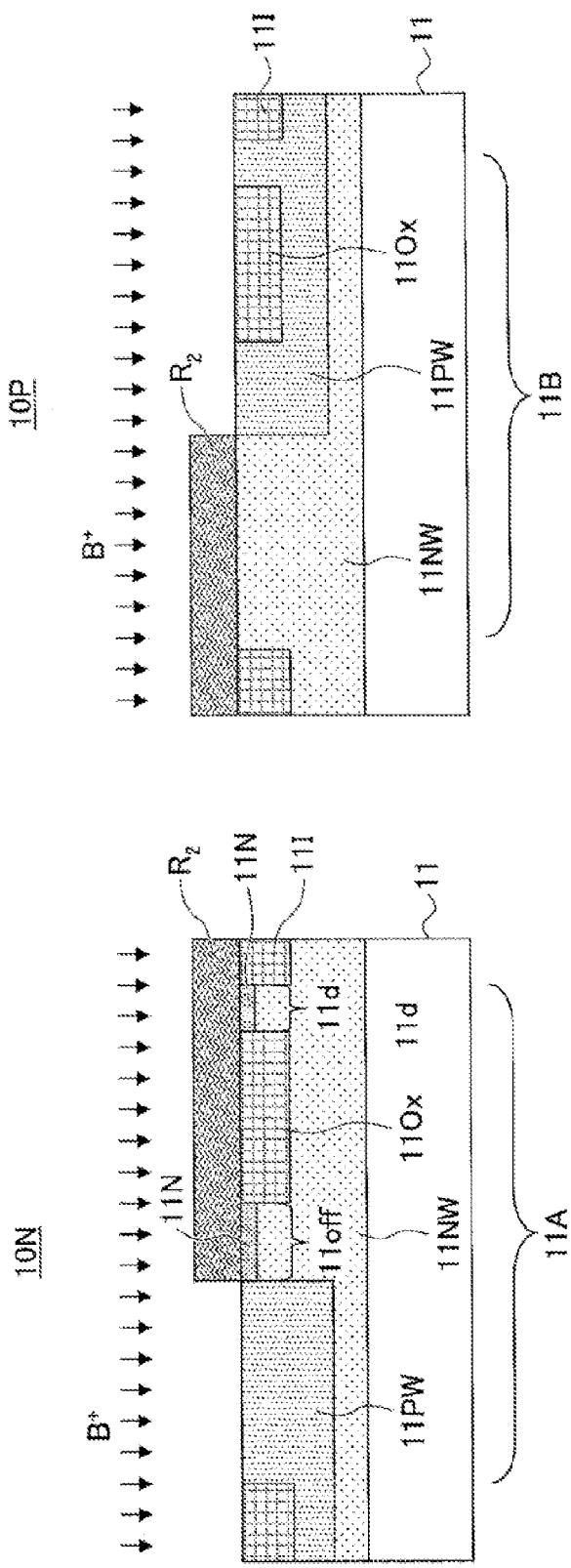

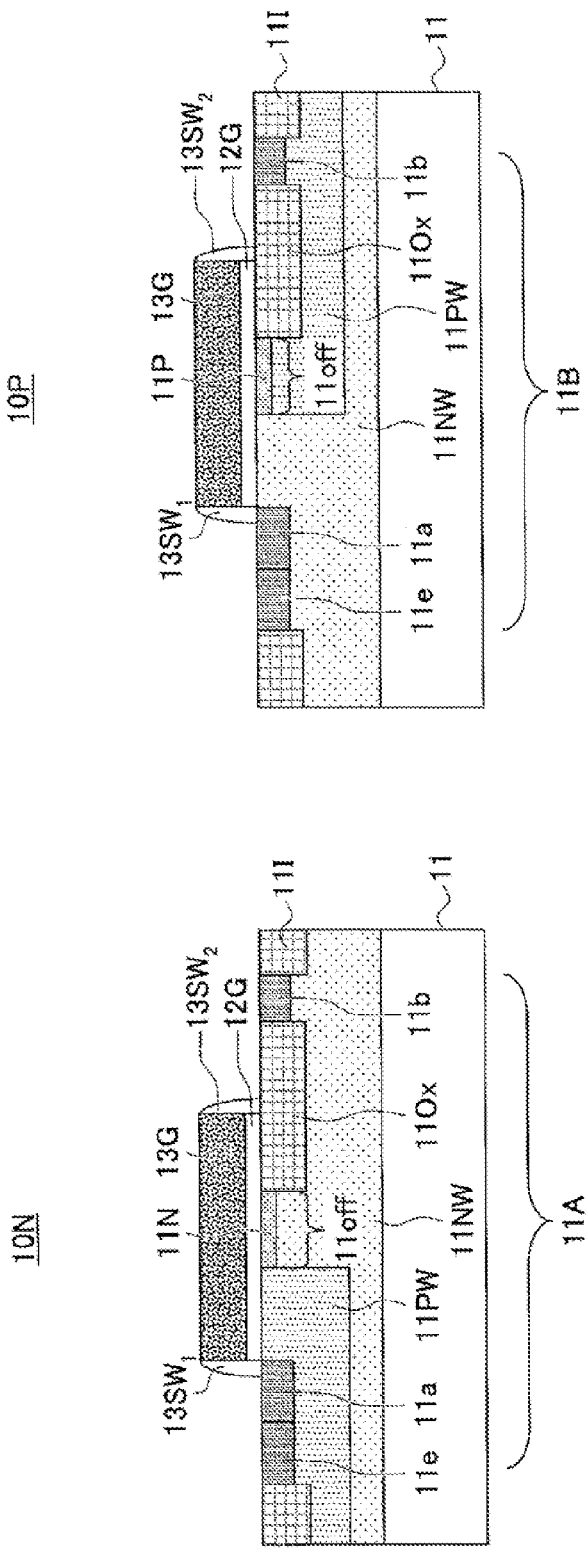

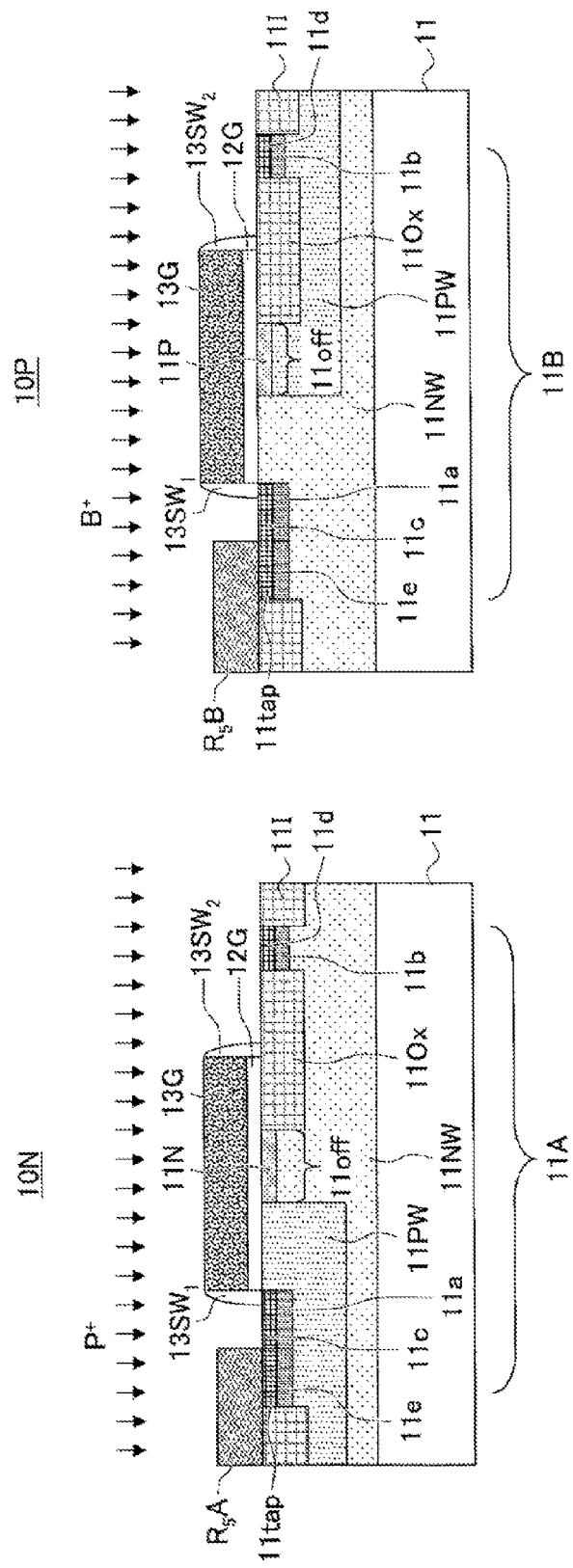

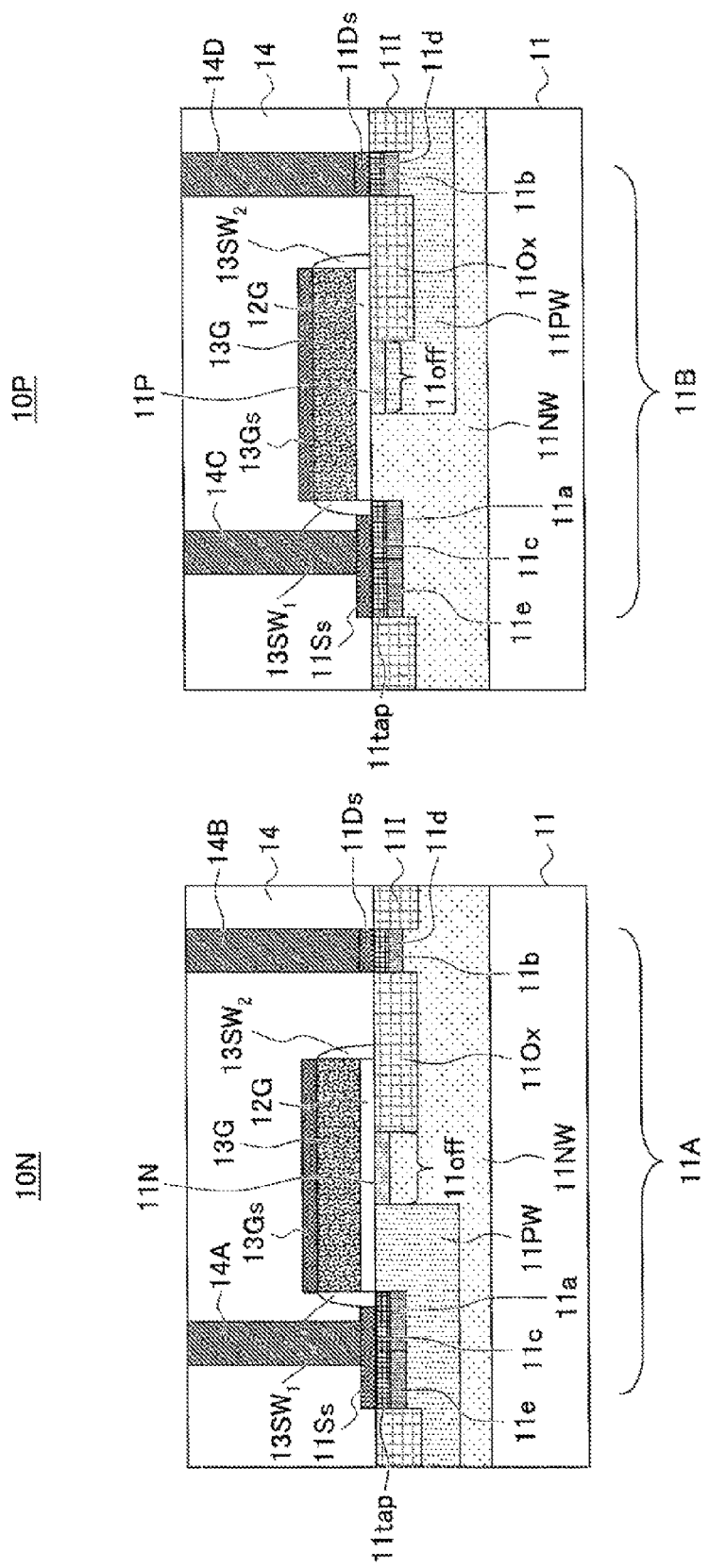

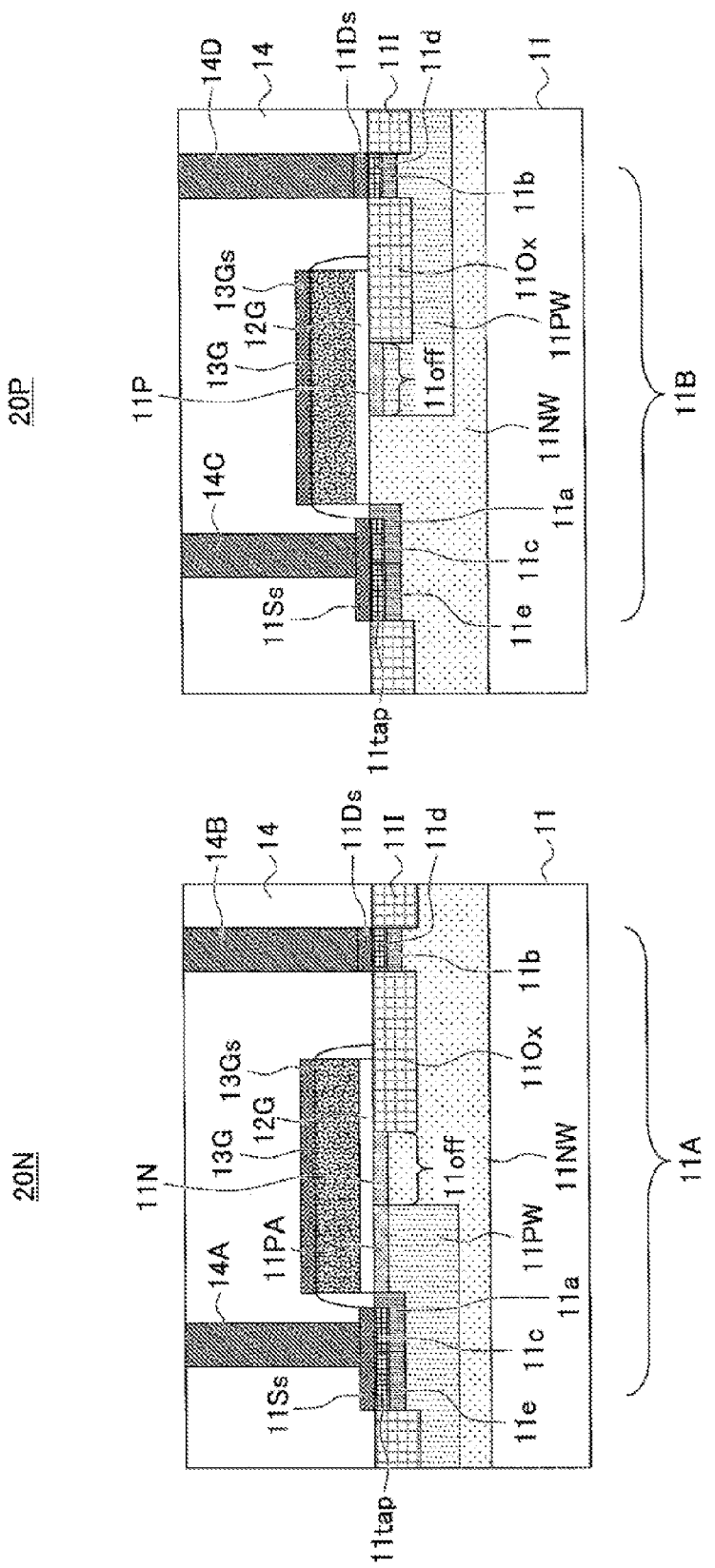

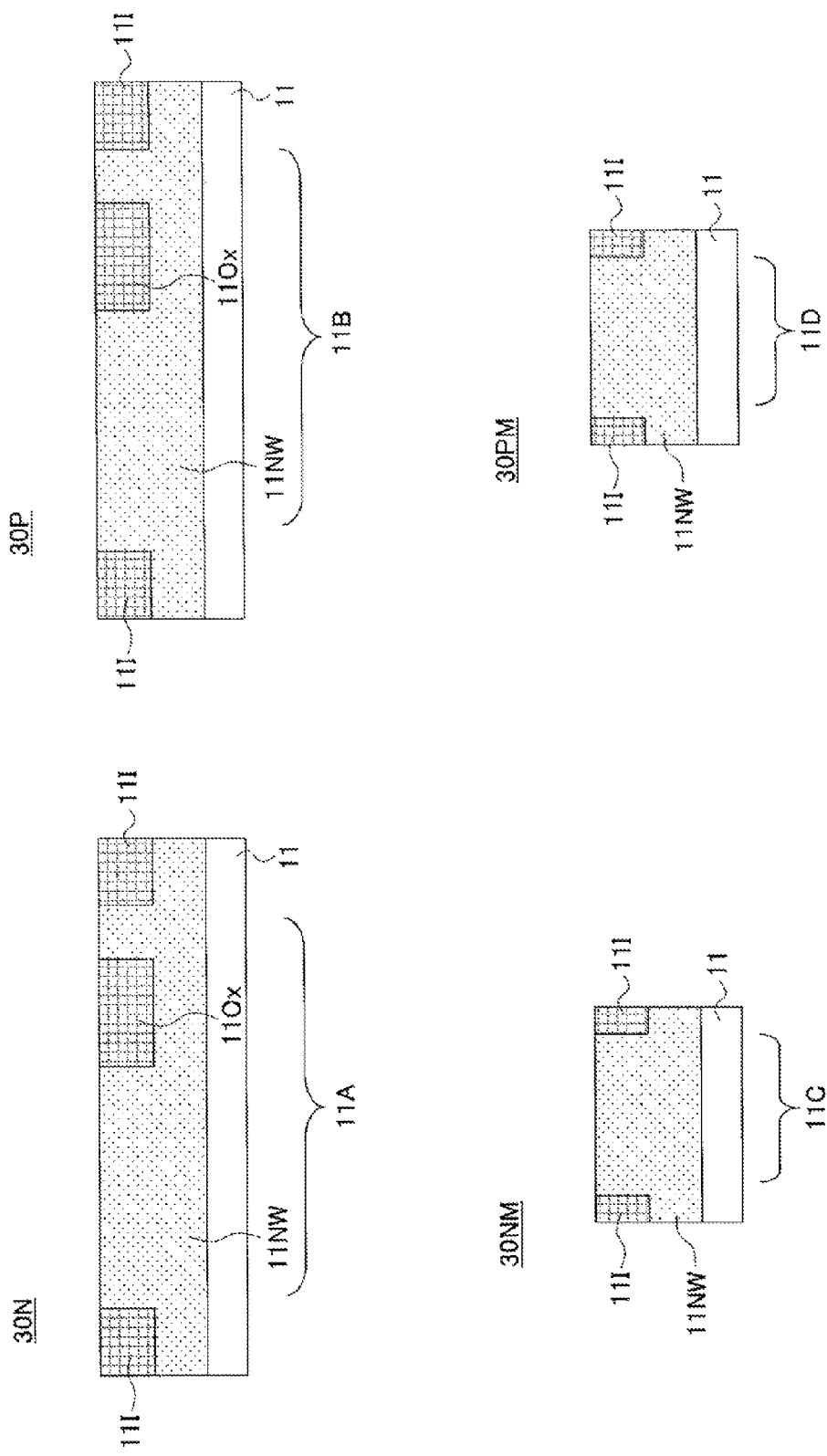

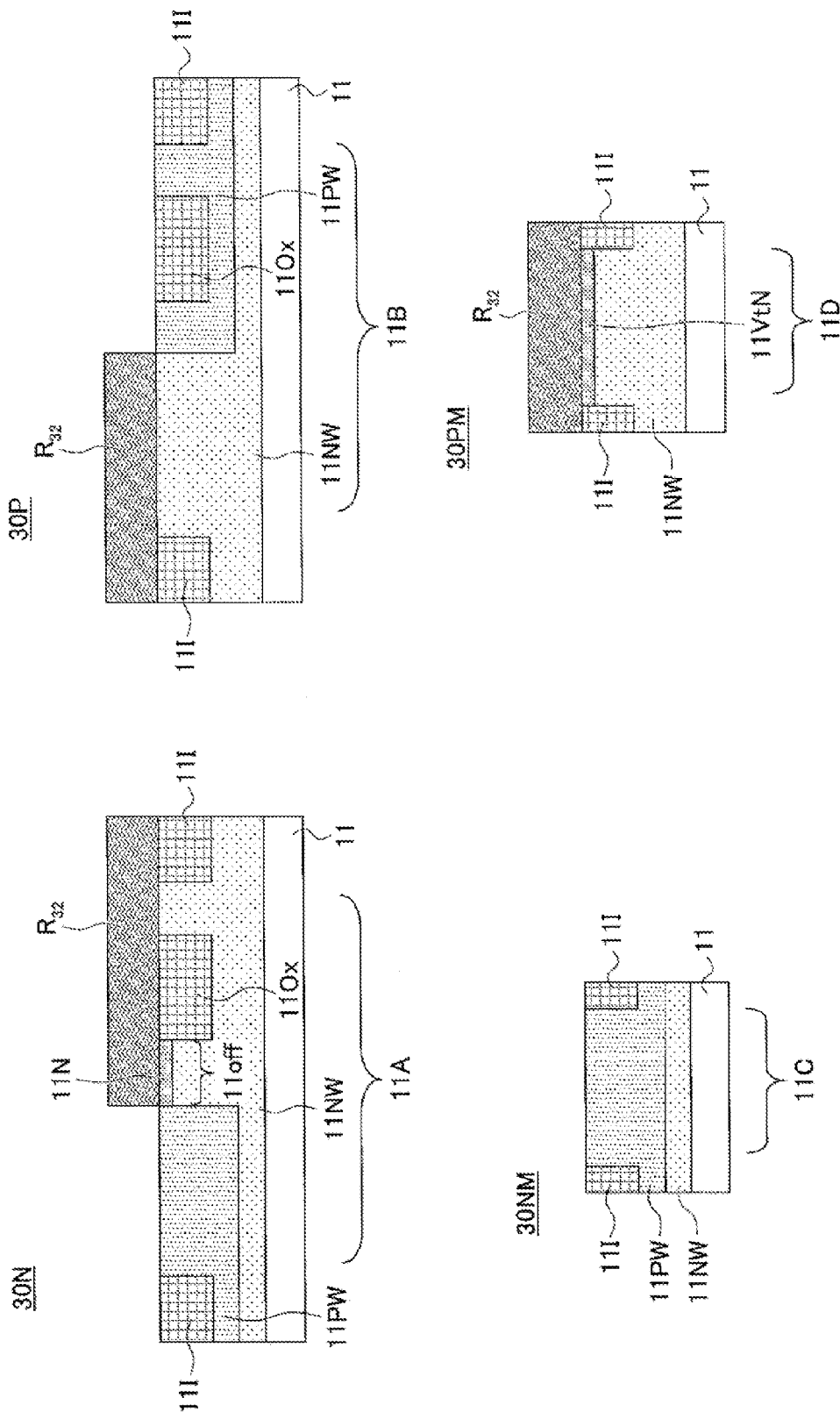

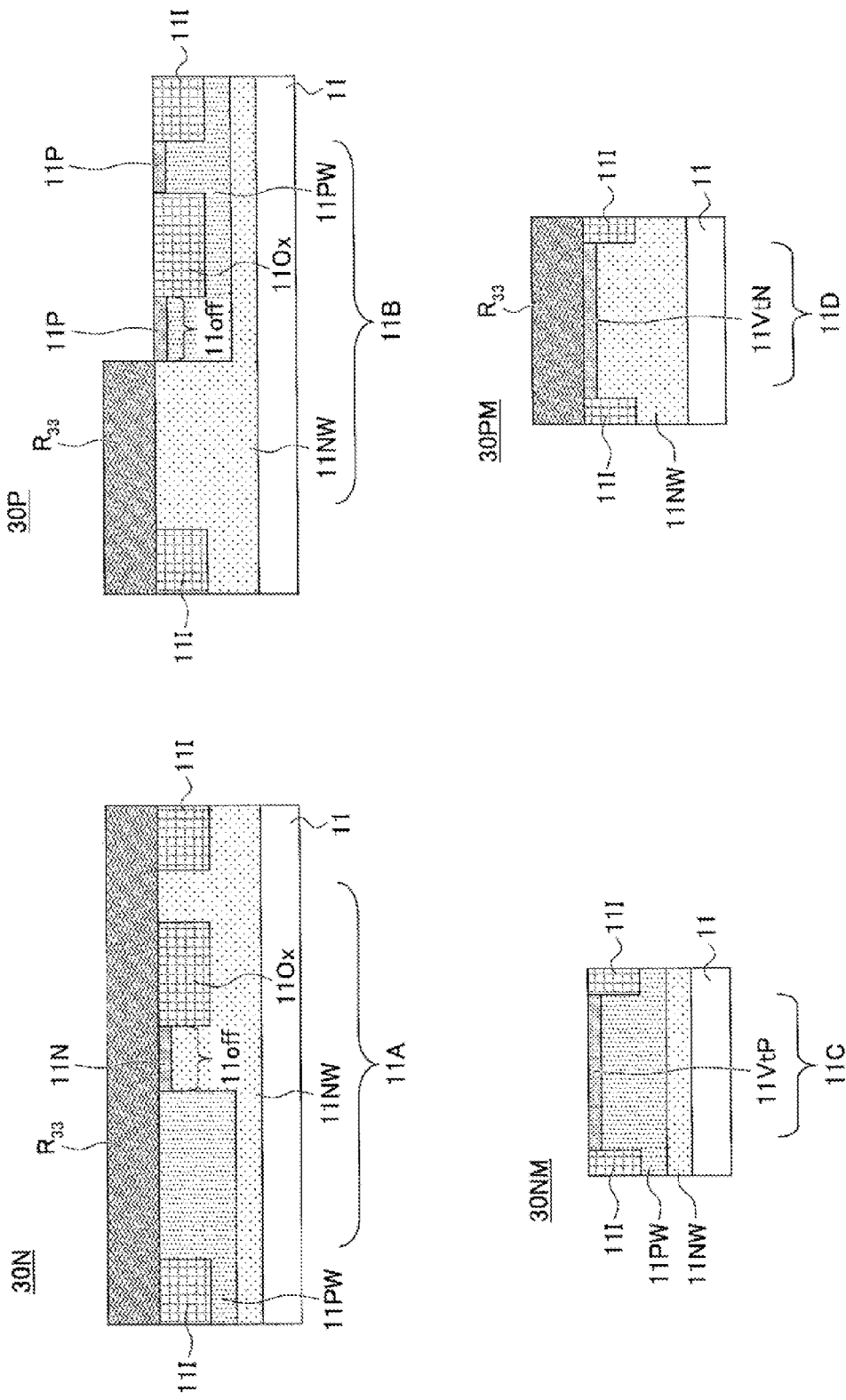

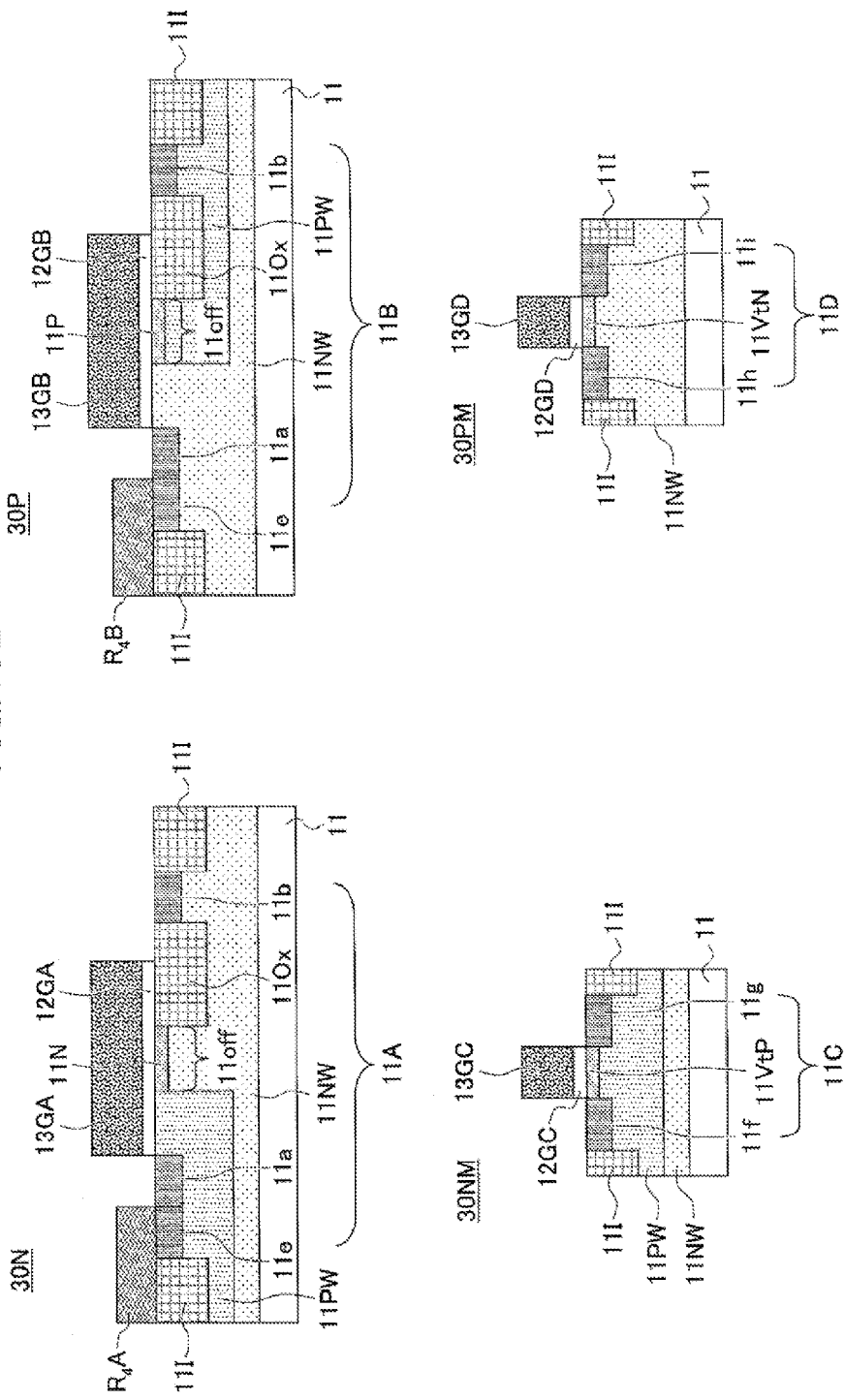

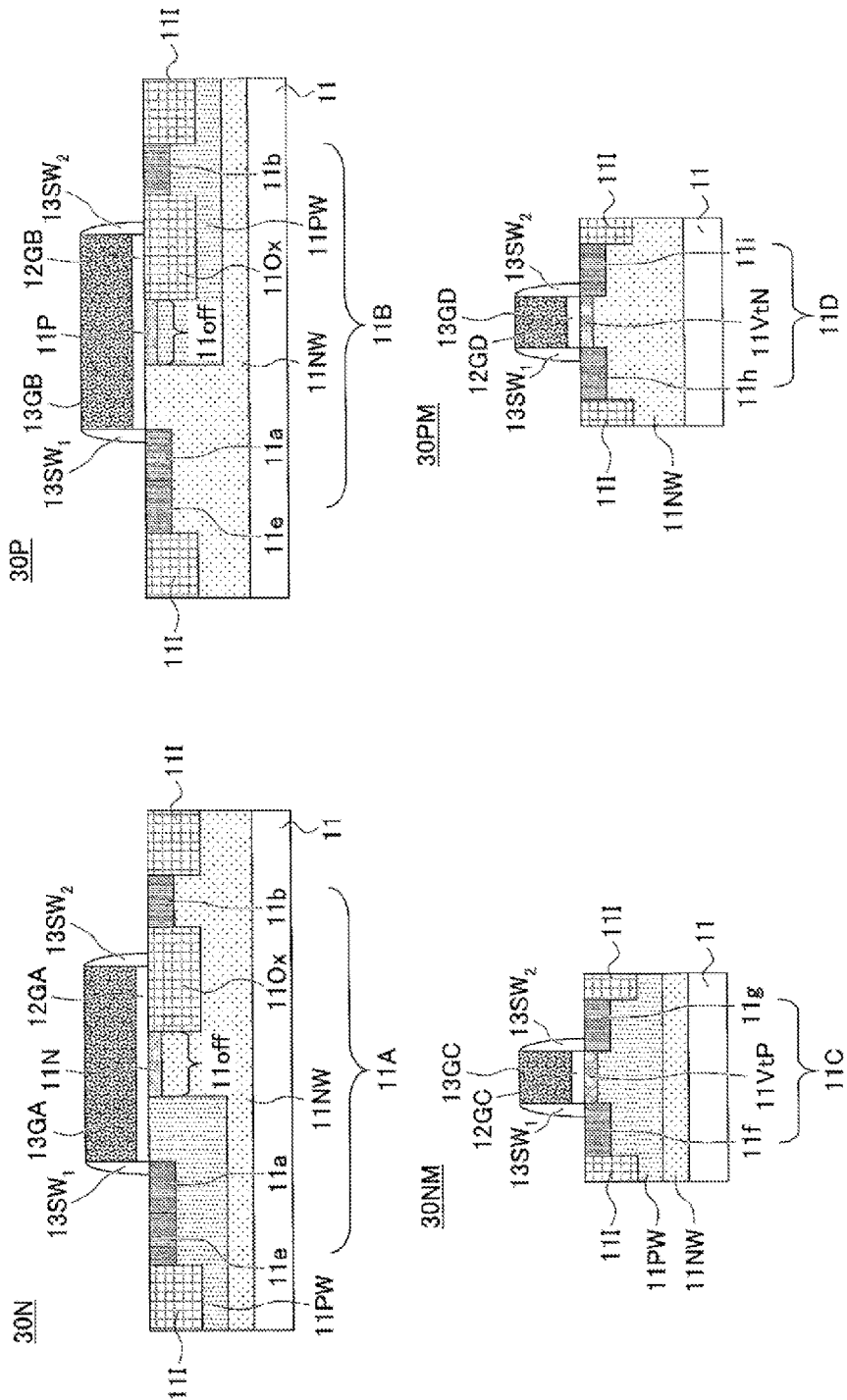

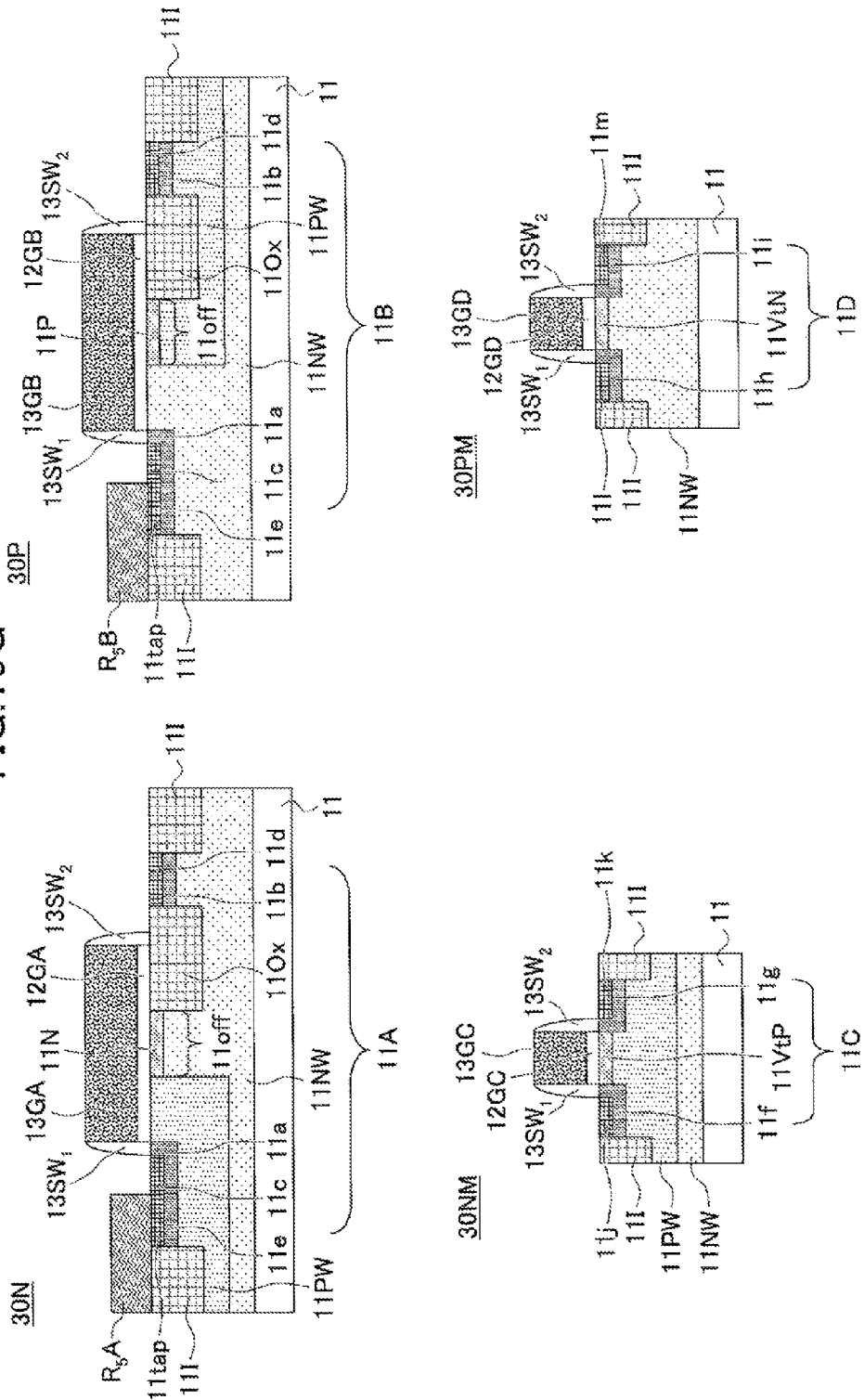

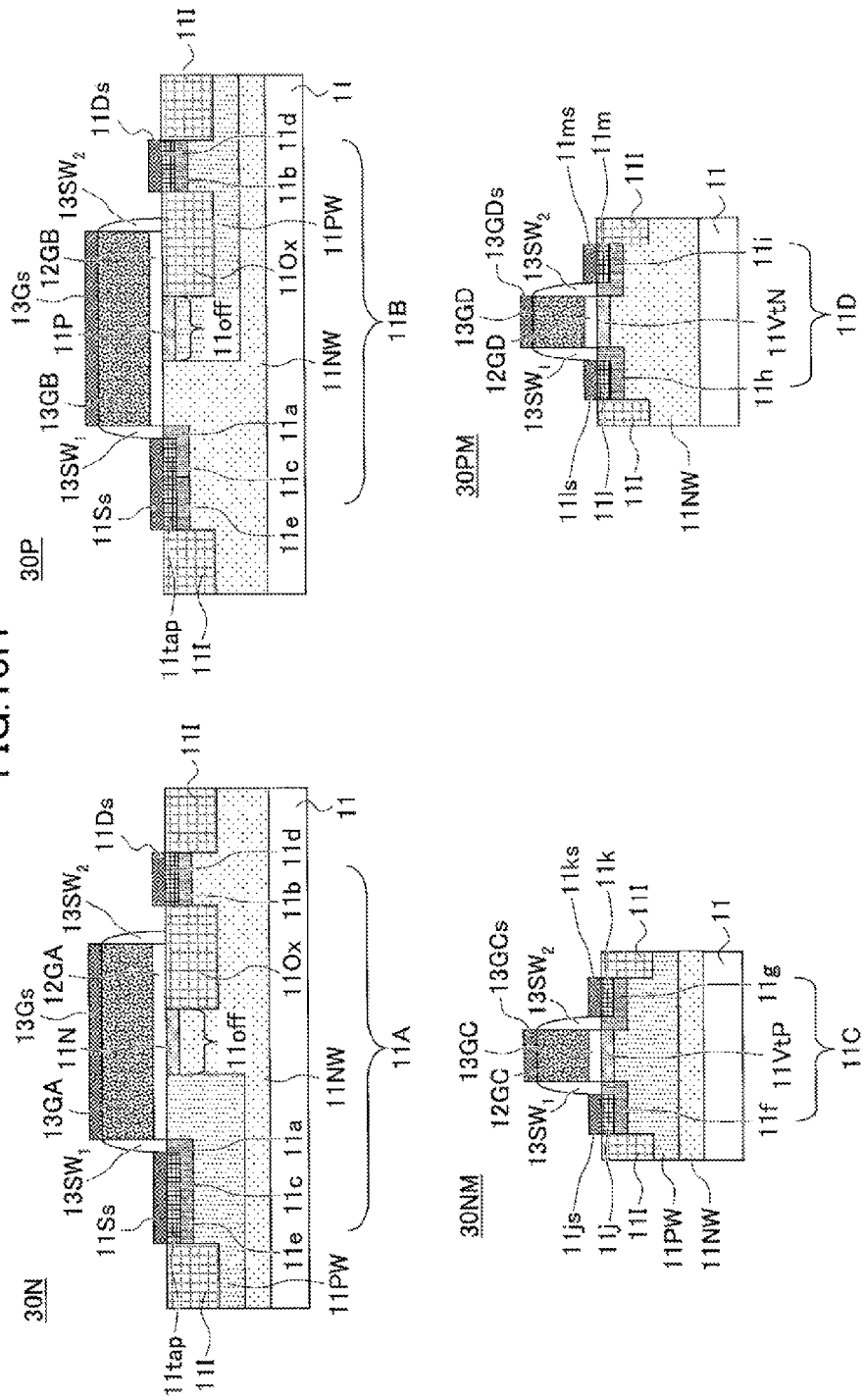

FIG.16A
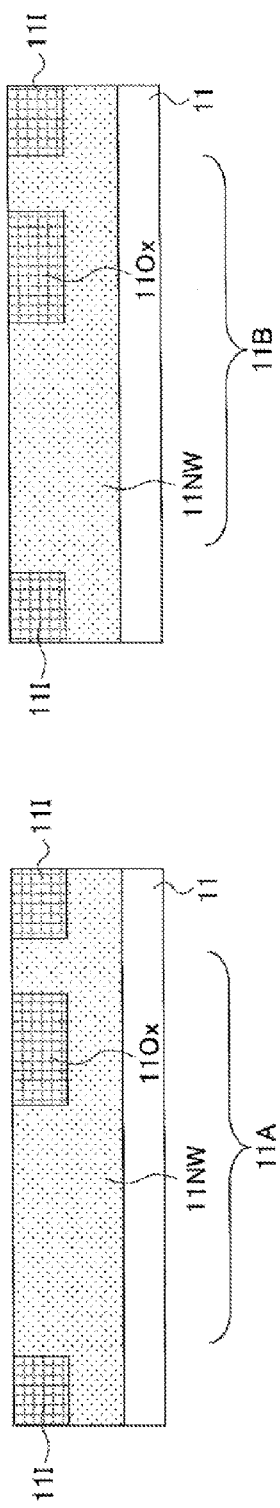
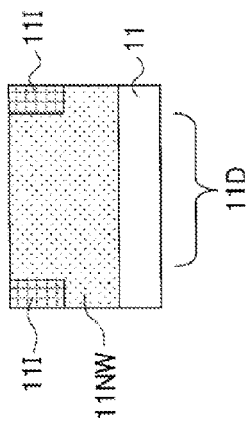
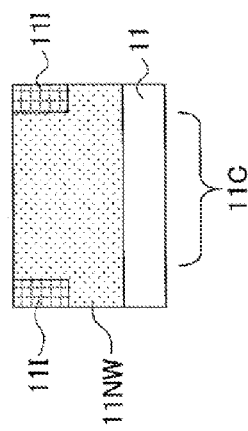

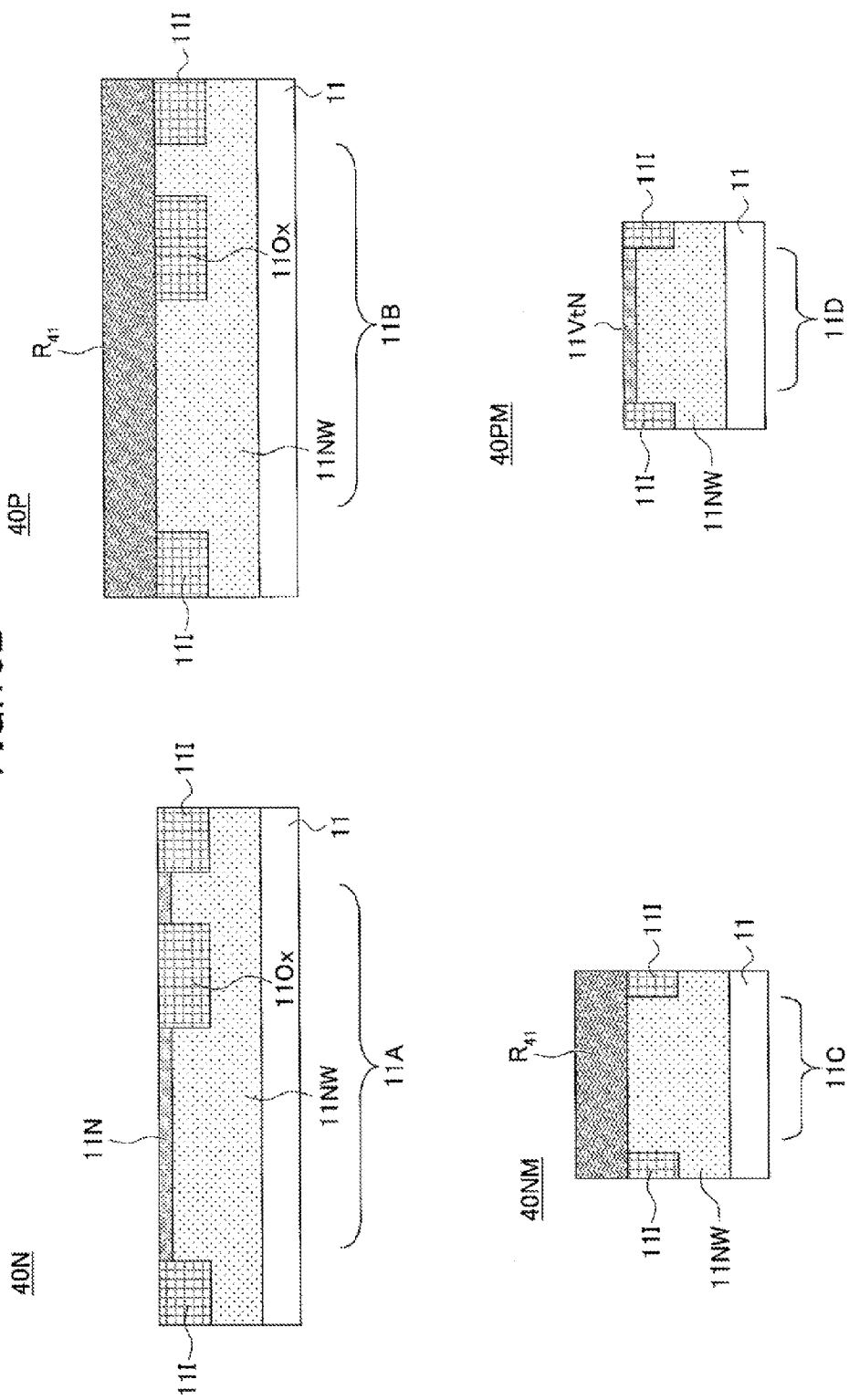

FIG.19A
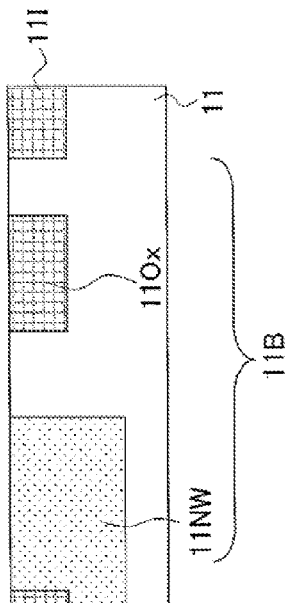
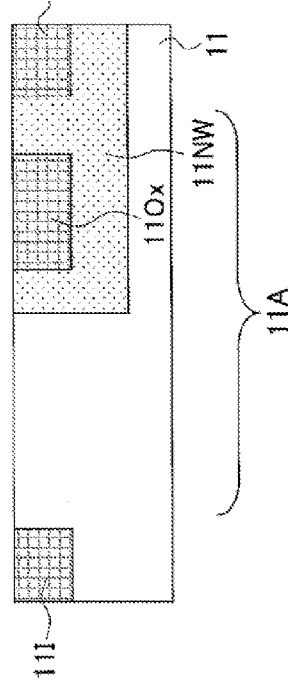
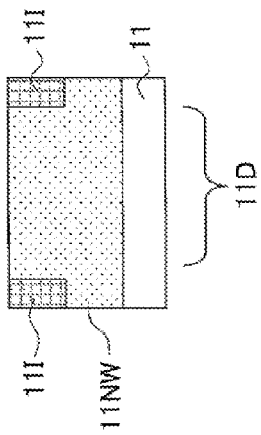
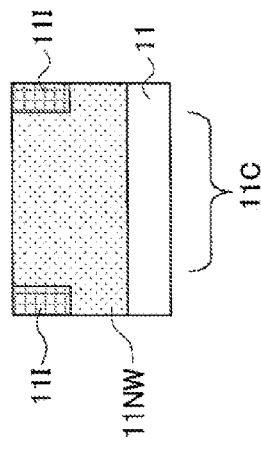

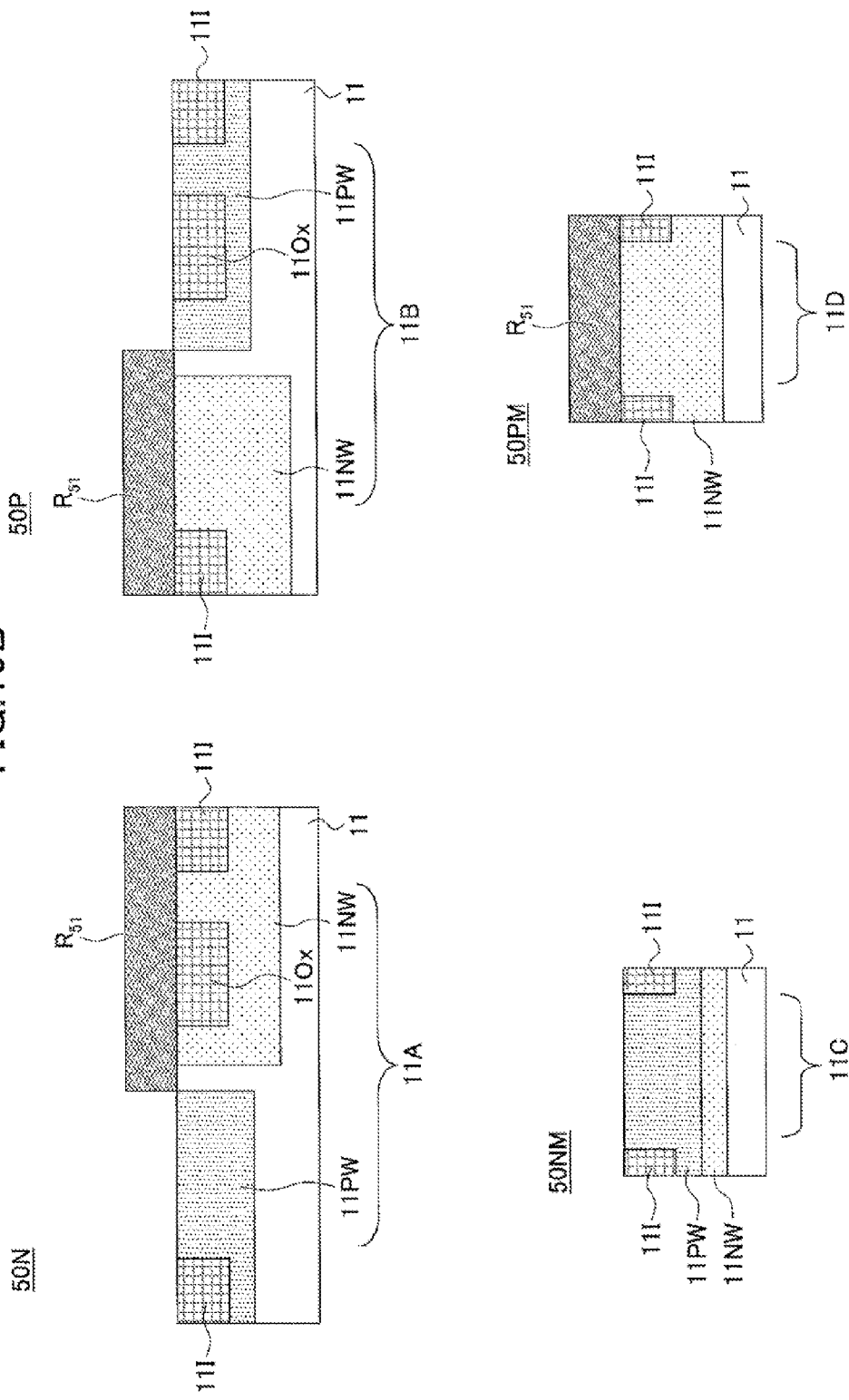

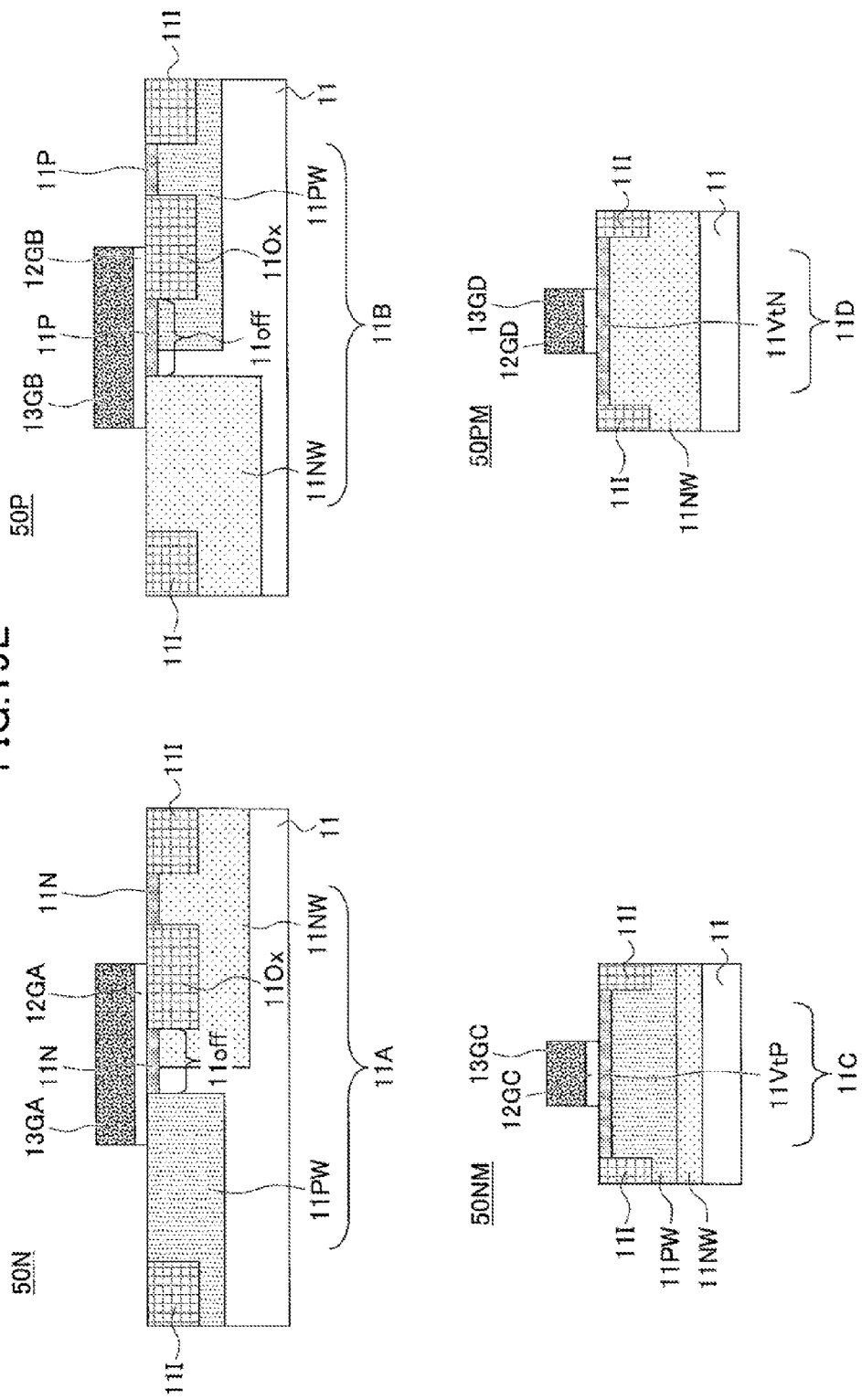

MOS TRANSISTOR AND FABRICATION METHOD OF SEMICONDUCTOR INTEGRATED CIRCUIT DEVICE

CROSS-REFERENCE TO RELATED APPLICATIONS

This application is based upon and claims the benefit of priority of the prior Japanese Patent Application 2011-015515, filed on Jan. 27, 2011, the entire contents of which are hereby incorporated herein by reference.

FIELD

In the description below, a MOS transistor and a fabrication method of a semiconductor integrated circuit will be explained with reference to embodiments.

BACKGROUND

In so-called high-voltage MOS transistors, there is a tendency that heavy concentration of electric field takes place in the vicinity of drain edge of the channel region, and thus, the breakdown voltage at the drain edge is an important issue. Such a high-voltage MOS transistor may be used in various applications such as in-vehicle applications, power applications, and the like.

It is preferable to integrate such a high-voltage MOS transistor in the form of an integrated circuit together with logic circuits, and the like. On the other hand, when such a high-voltage MOS transistor is integrated with logic circuits, the gate insulation film is formed to have a small thickness similarly to the transistors of logic circuits. Thus, in such a high-voltage MOS transistor, there is used a construction in which the drain region is formed with large separation from the gate electrode such that there is formed a drift region between the gate electrode and the drain region for improving the breakdown voltage in the vicinity of the drain edge. For example, there is a so-called LDMOS (Laterally Diffused MOS) structure. For example, reference should be made to Patent Reference 1 or 2.

PRIOR ART REFERENCES

Patent References

Patent Reference 1 Japanese Laid-Open Patent Application 9-223793
Patent Reference 2 Japanese Laid-Open Patent Application 2006-156990

Patent References 1 and 2 describe a structure in which the thickness of the gate insulation film is increased at the drain edge of the gate electrode for improving the breakdown voltage of the transistor. Particularly, Patent Reference 2 discloses a structure in which the film thickness of the gate insulation film is effectively increased by forming a buried region of an insulation film similar to that of the device isolation region of STI structure underneath the gate insulation film.

SUMMARY

In an aspect, there is provided a high-voltage semiconductor device having a semiconductor substrate formed with a first well of a first conductivity type in which a drain region and a drift region are formed and a second well of a second, opposite conductivity type in which a source region and a channel region are formed, a gate electrode extending over the substrate from the second well to the first well via a gate insulation film, wherein there is formed a buried insulation film in the drift region underneath the gate insulation film at a drain edge of the gate electrode, there being formed an offset region in the semiconductor substrate between the channel region and the buried insulation film, wherein the resistance of the offset region is reduced in a surface part thereof by being introduced with an impurity element of the first conductivity type with a concentration exceeding the first well.

Additional objects and advantages of the embodiments will be set forth in part in the description which follows, and in part will be obvious from the description, or may be learned by practice of the disclosures. The object and advantages of the disclosures will be realized and attained by means of the elements and combinations particularly pointed out in the appended claims.

It is to be understood that both the foregoing general description and the following detailed description are exemplary and explanatory only and are not restrictive of the disclosures, as claimed.

BRIEF DESCRIPTION OF DRAWINGS

FIG. 1A is a plan view diagram representing a high-voltage MOS transistor according to a first embodiment;
FIG. 3A is a diagram representing the distribution of phosphorus in the high-voltage MOS transistor of the first embodiment;
FIG. 3B is a diagram representing the distribution profile of phosphorus in FIG. 3A along a line D1;
FIG. 4A is a diagram representing the distribution of phosphorus in a high-voltage MOS transistor of a comparative example;
FIG. 6 is a graph comparing the effect attained by the embodiment in comparison with the comparative example;
FIG. 7 is another graph representing the effect attained by the embodiment in comparison with the comparative example;
FIG. 8A is a graph representing the relationship between an additional ion implantation amount and the breakdown voltage;
FIG. 9A is a first diagram explaining the fabrication process of the high-voltage MOS semiconductor according to the first embodiment in partial views;
FIG. 9B is a second diagram explaining the fabrication process of the high-voltage MOS semiconductor according to the first embodiment in partial views;
FIG. 9C is a third diagram explaining the fabrication process of the high-voltage MOS semiconductor according to the first embodiment in partial views;

FIG. 9F is a sixth diagram explaining the fabrication process of the high-voltage MOS semiconductor according to the first embodiment in partial views;

FIG. 9G is a seventh diagram explaining the fabrication process of the high-voltage MOS semiconductor according the first embodiment in partial views;

FIG. 9I is a ninth diagram explaining the fabrication process of the high-voltage MOS semiconductor according to the first embodiment in partial views;

FIG. 12 is a cross-sectional view diagram representing the high-voltage MOS transistor of the second embodiment in partial views;

FIG. 15A is a first diagram explaining the fabrication process of a semiconductor integrated circuit device according to a third embodiment in partial views;

FIG. 15C is a third diagram explaining the fabrication process of the semiconductor integrated circuit device according to the third embodiment in partial views;

FIG. 15D is a fourth diagram explaining the fabrication process of the semiconductor integrated circuit device according to the third embodiment in partial views;

FIG. 15E is a fifth diagram explaining the fabrication process of the semiconductor integrated circuit device according to the third embodiment in partial views;

FIG. 15F is a sixth diagram explaining the fabrication process of the semiconductor integrated circuit device according to the third embodiment in partial views;

FIG. 15G is a seventh diagram explaining the fabrication process of the semiconductor integrated circuit device according to the third embodiment in partial views;

FIG. 15H is an eighth diagram explaining the fabrication process of the semiconductor integrated circuit device according to the third embodiment in partial views;

FIG. 16A is a first diagram explaining the fabrication process of a semiconductor integrated circuit device according to a fourth embodiment in partial views;

FIG. 16B is a second diagram explaining the fabrication process of the semiconductor integrated circuit device according to the fourth embodiment in partial views;

FIG. 19A is a first diagram explaining the fabrication process of the semiconductor integrated circuit device according to the fifth embodiment in partial views;

FIG. 19B is a second diagram explaining the fabrication process of the semiconductor integrated circuit device according to the fifth embodiment in partial views;

FIG. 19E is a fifth diagram explaining the fabrication process of the semiconductor integrated circuit device according to the fifth embodiment in partial views.

DESCRIPTION OF EMBODIMENT

Embodiments that describe the best mode for carrying out the present disclosures are explained next with reference to the drawings.

With a high-voltage MOS transistor of the LDMOS structure, there is a demand for reducing the ON-resistance, and at the same time, it is desired to improve the breakdown voltage for operation under further higher voltage.

First Embodiment

Figure 1B:
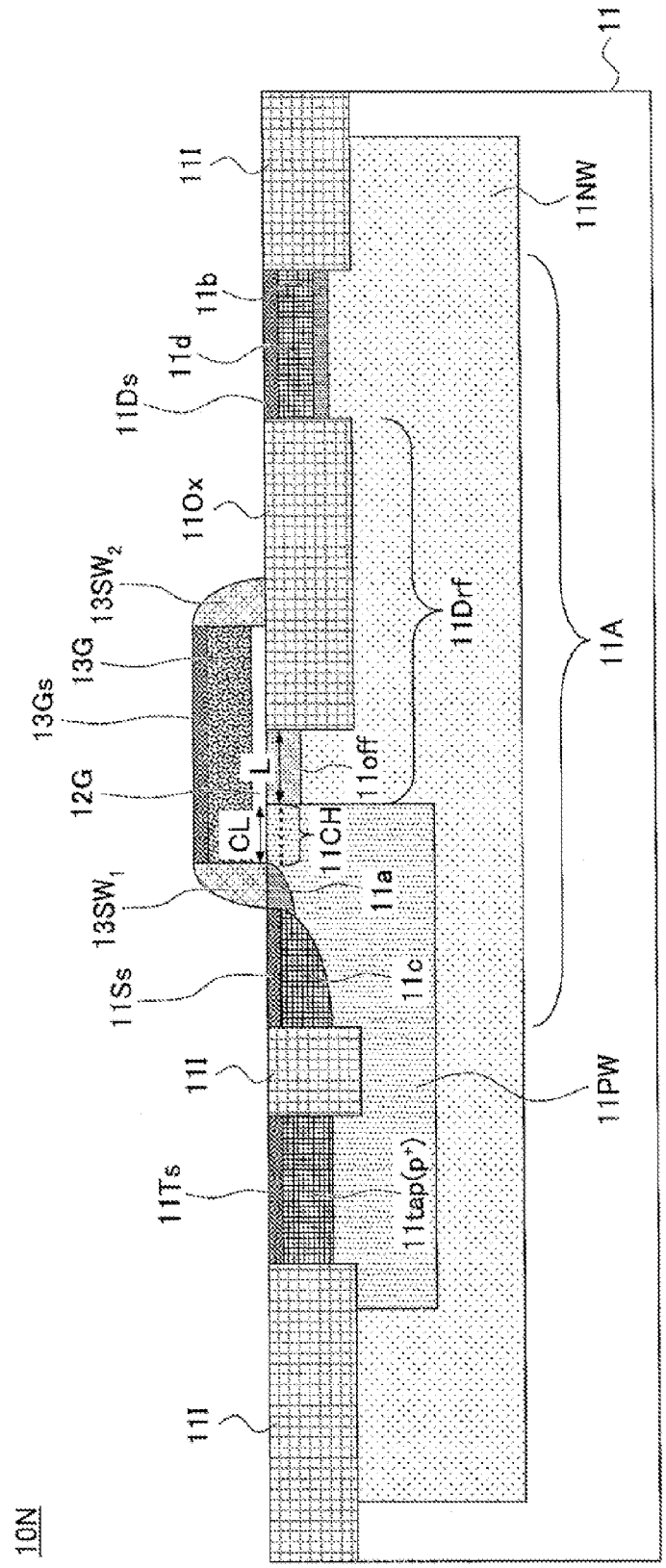
FIG. 1B is a cross-sectional diagram taken along a line A-A' of FIG. 1A.

FIG. 1A is a plan view diagram representing the construction of a high-voltage n-channel MOS transistor 10N according to a first embodiment while FIG. 1B is a cross-sectional diagram taken along a line A-A' of FIG. 1A.

Referring to FIG. 1A and FIG. 1B, there is formed a device region 11A on a silicon substrate 11 of p-type or n-type and having a flat principal surface such as a (100) surface, for example, by a device isolation region 11I of an STI structure, and there is formed a first well 11NW of n-type in the silicon substrate 11 so as to include the device region 11A with a depth deeper than a bottom edge of the device isolation region 11I.

Further, in the silicon substrate 11, there is formed a second well 11PW of p-type in the device region 11A in the manner included in the first well 11NW with a depth deeper than a bottom edge of the device isolation region 11I. As a result, in the illustrated example, the first well 11NW and the second well 11PW are formed adjacent with each other at the flat principal surface. Thus, the high-voltage n-channel MOS transistor 10N of the present embodiment has the so-called LDMOS structure.

In the second well 11PW, it can be seen that there is formed a channel region 11CH of p-type along the flat principal surface of the silicon substrate 11 adjacent to a boundary surface between the first well 11NW and the second well 11PW with a channel length CL of 0.4 μm. The channel region 11CH is subjected to channel doping and is introduced with a p-type impurity element with high concentration for threshold adjustment. The channel region 11CH extends from a first end thereof to a second end thereof with the foregoing length of 0.4 μm, wherein, in the description below, the first end of the channel region 11CH is defined as being located at a far side from the boundary surface between the first well and the second well and that the second end is defined as being located coincident with the boundary surface between the second well 11PW and the first well 11NW.

Further, in the device region 11A, there is formed a source extension region 11a of n-type adjacent to the first end of the channel region and that there is formed a buried insulation film 11Ox in the first well 11NW in the manner offset from the junction surface to the first well 11PW by an offset region 11off having an offset length L of 1.0 μm, for example. In the illustrated example, the buried insulation film 11Ox is formed with the same depth as the device isolation region 11I of the STI structure. Further, there is formed a drain extension region 11b of n-type adjacent to the buried insulation film 11Ox at the side far from the second well 11PW.

Further, over the flat principal surface of the silicon substrate 11, there is formed a gate electrode structure formed of a gate insulation film 12G and a polysilicon gate electrode 13G of n$^+$-type so as to cover the offset region 11off and a part of the buried insulation film 11Ox. Here, it should be noted that the buried insulation film 11Ox has a principal surface generally coincident to the flat principal surface of the silicon substrate 11, wherein the buried insulation film 11Ox functions under the gate insulation film 12G to increase the effective film thickness of the gate insulation film 12G.

On the other hand, the offset region 11off adjacent to the second end of the channel region 11CH constitutes, together with a part of the first well 11NW right underneath the buried insulation film 11Ox, a drift region 11drf in which the electrons passed through the channel region 11CH migrate to the drain extension region 11b by drifting.

Further, as represented in FIG. 1B, the gate electrode 13G carries a sidewall insulation film 13SW$_2$ at the side of the source extension region 11a and a sidewall insulation film 13SW$_2$ at the side of the drain extension region 11b, and there is formed a source region 11c of n$^+$-type in the second well 11PW at an outer side of the sidewall insulation film 13SW$_1$ when viewed from the polysilicon gate electrode 13G. Further, in the drain extension region 11b, there is formed a drain region 11d of n$^+$-type.

In the device isolation region 11I, there is formed an opening 11T exposing the second well 11PW at the outer side of the device region 11A, wherein the opening 11T is formed with a contact region 11tap doped to p$^+$-type for substrate biasing.

Further, there are formed silicide layers 11Ts, 11Ss, 11Ds and 11Gs respectively on the surface of the contact region 11tap, the source region 11c, the drain region 11d and further the gate electrode 13G for reducing contact resistance.

As represented in the plan view diagram of FIG. 1A, there is formed a via-plug 14T in the contact region 11tap in contact with the silicide layer 11Ts and a via-plug 14S is formed in the source region 11c in contact with the silicide layer 11Ss. Similarly, in the drain region 11d, there is formed a via-plug 14D in contact with the silicide layer 11Ds, and, while not illustrated, there is further formed a similar via-plug for the gate electrode 13G in contact with the silicide layer 13Gs.

Thereby, it should be noted that the present embodiment increases the conductivity of the offset region 11off by introducing an n-type impurity element to the surface part of the offset region 11off of FIG. 1B by conducting an additional ion implantation process to be explained later.

Next, the operation of the high-voltage MOS transistor 10N of FIGS. 1A and 1B will be explained with reference to FIG. 2.

When the source region 11c is grounded and a supply voltage of +40V or +50V, for example, is supplied to the drain region 11d in the high-voltage MOS transistor 10N and a suitable gate voltage is further applied to the gate electrode 13G in this state, the high-voltage MOS transistor undergoes conduction and electrons are emitted from the source region 11c as carriers. The carriers thus emitted are then collected at the drain region 11d after passing through the channel region 11C as represented in FIG. 2 by an arrow. There, it should be noted that the electrons thus emitted from the source region 11c and passed through the channel region 11CH have to travel through the offset region 11off and further through the drift region 11Drf of n-type over a long distance under the buried insulation film 11Ox while avoiding the buried insulation film 11Ox, until they reach the drain region 11d.

Thus, even in the case a high voltage is applied to the drain region 11d, there is caused a significant voltage drop along the flow path of the electrons, and it becomes possible to decrease the concentration of electric field at the drain edge of the channel region 11CH. Further, with the high-voltage MOS transistor of the present embodiment, it should be noted the increase of the carrier path length in correspondence to the foregoing circumventing path of the buried insulation film 11Ox is attained even when the device area, and thus, the source-drain distance, is not changed. This means also that it becomes possible to reduce the device area A of the high-voltage MOS transistor by an amount corresponding to such an increase of the carrier path length. Thus, it becomes possible to decrease the value of "Ron×A", which is a parameter used as a performance index with regard to conduction loss in high-voltage MOS transistors. Here, it should be noted that "Ron" represents the ON-resistance, while "A" represents the device area.

With the high-voltage MOS transistor 10N of the present embodiment, it should be noted that there is caused an increase in the doping concentration in the offset region 11off by an additional ion implantation of n-type impurity element. This additional ion implantation of phosphorus is an ion implantation conducted separately to the ion implantation of phosphorus for forming the n-type well 11NW and is conducted to a part of the silicon substrate 11 including the offset region 11off with a depth not reaching the bottom edge of the buried insulation film 11Ox. As a result of such an additional ion implantation, there is caused a decrease in the electric resistance of the offset region 11off, and it becomes possible to decrease the ON-resistance Ron of the transistor 10N effectively.

Figure 4B:
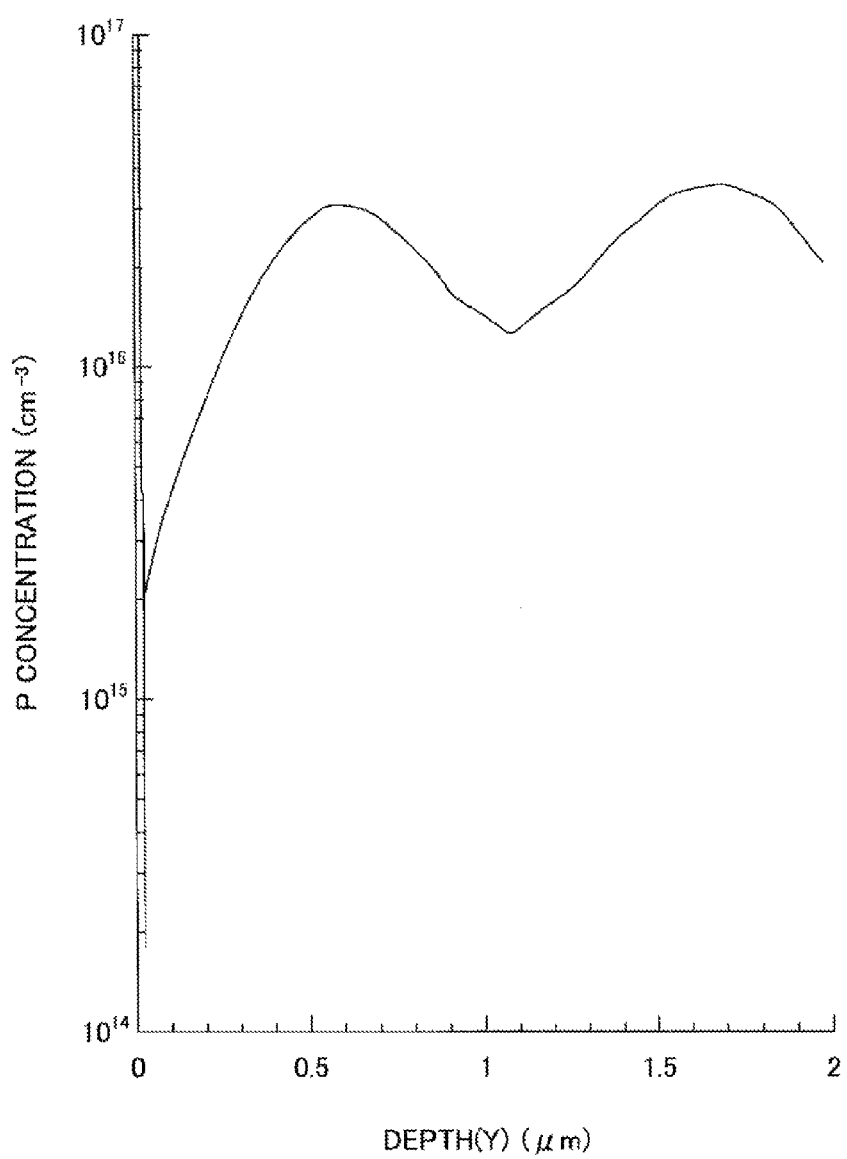
FIG. 4B is a diagram representing the distribution profile of phosphorus in FIG. 4A along a line D2.

FIG. 3A is a diagram representing a two-dimensional distribution of phosphorus in the silicon substrate 11 in the depth direction (Y direction) and horizontal direction (X direction) in the silicon substrate obtained by simulation for the case phosphorus (P) is introduced to the surface of the offset region 11off by the additional ion implantation, while FIG. 3B is a diagram representing a one-dimensional concentration profile of phosphorus in the depth direction (Y direction) of the silicon substrate 11 along a broken line D1 in FIG. 3A. Further, FIG. 4A is a diagram representing a similar two-dimensional distribution of phosphorus for the case of a comparative example of the present embodiment in which no additional ion implantation of phosphorus is made to the surface part of the offset region 11off. Further, FIG. 4B is a diagram representing the one-dimensional concentration profile of phosphorus in the silicon substrate 11 along a broken line $D_2$ represented in FIG. 4A. In FIG. 3A and FIG. 4A, it should be noted that there is indicated also a p/n junction interface which becomes the actual boundary between the second well 11PW and the first well 11NW. In FIG. 3A and FIG. 4A, the horizontal distance X represents the distance on the line connecting the source region 11c and the drain region 11d.

Figure 2:
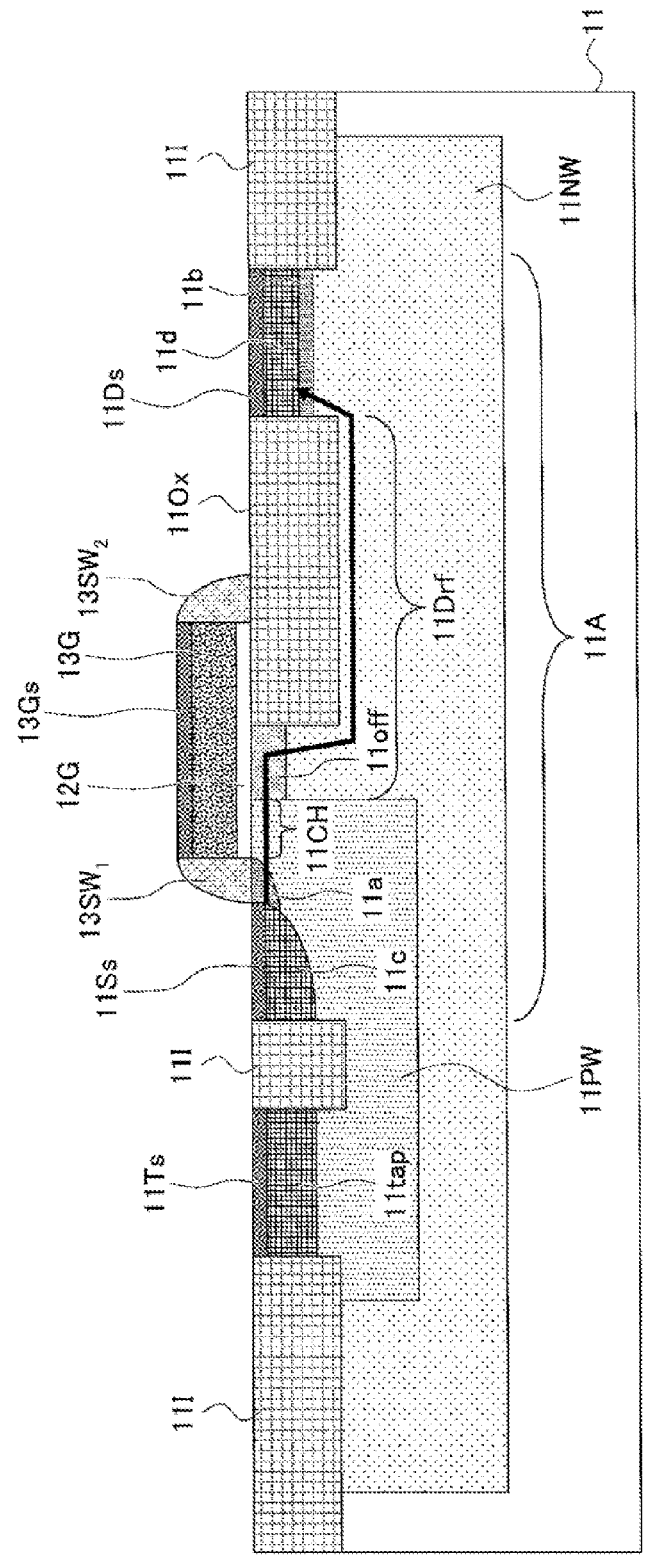
FIG. 2 is a cross-sectional view diagram explaining the operation of the high-voltage MOS transistor of the first embodiment.

Referring to FIG. 4A showing the case of the comparative example in which no additional ion implantation of phosphorus is made to the surface part of the offset region 11off, it can be seen that the p/n junction interface is formed close to the buried insulation film 11Ox and that the path of the electrons traveled through the channel region 11CH as carriers is restricted in the part where the flow of the electrons is bent downward to subduct under the buried insulation film 11Ox along the path represented in FIG. 2. Further, as can be seen from FIG. 4B, there occurs a sharp drop of phosphorus concentration at the surface part of the offset region 11off in the case no additional ion implantation of phosphorus is made to the surface part of the offset region 11off.

In contrast, with the present embodiment in which the additional ion implantation of phosphorus is conducted to the surface part of the offset region 11off as shown in FIGS. 3A and 3B in addition to the ion implantation for forming the first well 11NW, the p/n junction is formed away from the buried insulation film 11Ox, and because of this, the path of the electrons or carriers going down after passing through the channel region 11CH to subduct under the buried insulation film 11Ox along the path represented in FIG. 2 is expanded. In the example of FIGS. 3A and 3B, it can be seen that the concentration of phosphorus at the surface of the silicon substrate 11 exceeds $10^{16}$ cm$^{-3}$ in the offset region 11off as a result of the additional ion implantation process.

In the region 11off in which phosphorous is contained with the concentration exceeding the first well 11NW, the concentration of phosphorous is generally constant from the bottom edge of the buried insulation film 11OOx to a surface of the semiconductor substrate 11.

Here, it should be noted that the simulations of FIGS. 3A and 3B and FIGS. 4A and 4B were conducted under the condition that the first well 11NW is formed with a depth of about 2.5 μm by introducing phosphorus into the silicon substrate 11 of p$^-$-type, first under the acceleration voltage of 2 MeV with a dose of $3.0 \times 10^{12}$ cm$^{-2}$, then under the acceleration voltage of 500 keV and a dose of $2.0 \times 10^{12}$ cm$^{-2}$. Further, in the simulation of FIGS. 3A and 3B, the additional ion implantation of phosphorus is conducted to the surface of the silicon substrate 11 under the acceleration voltage of 15 keV with the dose of $1 \times 10^{12}$ cm$^{-2}$.

Further, the simulations of FIGS. 3A and 3B and FIGS. 4A and 4B were conducted further under the condition that the second well 11PW is formed with the depth of about 1.5 μm by introducing boron into the silicon substrate 11, first under the acceleration voltage of 400 keV and the dose of $1 \times 10^{12}$ cm$^{-2}$, then under the acceleration voltage of 150 keV and the dose of $5 \times 10^{12}$ cm$^{-2}$ and that there was further conducted the channel dope in the surface part of the second well 11PW in correspondence to the channel region 11CH by introducing boron under the acceleration voltage of 15 kev and the dose of $1 \times 10^{13}$ cm$^{-2}$. It should be noted that the distribution of boron is not represented in FIGS. 3A and 3B and FIGS. 4A and 4B.

Further, in the simulation of FIGS. 3A and 3B and FIGS. 4A and 4B, it should be noted that the source extension region 11a and the drain extension region 11b were formed by introducing phosphorus under the acceleration voltage of 30 keV and the dose of $5 \times 10^{13}$ cm$^{-2}$, while the source extension region 11a and the drain extension region 11b are formed with a depth of about 0.05 μm-0.1 μm by introducing P under the acceleration voltage of 2 keV and the dose of $2 \times 10^{15}$ cm$^{-2}$.

Further, in the simulation of FIGS. 3A and 3B and FIGS. 4A and 4B, the buried insulation film 11Ox is assumed to be formed with a depth of 400 nm and a width of about 0.7 μm in the cross-sections of FIGS. 3A and 4A. Further, it is assumed that the gate electrode 13G has a thickness of 150 nm and a width of 1.5 μm in the cross-sections of FIGS. 3A and 4A.

Figure 5A:
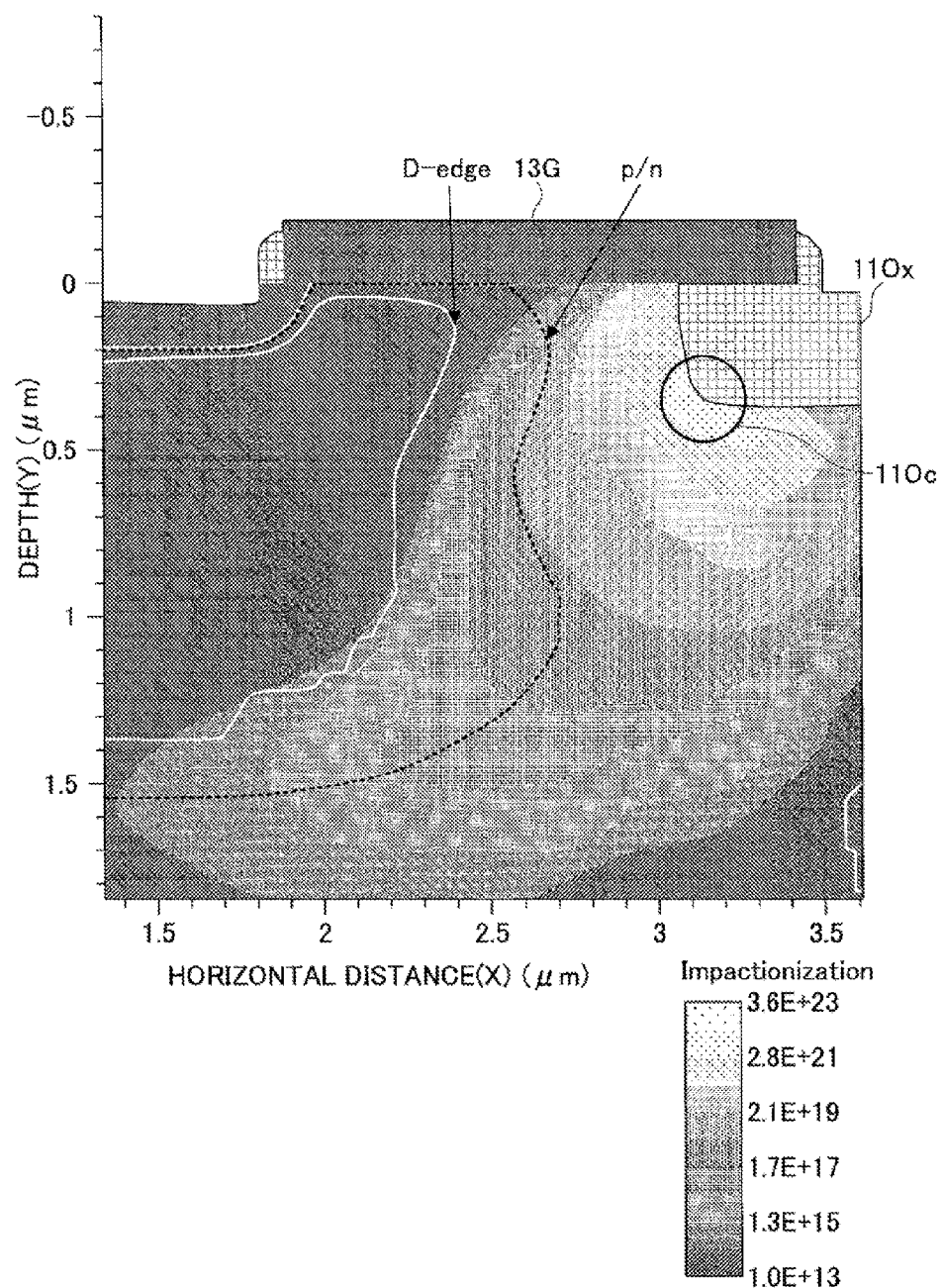
FIG. 5A is a diagram representing the distribution of depletion layer and electric field in the high-voltage MOS transistor of the first embodiment.
Figure 5B:
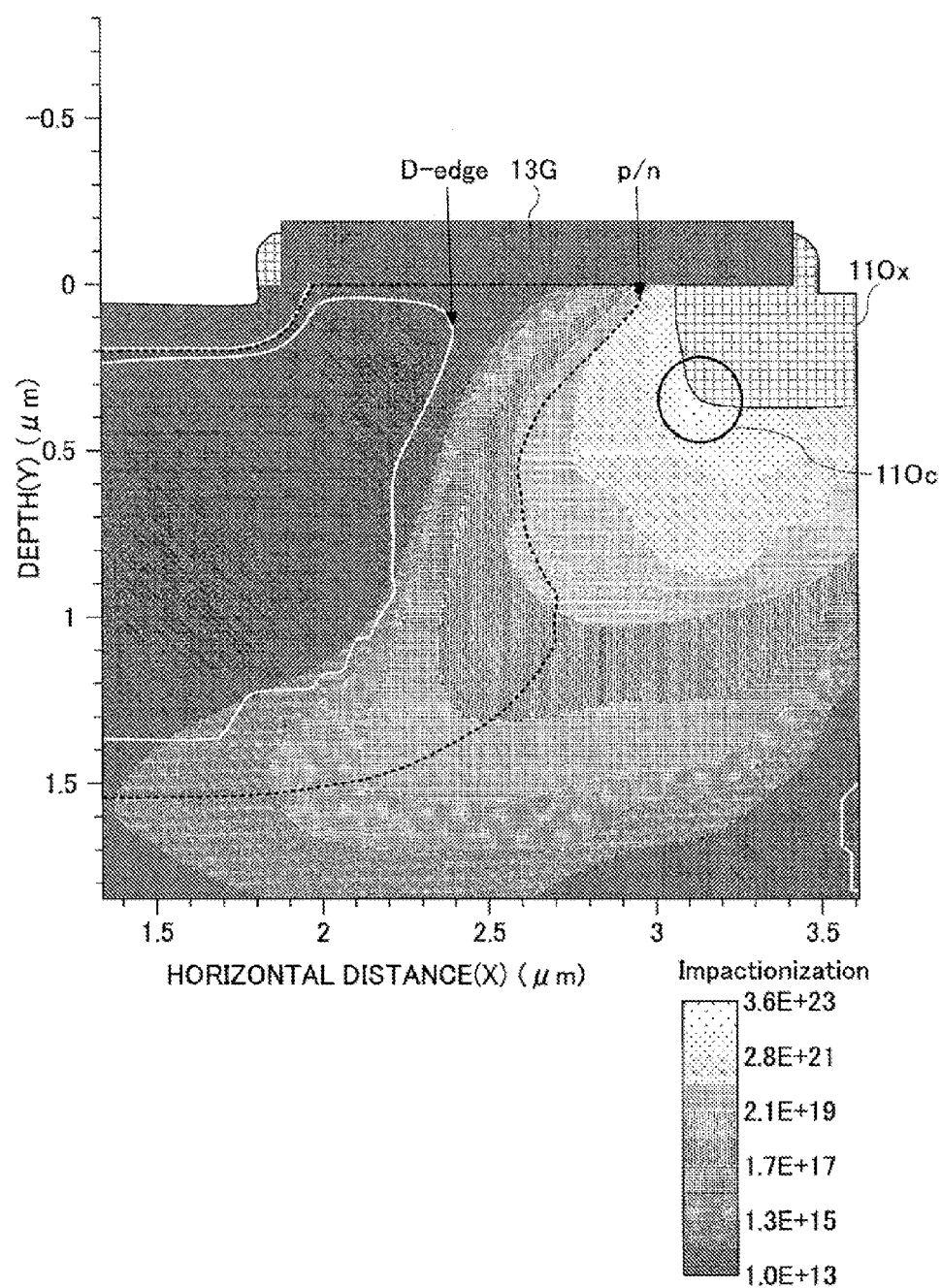
FIG. 5B is a diagram representing the distribution of depletion layer and electric field in the high-voltage MOS transistor of the comparative example.

FIGS. 5A and 5B represent the result of the simulation representing a two-dimensional distribution of the rate of impact ionization occurring in the silicon substrate of the high-voltage MOS transistor 10N for the case in which the source region 11c is grounded, the drain region is applied with a supply voltage of +35V and a gate voltage of 0V is applied to the gate electrode 13G for turning off the transistor. Therein, FIG. 5A corresponds to the simulation of FIG. 3A while FIG. 5B corresponds to the simulation of FIG. 4B.

Referring to FIGS. 5A and 5B, it can be seen that the distance to the p/n junction interface p/n from the buried insulation film 11Ox is increased significantly in the case of the present embodiment in which the additional ion implantation is conducted to the surface part of the offset region 11off as compared with the comparative example in which no such additional ion implantation of phosphorus is conducted, and that the distance to the depletion layer edge D-edge from the buried insulation film 11Ox is increased slightly with the present embodiment.

FIGS. 5A and 5B represent the impact ionization rate in the silicon substrate 11 in the form of contours. It can be seen that there is caused remarkable impact ionization in the vicinity of a corner part 11Oc of the buried insulation film 11Ox continuing from the offset region 11off in any of FIG. 5A and FIG. 5B. This indicates that electric field concentration is tending to be caused in such a part of the silicon substrate 11. On the other hand, comparing FIG. 5A with FIG. 5B, it can be seen also that the impact ionization rate is decreased in the case of FIG. 5A as compared with the case of FIG. 5B, and it is thus understood that it is possible to decrease the concentration of electric field in the corner part 11Oc by conducting the additional ion implantation only to the surface part of the offset region 11off. It is believed that this is caused as a result of slight shift of the depletion layer edge D-edge toward the source region side, which in turn is caused by the additional ion implantation conducted to the surface part of the offset region 11off.

Thus, with the high-voltage MOS transistor of the present embodiment, there is attained a decrease in the ON-resistance Ron as a result of the decrease of the electric resistance in the offset region 11off and there is also attained an improvement of the breakdown characteristic as a result of relaxing of the electric field concentration in the corner part 11Oc of the buried insulation film 11Ox. At least, the deterioration of the breakdown characteristics is avoided.

FIG. 6 compares the ON-resistance Ron and OFF-state breakdown voltage BVds for the high-voltage MOS transistor of FIGS. 3A and 3B and the high-voltage MOS transistor of FIGS. 4A and 4B. Here, the specimen "A" represents the case in which the additional ion implantation is conducted by introducing phosphorus under the acceleration voltage of 15 keV with the dose of $1 \times 10^{12}$ cm$^{-2}$ as noted before, while "B" represents the case in which arsenic (As) is introduced under the acceleration voltage of 26 keV with the dose of $1 \times 10^{12}$ cm$^{-2}$ in the foregoing additional ion implantation.

Referring to FIG. 6, it can be seen that there is observed a decrease in the ON-resistance Ron in any of the specimen "A"

and specimen "B" as compared with the "comparative example" in which no such additional ion implantation is made into the surface part of the offset region 11off. Further, it can be seen that the degree of the decrease is larger in the specimen "A" in which phosphorus is introduced in the additional ion implantation conducted under the foregoing condition as compared with the specimen "B" in which arsenic is introduced in the additional ion implantation. With regard to the OFF-state breakdown voltage BVds, too, it can be seen that the specimen "A" and the specimen "B" are improved as compared with the comparative example, wherein the degree of improvement is larger in the specimen "B" as compared with the specimen "A".

FIG. 7 represents the relationship between the performance index "Ron×A" of a transistor for the conduction loss explained before and the OFF-state break down voltage BVds.

Referring to FIG. 7, there is a trend that the performance index "Ron×A" increases with the value of the OFF-state breakdown voltage BVds in the comparative example explained before, while in the case of the semiconductor device of the specimen A and the specimen B of the present embodiment, it can be seen that a smaller performance index "Ron×A" is attained when compared with the same OFF-state breakdown voltage BVds.

Thus, with the present embodiment, it becomes possible to decrease the ON-resistance Ron in the high-voltage MOS transistor of the LDMOS structure while maintaining or improving the OFF-state breakdown voltage BVds, by conducting the additional ion implantation to the surface part of the offset region 11off with the conductivity type identical with that of the first well.

Meanwhile, in the present embodiment, it should be noted that the additional ion implantation to the surface part of the offset region 11off should not be limited to the ion implantation of phosphorus under the specific acceleration voltage of 15 keV and the dose of $1\times10^{12}$ cm$^{-2}$ or the ion implantation of arsenic under the specific acceleration voltage of 26 keV with the dose of $1\times10^{12}$ cm$^{-2}$.

Hereinafter, preferable range of the additional ion implantation to the surface part of the offset region 11off will be examined.

Referring to FIG. 3B again, it can be seen that the concentration of phosphorus in the surface part takes the value of about $10^{16}$ cm$^{-3}$ when the depth is 400 nm or less. This means that the present embodiment compensates for the decrease of the phosphorus concentration, which would be caused in the surface part of the depth of 400 nm or less of the offset region 11off when no additional ion implantation is conducted as represented in FIG. 4B, by conducting the foregoing additional ion implantation. Thereby, it should be noted that, by limiting the depth of the additional ion implantation to only the surface part of the depth of 400 nm or less, excessive decrease of the electric resistance, which would take place right underneath the corner part 11Oc of the buried insulation film 11Ox where the impact ionization is tend to be caused as represented by the simulation result of FIGS. 5A and 5B, is successfully avoided.

Figure 8B:
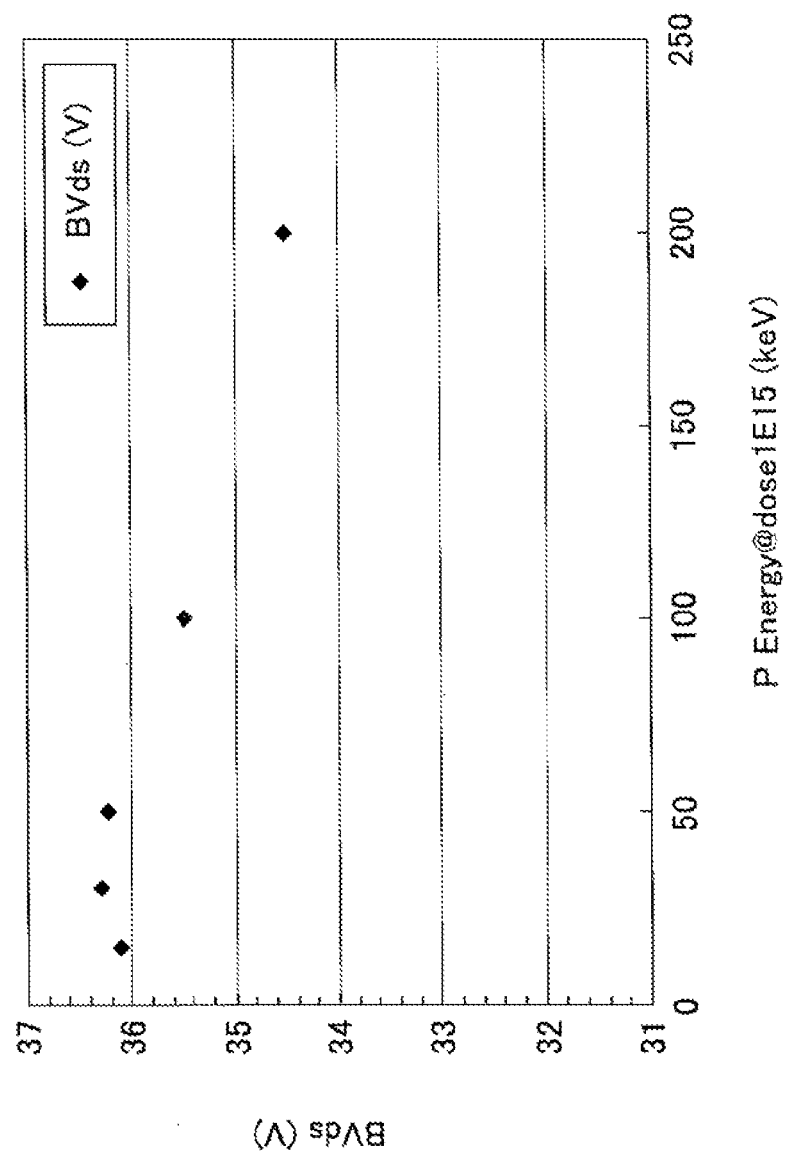
FIG. 8B is a graph representing the relationship between the acceleration voltage at the time of the additional ion implantation and the breakdown voltage.

FIGS. 8A and 8B are diagrams representing the relationship between the additional ion implantation condition to the offset region 11off and the OFF-state breakdown voltage BVds.

Referring to FIG. 8A, the vertical axis represents the OFF-state breakdown voltage BVds while the horizontal axis represents the dose at the time of the additional ion implantation. In FIG. 8A, the acceleration voltage is set to 15 keV.

Referring to FIG. 8A, the OFF-state breakdown voltage BVds takes the maximum value of 36.1V when the dose of phosphorus at the time of the additional ion implantation is set to about $1.0\times10^{12}$ cm$^{-2}$ and that the OFF-state breakdown voltage BVds decreases gradually when the dose is increased further. On the other hand, when the dose is increased beyond the value of $3.0\times10^{12}$ cm$^{-2}$ to about $5.0\times10^{12}$ cm$^{-2}$, the value of the OFF-state breakdown voltage BVds decreases sharply to about 32V. From this, it is held that the upper limit value of the additional ion implantation should be about $3.0\times10^{12}$ cm$^{-2}$. Further, in this case, the concentration of phosphorus becomes about $2.5\times10^{16}$ cm$^{-3}$ at the depth of 400 nm. Referring to FIGS. 3B and 4B, this concentration of phosphorus is generally the same as the concentration of phosphorus at the depth of 400 nm when no additional ion implantation is made. In other words, there is caused no substantial increase of the phosphorus concentration by the additional ion implantation at the depth of 400 nm, and hence at the bottom edge of the buried insulation film 11Ox.

On the other hand, in the case the dose is set to $5.0\times10^{12}$ cm$^{-2}$, the phosphorus concentration at the depth of 400 nm reaches $2.75\times10^{16}$ cm$^{-3}$.

Next, reference should be made to FIG. 8B. In FIG. 8B, the vertical axis represents the OFF-state breakdown voltage BVds while the horizontal axis represents the acceleration voltage at the time of the additional ion implantation. In FIG. 8B, the dose is set to $1\times10^{15}$ cm$^{-2}$.

As can be seen from FIG. 8B, it is possible to attain the OFF-state voltage of 35V or more in the case of the ion implantation of phosphorus as long as the acceleration voltage does not exceed 100 keV, while when the acceleration voltage has exceeded 100 keV and reached 200 keV, the OFF-stage breakdown voltage decreases below 35V. From this, it is held that the acceleration voltage for the additional ion implantation should be set preferably to be less than 100 keV as long as phosphorus is used.

While the foregoing explanation has been made for the case of using phosphorus for the additional ion implantation, a similar constraint holds also with regard to the dose and concentration in the case arsenic is used for the additional ion implantation.

Further, while the foregoing explanation has been made for the case of the n-channel high-voltage MOS transistor 10N having the channel length CL of 0.4 μm and the offset length L of 1.0 μm, the present embodiment should never be limited to the foregoing specific size, and thus, the present embodiment is applicable also to the case in which the channel length CL is set to the range of 0.4 μm-0.8 μm and the offset length L is set to the rage of 0.6 μm-1.4 μm. On the other hand, when the offset length L has become smaller than 0.6 μm, it is no longer possible to secure sufficient width for the current passed through the channel region 11CH and increase of ON-resistance Ron would be invited. Further, when the offset length L exceeds 1.4 μm, there would again be caused an increase of ON-resistance Ron. Thus, it is preferable to set the offset length L to the range of 0.6 μm-1.4 μm as noted above. Further, when the channel length CL is decreased to be smaller than 0.4 μm, there appears conspicuous short channel effect, while when the channel length CL is increased beyond 0.8 μm, there is caused an increase of the ON-resistance Ron. Thus, it is preferable to set the channel length CL to the range of 0.4 μm-0.8 μm as noted before.

Further, it is preferable that the buried insulation film 11Ox is formed simultaneously to the device isolation region 11I to have the same depth.

Similarly, it is possible to form a high-voltage p-channel MOS transistor 10P.

Hereinafter, the fabrication process of the high-voltage n-channel MOS transistor 10N and the high-voltage p-channel MOS transistor 10P will be explained with reference to the process flow diagrams of FIGS. 9A-9I. In the description below, it should be noted that the n-channel high-voltage MOS transistor 10N and the p-channel high-voltage MOS transistor 10P are formed respectively on the device regions 11A and 11B of the same silicon substrate 11.

Referring to FIG. 9A, the device region 11A is defined on the silicon substrate 11 by the device isolation region 11I of the STI structure in correspondence to the high-voltage n-channel MOS transistor 10N. Likewise, there is defined a device region 11B on the silicon substrate 11 by the device isolation region 11I in correspondence to the p-channel high-voltage MOS transistor 10P.

It should be noted that the device isolation region 11I includes, in each of the device regions 11A and 11B, the buried insulation film 11Ox as a part thereof, wherein the buried insulation film 11Ox is formed to have a bottom edge at the depth of 400 nm as measured from the surface of the silicon substrate 11 similarly to the device isolation film constituting the device isolation region 11I of the STI structure.

Further, in the step of FIG. 9A, there is formed an n-type well 11NW in each of the device regions 11A and 11B by introducing phosphorus into the entire surface of the silicon substrate 11 including the device regions 11A and 11B, wherein the ion implantation is conducted first under the acceleration voltage of 2 MeV and the dose of $2 \times 10^{12}$ cm$^{-2}$ and then under the acceleration voltage of 500 keV and the dose of $2 \times 10^{-2}$ cm$^{-2}$, such that the n-type well 11NW reaches a depth deeper than the bottom edge of the buried insulation film 11Ox as measured from the surface of the silicon substrate 11. In other words, the bottom edge of the n-type well 11NW is formed at a location deeper than the bottom edge of the buried insulation film 11Ox.

Further, in the step of FIG. 9B, there is formed a resist pattern $R_1$ on the silicon substrate 11 of the state of FIG. 9A so as to cover the entire device region 11B, wherein the resist pattern $R_1$ is formed to expose a part of the device region 11A in which the offset region 11*off* of the n-channel high-voltage MOS transistor 10N is to be formed in addition to the buried insulation film 11Ox and the part of the device region 11A in which the drain region 11*d* of the n-channel high-voltage MOS transistor 10N is to be formed. Further, the surface part of the offset region 11*off* and the region where the drain region 11*d* is to be formed are doped to n-type by conducting the additional ion implantation of phosphorus under the acceleration voltage of less than 100 keV and a dose of less than $3 \times 10^{12}$ cm$^{-2}$, such as the acceleration voltage of 15 keV and the dose of $2 \times 10^{12}$ cm$^{-2}$, while using the resist pattern $R_1$ as a mask. With this, there is formed an additional ion implantation region 11N of n-type. As will be explained later, the additional ion implantation region 11N of n-type is formed such that the bottom edge thereof is located at a depth shallower than the bottom edge of the buried insulation film 11Ox.

Next, in the step of FIG. 9C, there is formed a resist pattern $R_2$ on the silicon substrate 11 so as to expose a part of the device region 11A where the p-type well 11PW of the high-voltage n-channel MOS transistor 10N is to be formed and further to expose a part of the device region 11B where a similar p-type well 11PW of the high-voltage p-channel MOS transistor 10P is to be formed. Further, while using the resist pattern $R_2$ as a mask, the ion implantation of boron is conducted into the silicon substrate 11 for example under the acceleration voltage of 400 keV and the dose of $1 \times 10^{13}$ cm$^{-2}$, and then under the acceleration voltage of 150 keV and the dose of $5 \times 10^{12}$ cm$^{-2}$, and further under the acceleration voltage of 15 keV and the dose of $1 \times 10^{13}$ cm$^{-2}$. With this, the p-type well 11PW is formed in the silicon substrate 11 in each of the device regions 11A and 11B with a depth deeper than the buried insulation film 11Ox but still included in the n-type well 11NW. In other words, the p-type well 11PW has the bottom edge at a depth deeper than the bottom edge of the buried insulation film 11Ox but not exceeding the bottom edge of the n-type well 11NW.

Figure 9D:
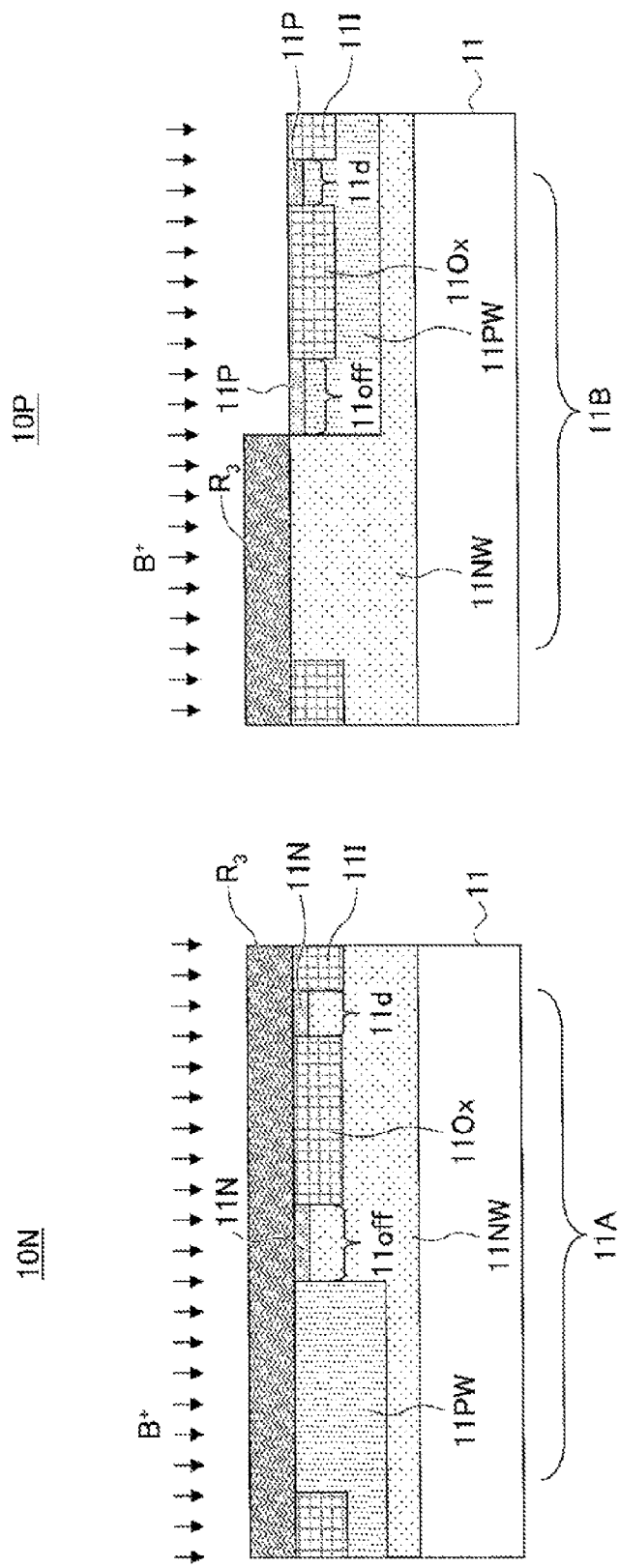
FIG. 9D is a fourth diagram explaining the fabrication process of the high-voltage MOS semiconductor according to the first embodiment in partial views.

Further, in the step of FIG. 9D, there is formed a resist pattern $R_3$ on the silicon substrate 11A so as to cover the device region 11A and so as to expose the part of the device region 11B where an offset region 11*off* of the p-channel MOS transistor 10P is to be formed, in addition to the buried insulation film 11Ox and further the part of the device region 11B where a drain region 11*d* of the p-channel MOS transistor 10P is to be formed. Further, an additional ion implantation of boron is conducted under the acceleration voltage of 2 keV and the dose of $1 \times 10^{13}$ cm$^{-2}$ while using the resist pattern $R_3$ as a mask. With this, there is formed an additional ion implantation region 11P of p-type in correspondence to the surface part of the offset region 11*off* and in correspondence the drain region of the p-channel MOS transistor 10P.

Figure 9E:
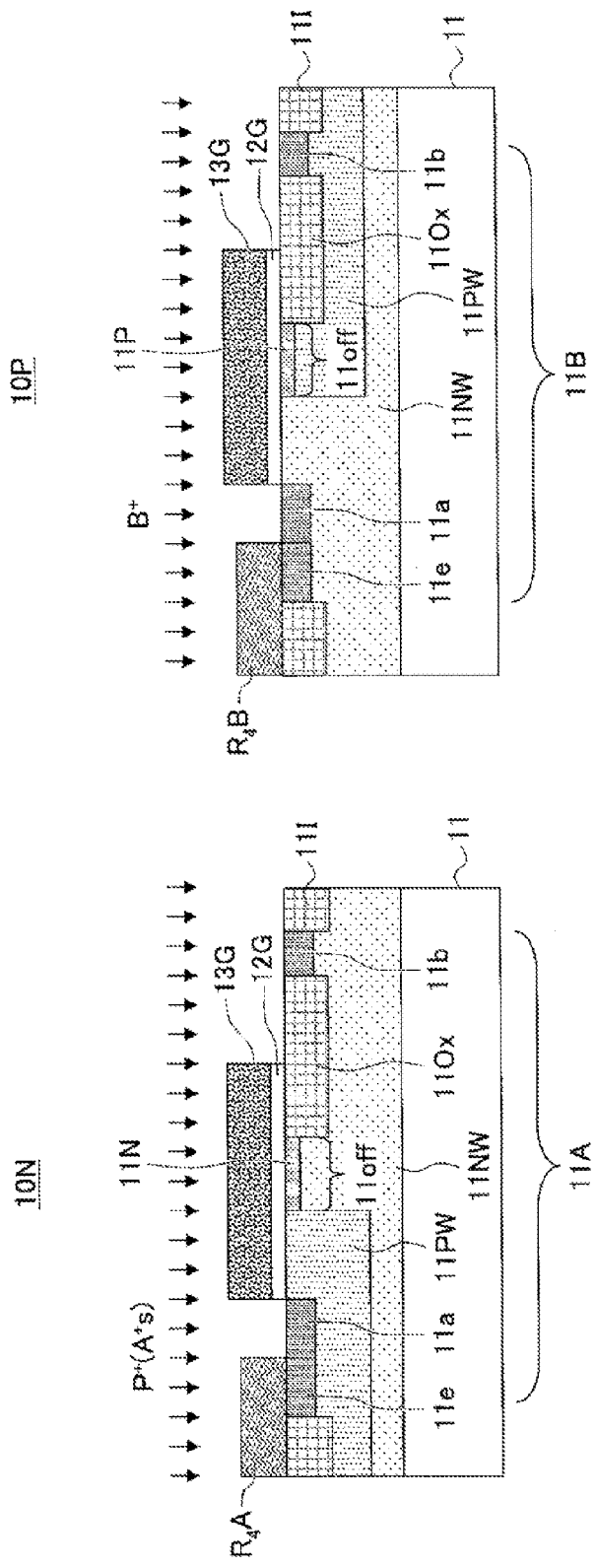
FIG. 9E is a fifth diagram explaining the fabrication process of the high-voltage MOS semiconductor according to the first embodiment in partial views.

Next, in the step of FIG. 9E, there are formed a thermal oxide film of a film thickness of 15 nm and a polysilicon film of a film thickness of 150 nm consecutively on the structure of FIG. 9D. Further, by patterning the polysilicon film and the thermal oxide film subsequently, there are formed a gate insulation film pattern 12G and a polysilicon gate electrode pattern 13G such that, in the device region 11A, the gate insulation film pattern 12G and the polysilicon gate electrode pattern 13G cover a part of the p-type well 11PW and extend further to a part of the buried insulation film 11Ox continuously beyond the offset region 11*off*, and such that, in the device region 11B, the gate insulation film 12G and a polysilicon gate electrode pattern 13G cover a part of the n-type well 11NW and extend further to a part of the buried insulation film 11Ox continuously beyond the offset region 11*off*.

Further, in the step of FIG. 9E, ion implantation of phosphorus (P+) or arsenic (As+) is conducted into the device region 11A while using the polysilicon gate electrode pattern 13G as a mask, and separately therefrom, an ion implantation of boron (B+) is conducted into the device region 11B. Therein, resist patterns $R_4A$ and $R_4B$ are used respectively as a mask. With this, the source extension region 11*a* is formed in the device region 11A adjacent to the polysilicon gate electrode pattern 13G. Further, the drain extension region 11*b* is formed in the device region 11A at an opposite side of the polysilicon gate electrode pattern 13G to the source extension region 11*a*.

In the step of FIG. 9E, it should be noted that the entire surface of the device region 11B except for the part where a contact region 11*tap* is to be formed, and a part of the device region 11A where the contact region 11*tap* is to be formed, are protected by the resist pattern $R_4A$ at the time when the ion implantation is conducted into the device region 11A. Further, in the step of FIG. 9E, it should be noted that the entire surface of the device region 11A except for the part where the contact region 11*tap* is to be formed, and a part of the device region 11B where the contact region 11*tap* is to be formed are protected by the resist pattern $R_4B$ at the time when the ion implantation is conducted into the device region 11B. As a result, there is formed a contact region 11*e* of p-type in the device region 11A adjacent to the source extension region 11*a* of n-type for the contact region 11*tap*, and in the device region 11B, a contact region 11e of n-type is formed adjacent to the source extension region 11a of p-type for the contact region 11tap.

Next, in the step of FIG. 9F, the sidewall insulation films 13SW$_1$ and 13SW$_2$ are formed respectively on the sidewall surfaces of the polysilicon gate electrode pattern 13G at the source side and the drain side in each of the device regions 11A and 11B, and ion implantation of phosphorus ions (P+) or arsenic ions (As+) is conducted into the device region 11A in the step of FIG. 9G while using the polysilicon gate electrode pattern 13G as a mask and further using a resist pattern R$_5$A, as a mask. Further, separately therefrom, an ion implantation of boron ions (B+) is conducted into the device region 11B while using the polysilicon gate electrode pattern 13G as a mask and further using a resist pattern R$_5$B as a mask. As a result, there is formed a source region 11c of n$^+$-type in the device region 11A in overlapping with the source extension region 11a of n-type and there is further formed a drain region 11d of n$^+$-type in overlapping with the drain extension region 11b of n-type at the respective outer sides of the sidewall insulation films 13SW$_1$ when viewed from the polysilicon pattern 13G. Similarly, in the device region 11B, there is formed a source region 11c of p$^+$-type in the device region 11B in overlapping with the source extension region 11a of p-type and there is further formed a drain region 11d of p$^+$-type in overlapping with the drain extension region 11b of p-type at the respective outer sides of the sidewall insulation films 13SW$_2$ when viewed from the polysilicon pattern 13G.

Further, with the step of FIG. 9G, it should be noted that the polysilicon gate electrode pattern 13G is also doped to n$^+$-type in the device region 11A at the time of formation of the source region 11c of n$^+$-type and the drain region 11d of n$^+$-type in the device region 11A. Similarly, the polysilicon gate electrode pattern 13G is doped to p$^+$-type in the device region 11B at the time of formation of the source region 11c of p$^+$-type and the drain region 11d of p$^+$-type.

In the step of FIG. 9G, it should be noted further that the entire surface of the device region 11B except for the part where the contact region 11tap is to be formed and further a part of the device region 11A where the contact region 11tap is to be formed, are protected by the resist pattern R$_5$A at the time when the ion implantation is conducted into the device region 11A. Further, in the step of FIG. 9G, it should be noted that the entire surface of the device region 11A except for the part where the contact region 11tap is to be formed, and the part of the device region 11B where the contact region 11tap is to be formed, are protected by the resist pattern R$_4$B at the time when the ion implantation is conducted into the device region 11B. As a result, the contact region 11tap of p$^+$-type is formed in the device region 11A adjacent to the source extension region 11a of n-type for substrate biasing, and in the device region 11B, the contact region 11tap of n$^+$-type is formed adjacent to the source extension region 11a of p-type for substrate biasing.

Figure 9H:
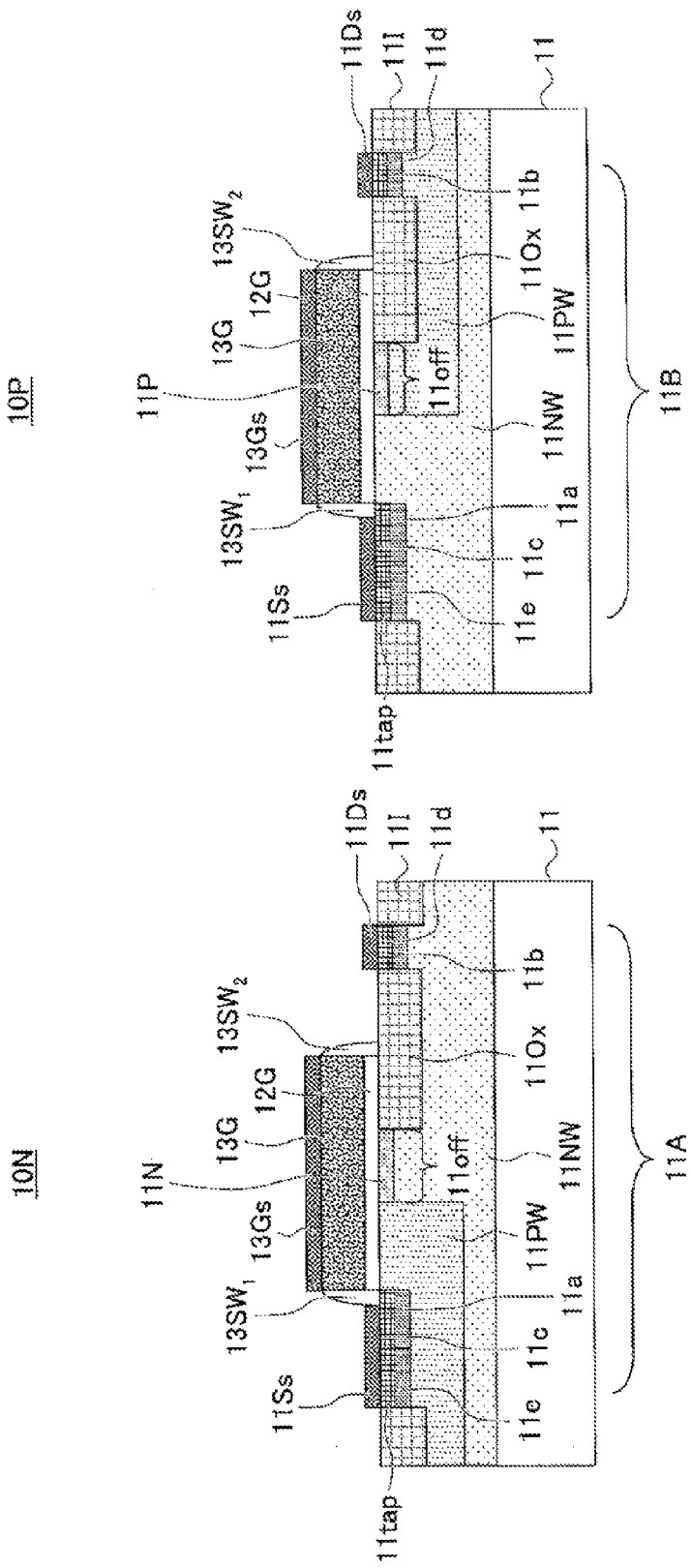
FIG. 9H is an eighth diagram explaining the fabrication process of the high-voltage MOS semiconductor according to the first embodiment in partial views.

Further, in the step of FIG. 9H, there is conducted silicide formation on the structure of FIG. 9G by a salicide process, and as a result, the source silicide layer 11Ss and the drain silicide layer 11Ds are formed respectively on the source region 11c of n$^+$-type and the drain region 11d of n$^+$-type in the device region 11A. Further, the silicide layer 13Gs is formed on the polysilicon gate electrode pattern 13G of n$^+$-type. At the same time, in the device region 11B, the source silicide layer 11Ss and the drain silicide layer 11Ds are formed respectively on the source region 11c of p$^+$-type and the drain region 11d of p$^+$-type. Further, the silicide layer 13Gs is formed on the polysilicon electrode pattern 13G of p$^+$-type. In the example of FIG. 9H, it should be noted that the source silicide layer 11Ss functions also as the silicide layer of the contact region 11tap in both of the device regions 11A and 11B.

Further, in the step of FIG. 9I, there is formed an interlayer insulation film 14 over the structure of FIG. 9H to cover the device regions 11A and 11B, and there is further formed a via-plug 14A in the interlayer insulation film 14 in electric contact with the n$^+$-type source region 11c and further with the p$^+$-type contact region 11tap of the device region 11A via the source silicide layer 11Ss. Further, there is formed a via-plug 14B in the interlayer insulation film 14 in electric contact with the n$^+$-type drain region 11d of the device region 11A via the drain silicide layer 11Ds. Further, in the interlayer insulation film 14, there is formed a via-plug 14C in electric contact with the p$^+$-type source region 11c and further with the n$^+$-type contact region 11tap of the device region 11B via the source silicide layer 11Ss, and there is formed a via-plug 14D in the interlayer insulation film 14 in electric contact with the p$^+$-type drain region 11d of the device region 11B via the drain silicide layer 11Ds.

Figure 10:
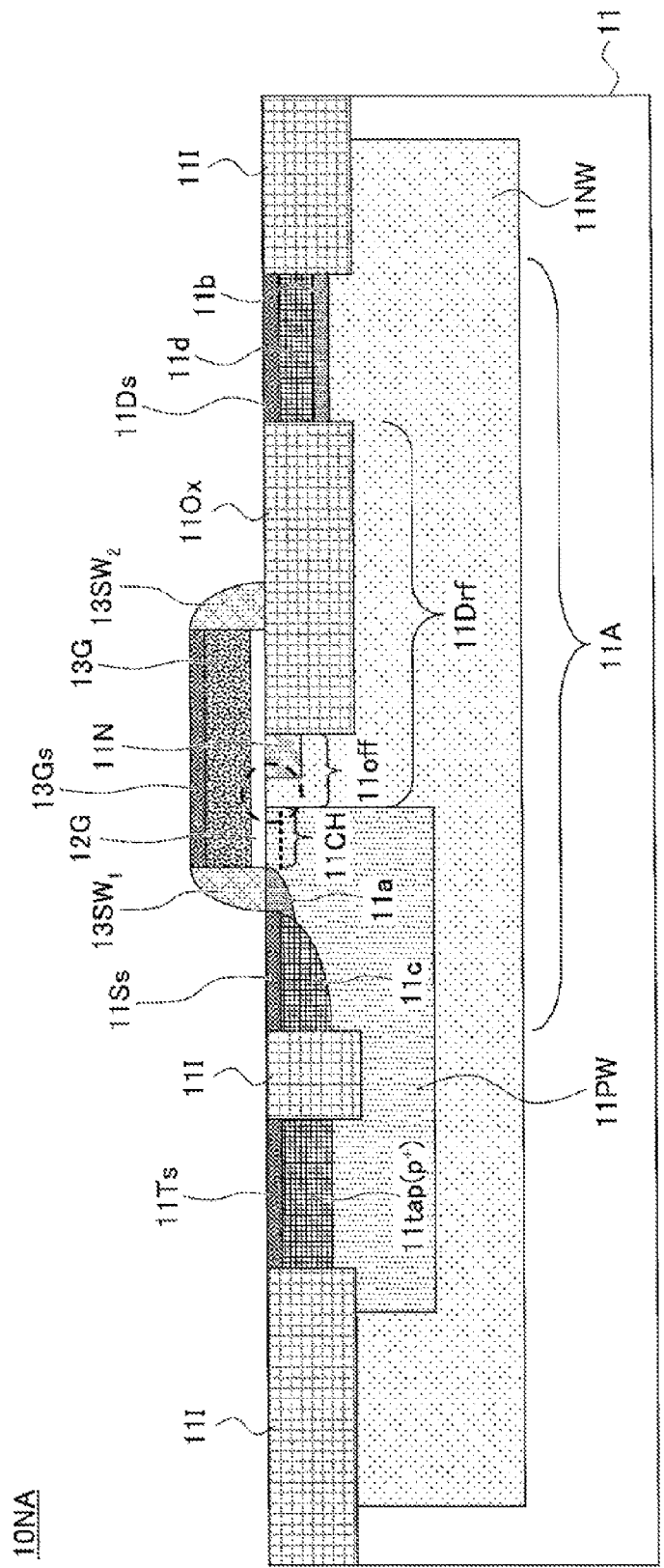
FIG. 10 is a cross-sectional view diagram representing a high-voltage MOS transistor according to a modification of the first embodiment.

In the present embodiment, it should be noted that it is not necessary to carry out the additional ion implantation into the offset region 11off over the entirety of the offset region 11off extending from the p-type well 11PW to the buried insulation film 11Ox in the cross-sectional diagram of FIG. 9B but it is also possible to carry out the additional ion implantation ino only a limited region from the buried insulation film as represented in a modification of FIG. 10. It should be noted that FIG. 10 represents a cross-sectional diagram similar to that of FIG. 1B depicting an n-channel high-voltage MOS transistor 10NA according to a modification of the n-channel high-voltage MOS transistor 10N.

By conducting the additional ion implantation to the limited region 10N from the buried insulation film 11Ox, it becomes possible to decrease the impurity concentration level in the vicinity of the p/n junction interface between the p-type well 11PW and the n-type offset region 11off represented by a broken line circle in FIG. 10. Thereby, it becomes possible to relax the concentration of electric field at such a junction interface.

Second Embodiment

Figure 11A:
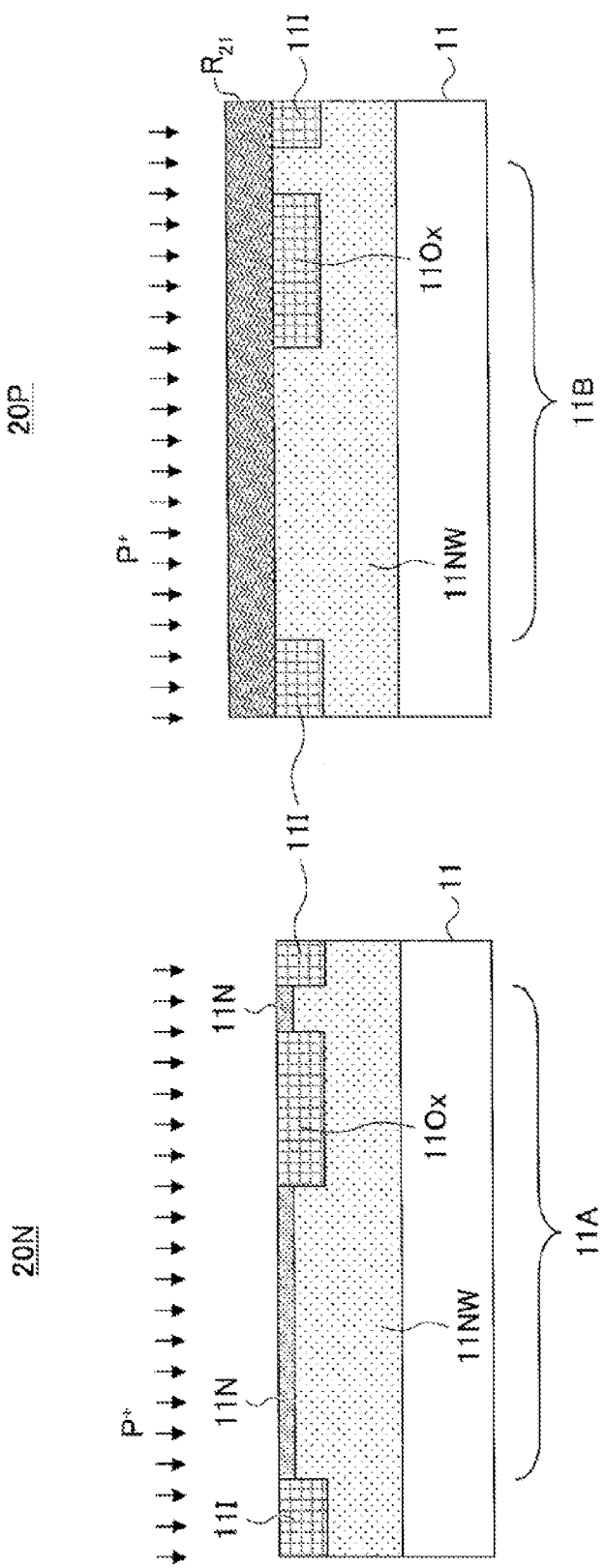
FIG. 11A is a first diagram explaining the fabrication process of a high-voltage MOS semiconductor according to a second embodiment in partial views.
Figure 11B:
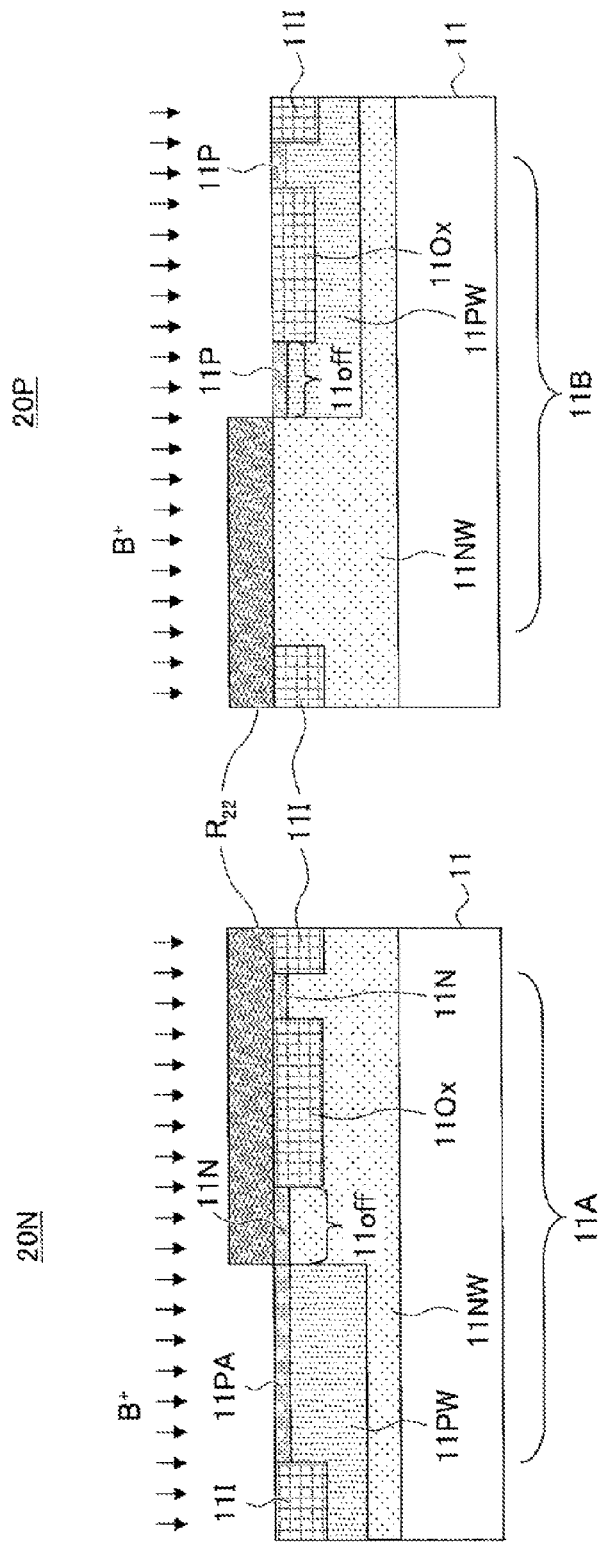
FIG. 11B is a second diagram explaining the fabrication process of a high-voltage MOS semiconductor according to the second embodiment in partial views.

FIGS. 11A and 11B represent the process flow diagrams explaining the fabrication process steps of a high-voltage n-channel MOS transistor 20N and a high-voltage p-channel MOS transistor 20P according to a second embodiment. In the drawings, those parts explained before are designated by the same reference numerals and the description thereof will be omitted.

Referring to FIG. 11A, it can be seen the first well 11NW of n-type is formed in the device region 11A over the entire surface thereof by conducting the ion implantation of phosphorus first under the acceleration voltage of 2 MeV and the dose of $2 \times 10^{12}$ cm$^{-2}$, wherein it should be noted that, in the step of FIG. 11A, the additional ion implantation region 11N of phosphorus is formed in the surface part of the device region 11A to the depth of less than 400 nm from the surface of the silicon substrate 11 by conducting the additional ion implantation of phosphorus into the entire surface of the device region 11A under the acceleration voltage of 15 keV and the dose of $1 \times 10^{12}$ cm$^{-2}$. In the present embodiment, it should be noted that the order of the foregoing ion implantation steps is arbitrary, and it is not always necessary to carry out the additional ion implantation, conducted under the acceleration voltage of 15 keV and the dose of $1\times10^{12}$ cm$^{-2}$, as the last process of the foregoing ion implantation process steps.

Next, in the present embodiment, the p-type well 11PW is formed in the device isolation regions 11A and 11B in the step of FIG. 11B by introducing boron into the silicon substrate 11 in the device regions 11A and 11B first under the acceleration voltage of 400 keV and the dose of $1\times10^{13}$ cm$^{-2}$ and then under the acceleration voltage of 150 keV and the dose of $5\times10^{12}$ cm$^{-2}$ while using a resist pattern R$_{22}$ as a mask. Further, in the step of FIG. 11B, the additional ion implantation of boron is conducted under the acceleration voltage of 15 keV and the dose of $2.3\times10^{13}$ cm$^{-2}$ as the last process, and as a result, the additional ion implantation region 11P of p-type is formed in the device region 11B in correspondence to the surface part of the p-type well 11PW and in the surface part of the offset region 11off between the n-type well 11NW and the buried insulation film 11Ox. Further, the additional ion implantation region 11PA of p-type is formed also in the device region 11A in correspondence to the surface part of the p-type well 11PW. It should be noted that the additional ion implantation region 11PA at the surface part of the p-type well 11PW is formed for the purpose of threshold control of the n-channel high-voltage MOS transistor to be formed in the device region 11A. In the present embodiment, too, it should be noted that the n-type additional ion implantation region 11N or the p-type additional ion implantation region 11P formed in the offset region 11off in the step of FIG. 11A or FIG. 11B does not reach the depth of the bottom edge of the buried insulation film 11Ox and hence the depth of the bottom edge of the device isolation insulation film 11I of the STI structure.

Further, after the step of FIG. 11B, the process steps similar to those explained with reference to FIGS. 9E-9I are conducted, and with this, the n-channel high-voltage MOS transistor 20N and the p-channel high-voltage MOS transistor 20P are obtained as represented in FIG. 12.

Thus, with the present embodiment, it should be noted that the additional ion implantation region 11N of n-type is formed in the offset region 11off of the n-channel MOS transistor 20N and the p-type region 11P is formed in the device region 11B in correspondence to the offset region 11off of the p-channel MOS transistor 20P. Further, the p-type region 11PA is formed in the channel region of the n-channel MOS transistor 20N as the channel dope region.

According to the present embodiment, it becomes possible to eliminate the mask process in the additional ion implantation process of FIG. 11A, and it becomes possible to avoid the problems associated with the positional error of the mask. Further, it becomes possible to simplify the fabrication process of the high-voltage MOS transistor and it becomes further possible to suppress the variation of device characteristics.

In the present embodiment, it should be noted that the dose of boron in the step of FIG. 11B is increased as compared with the dose of phosphorus in the step of FIG. 11A so as to cancel out the n-type additional dope region 11N formed in the surface part of the p-type well 11PW previously by the ion implantation of phosphorus and such that there is formed a threshold control region of p-type.

Figure 13A:
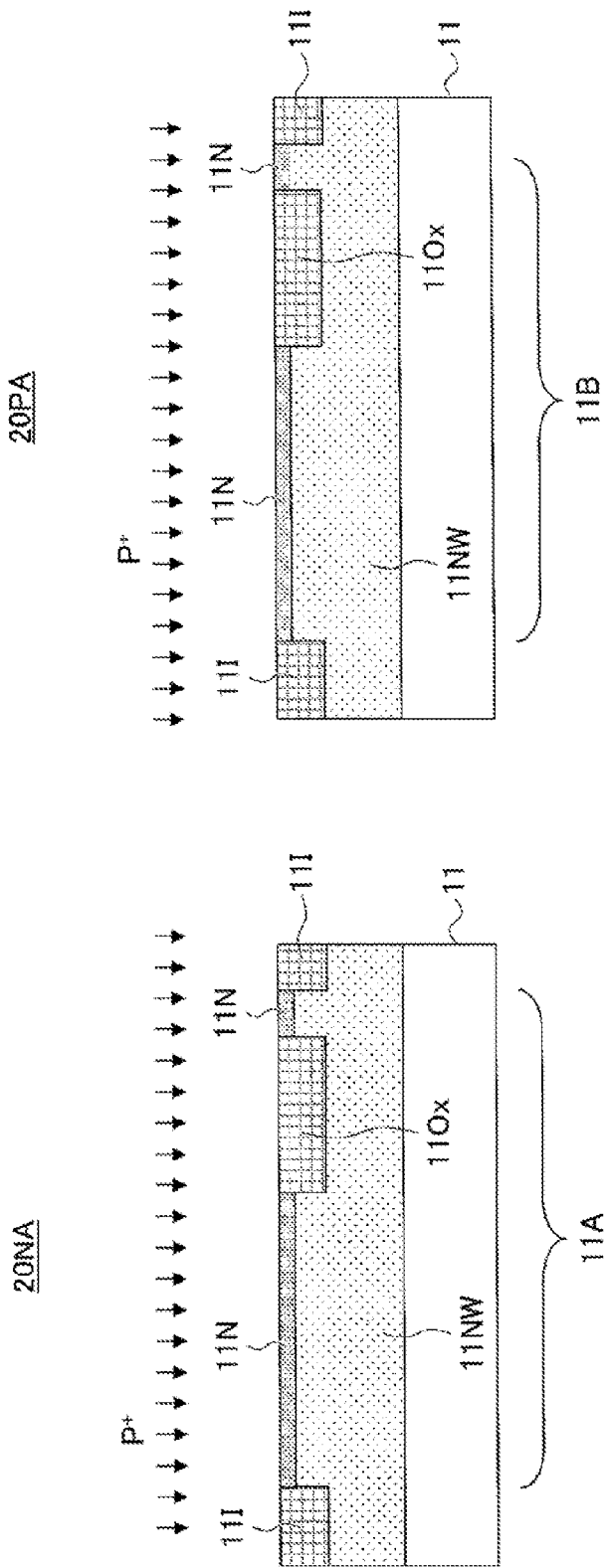
FIG. 13A is a first diagram explaining the fabrication process of a high-voltage MOS semiconductor according to a modification of the second embodiment in partial views.
Figure 13B:
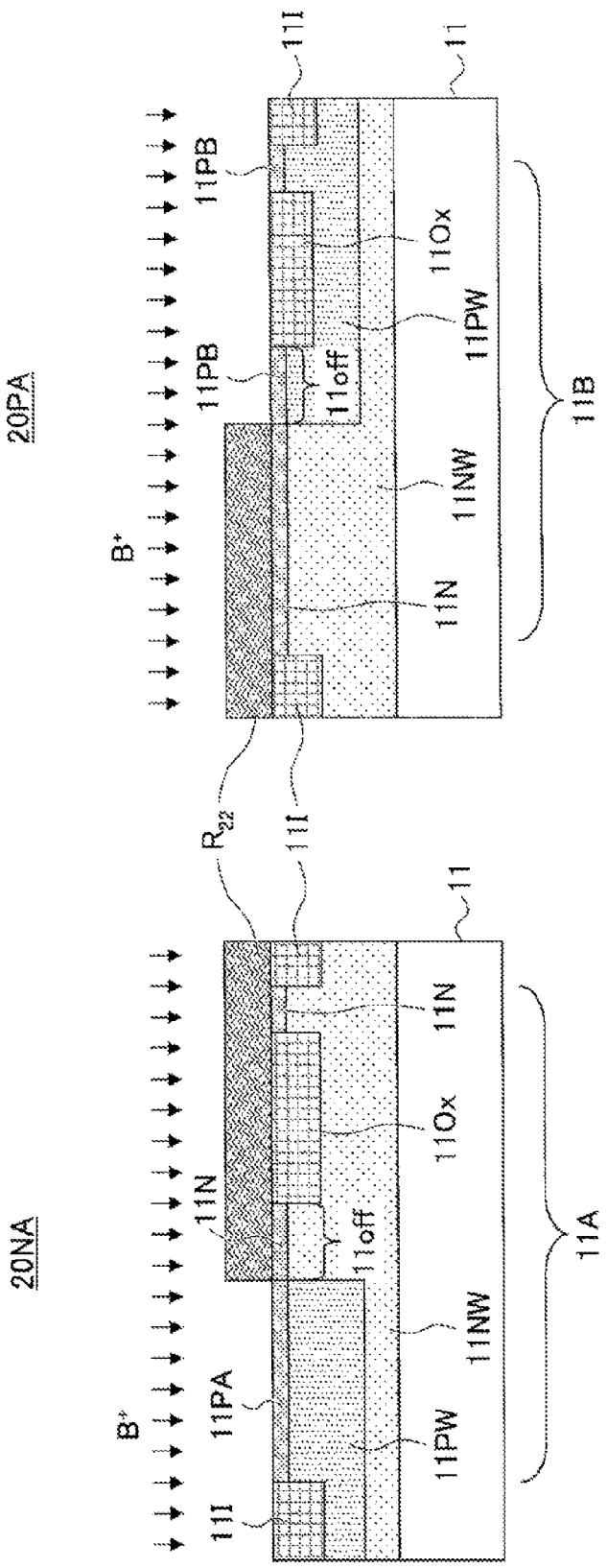
FIG. 13B is a second diagram explaining the fabrication process of the high-voltage MOS semiconductor according to the modification of the second embodiment in partial views.

In the step of FIG. 11A of the present embodiment, it should be noted that the foregoing ion implantation of phosphorus may be conducted not only in the device region 11A but also over the entire surface of the device region 11B. FIGS. 13A and 13B represent a part of the fabrication process of an n-channel high-voltage MOS transistor 20NA and a p-channel high-voltage MOS transistor 20PA according to a modification of FIGS. 11A and 11B.

Referring to FIG. 13A, the additional ion implantation region 11N of phosphorus is formed in the surface part of the n-type well 11NW in the device regions 11A and 11B, wherein it should be noted that the dose of boron in the ion implantation process of FIG. 13B is increased sufficiently such that the n-type conductivity of the additional ion implantation region 11N formed previously is changed to p-type not only in the device region 11A but also in the device region 11B. As a result, it becomes possible to form the p-type injection region 11PA in the surface part of the n-type well 11NW of the device region 11A for threshold adjustment and it becomes further possible to form the p-type additional injection region 11PB corresponding to the offset region 11off and the drain region of the device region 11B.

Figure 14:
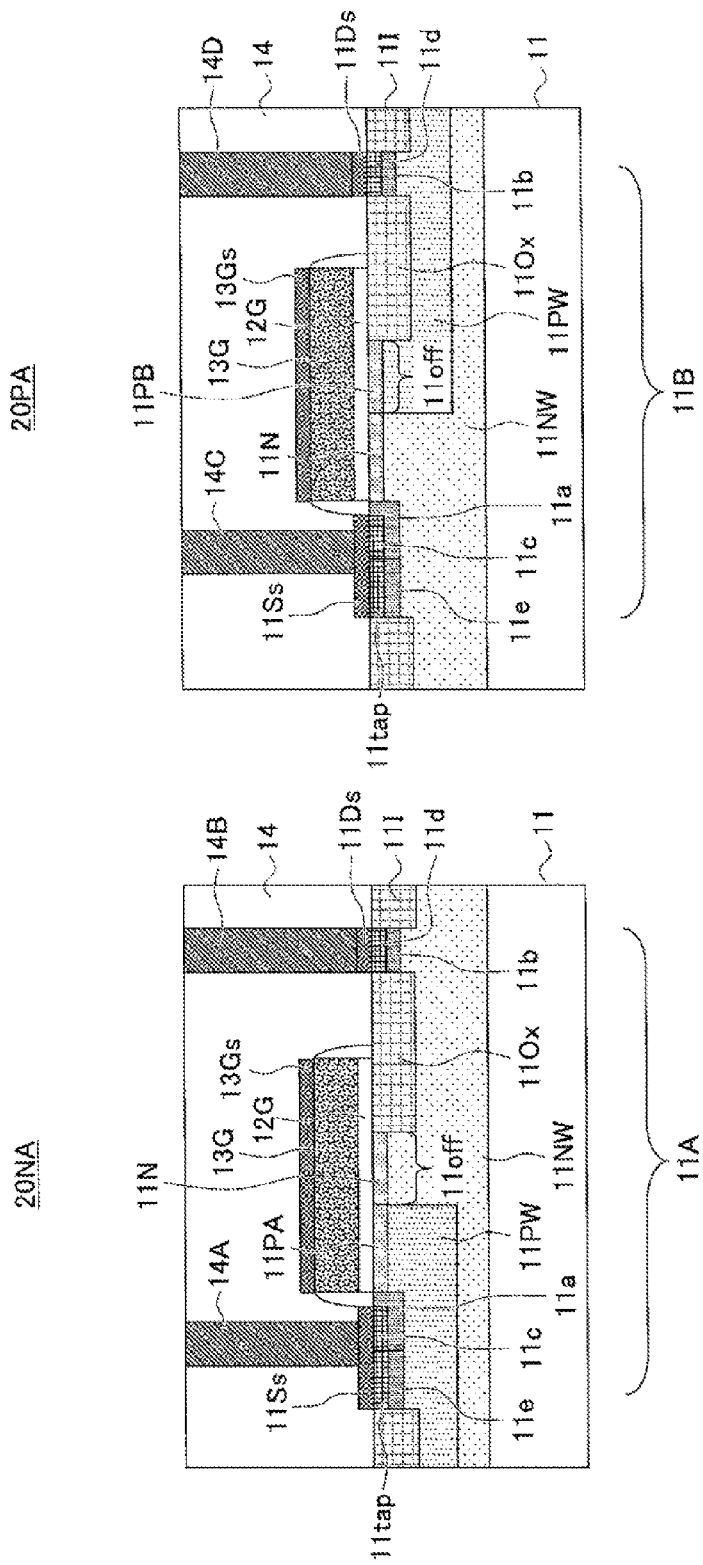
FIG. 14 is a cross-sectional view diagram representing the high-voltage MOS transistor according to the modification of the second embodiment in partial views.

Thus, after the step of FIG. 13B, the process steps similar to those explained with reference to FIGS. 9E-9I are conducted, and with this, the n-channel high-voltage MOS transistor 20NA and the p-channel high-voltage MOS transistor 20PA are obtained as represented in FIG. 14.

With the present modification, it should be noted that the additional ion implantation region 11N of n-type is formed in the offset region 11off of the n-channel MOS transistor 20NA in the device region 11A and that the p-type region 11PB is formed in the offset region 11off of the p-channel MOS transistor 20PA in the device region 11B. Further, the p-type region 11PA is formed in the channel region of the n-channel MOS transistor 20NA as the channel dope region and the n-type region 11N is formed in the channel region of the p-channel MOS transistor 20PA as the channel dope region.

According to the present modification, it becomes possible to eliminate the mask process at the time of the additional ion implantation step of FIG. 13A, and it becomes possible to avoid the problems associated with the positional error of the mask. Further, it becomes possible to simplify the fabrication process of the high-voltage MOS transistor and it becomes further possible to suppress the variation of characteristics.

Third Embodiment

Next, the fabrication process of a semiconductor integrated circuit, in which an high-voltage n-channel MOS transistor 30N and a high-voltage p-channel MOS transistor 30P are formed on the same silicon substrate together with an n-channel MOS transistor 30NM and a p-channel MOS transistor 30PM operating at an ordinary, lower voltage, will be explained with reference to FIGS. 15A-15H. In the drawings, those parts explained before are designated by the same reference numerals and the description thereof will be omitted.

Referring to FIG. 15A, there are defined device regions 11C and 11D on the silicon substrate 11 of p-type or n-type in addition to the device regions 11A and 11B by the device isolation region 11I respectively for the n-channel MOS transistor 30NM and the p-channel MOS transistor 30PM operating at the ordinary, low voltage.

Further, in the step of FIG. 15A, ion implantation of phosphorus is conducted into the silicon substrate first under the acceleration voltage of 2 MeV and the dose of $2\times10^{12}$ cm$^{-2}$ and then under the acceleration voltage of 500 keV and the dose of $2\times10^{12}$ cm$^{-2}$. With this, the n-type well 11NW is formed in the device regions 11A-11D with a depth deeper than the device isolation region 11I. In the present embodiment, too, the order of the foregoing ion implantation steps can be changed as desired.

Figure 15B:
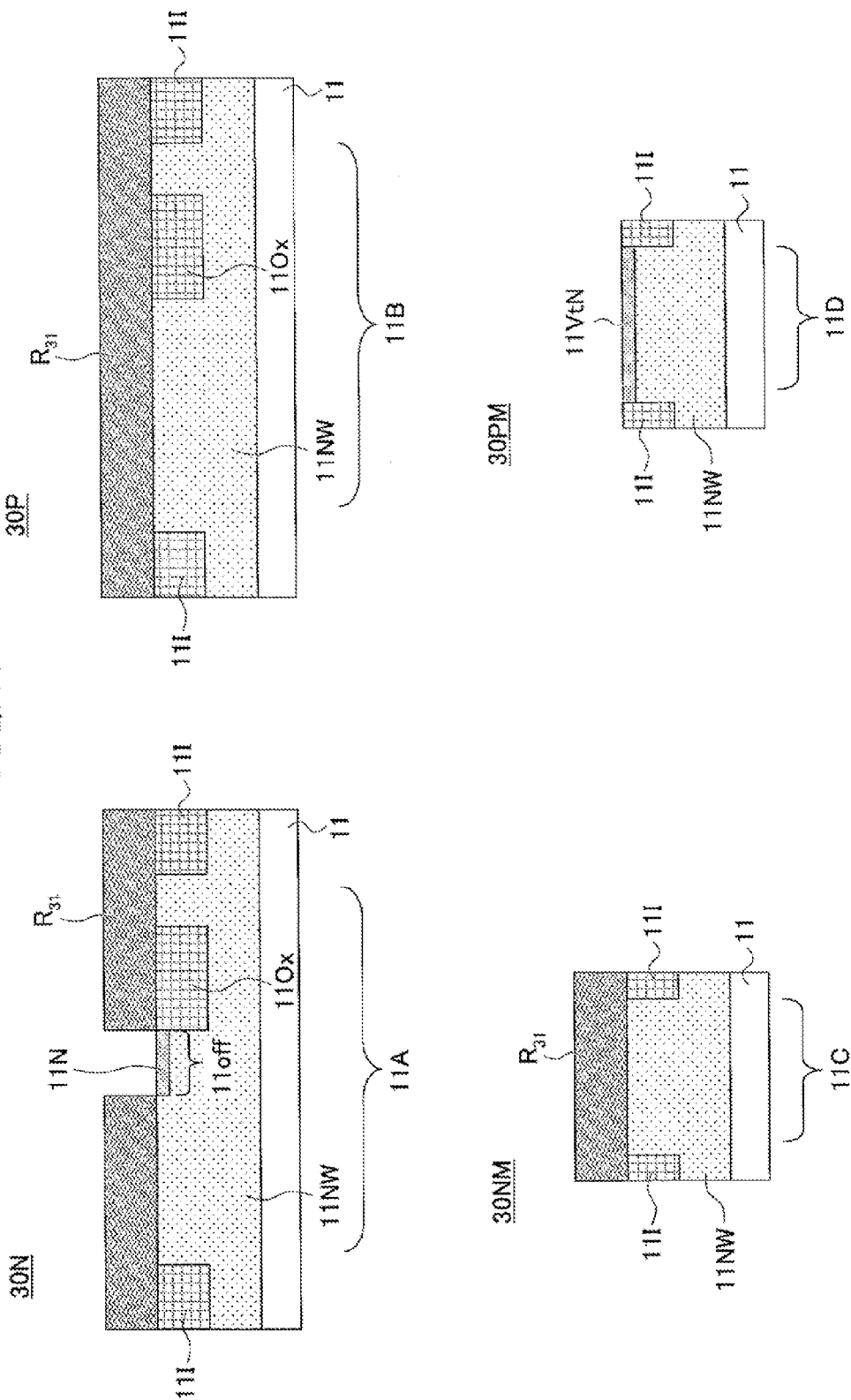
FIG. 15B is a second diagram explaining the fabrication process of the semiconductor integrated circuit device according to the third embodiment in partial views.

Next, in the step of FIG. 15B, the surface of the silicon substrate 11 is protected by a resist pattern R$_{31}$ except for the part of the device region 11A in which the offset region 11off is to be formed and further the device region 11D, and the additional ion implantation of phosphorus is conducted under the acceleration voltage of 15 keV and the dose of $1\times10^{12}$ $cm^{-2}$ while using the resist pattern $R_{31}$ as a mask. With this, the additional ion implantation region 11N of n-type is formed in correspondence to the surface part of the offset region 11off of the device region 11A. Further, a channel dope region 11VtN of n-type is formed in the surface part of the device region 11D. Similarly to the previous embodiment, the depth of the "surface part" does not reach the bottom edge of the device isolation region 11I in any of the device region 11A or the device region 11D.

Next, in the step of FIG. 15C, the surface of the silicon substrate 11 is covered with a resist pattern $R_{32}$ except for the region where the p-type well 11PW is to be formed in the device regions 11A and 11B and the device region 11C, and ion implantation of boron is conducted first under the acceleration voltage of 400 keV and the dose of $1\times10^{13}$ $cm^{-2}$, then under the acceleration voltage of 150 keV and the dose of $5\times10^{12}$ $cm^{-2}$, and further under the acceleration voltage of 15 keV and the dose of $1\times10^{13}$ $cm^{-2}$. With this, the p-type well 11PW is formed in the device regions 11A and 11B and further in the device region 11D so as to be included in the n-type well 11NW.

Next, in the step of FIG. 15D, the surface of the silicon substrate 11 is covered with a resist pattern $R_{33}$ except for the region corresponding to the offset region 11off of the p-channel high-voltage MOS transistor 30P to be formed in the device region 11B and further the device region 11C, and the additional ion implantation of boron is conducted under the acceleration voltage of 2 keV and the dose of $1\times10^{13}$ $cm^{-2}$ while using the resist pattern $R_{33}$ as a mask. With this, the additional injection region 11P of p-type is formed in the surface part of the offset region 11off of the device region 11B and there is also formed a p-type channel dope region 11VtP in the device region 11C. In the present embodiment, too, the depth of the "surface part" does not reach the bottom edge of the device isolation region 11I in any of the device region 11A and the device region 11D.

Next, in the step of FIG. 15E, a thermal oxide film of the film thickness of 15 nm and a polysilicon film of the film thickness of 150 nm, for example, are formed consecutively on the structure of FIG. 15D, and after patterning the polysilicon film and the thermal oxide film, there are formed a gate insulation film 12GA and a polysilicon gate electrode pattern 13GA in the device region 11A and a gate insulation film 12GB and a polysilicon gate electrode pattern 13GB in the device region 11B such that the gate insulation film 12GA and the polysilicon gate electrode pattern 13GA extend continuously in the device region 11A from the p-type well 11PW beyond the offset region 11off and reach a part of the buried insulation film 11Ox and such that the gate insulation film 12GB and the polysilicon gate electrode pattern 13GB extend in the device region 11B continuously from the n-type well 11NW beyond the offset region 11off and reach a part of the buried insulation film 11Ox. Further, there are formed a gate insulation film pattern 12GC and a polysilicon gate electrode pattern 13Gc in the device region 11C and a gate insulation film pattern 12GD and a polysilicon gate electrode pattern 13GD in the device region 11D.

Further, in the step of FIG. 15E, the device region 11A and the device region 11C are subjected to ion implantation of phosphorus ions (P+) or arsenic ions (As+) while using the polysilicon gate electrode patterns 13GA and 13GC and a resist pattern $R_4A$ covering the device regions 11B and 11D as a mask. Further, the device region 11B and the device region 11D are subjected to ion implantation of boron ions (B+) while using the polysilicon gate electrode patterns 13GB and 13GD and a resist pattern $R_4B$ covering the device regions 11A and 11C as a mask. With this, the source extension region 11a of n-type is formed in the device region 11A adjacent to the polysilicon gate electrode pattern 13GA and the drain region 11b of n-type is formed also in the device region 11A adjacent the gate electrode patter 13GA at the side opposite to the source extension region 11a. In the device region 11B, the source extension region 11a of p-type is formed adjacent to the polysilicon gate electrode pattern 13GB and the drain region 11b of p-type is formed adjacent the gate electrode patter 13GB at the side opposite to the source extension region 11a. Further, in the device region 11C, there are formed a source extension region 11f and a drain extension region 11g of n-type at the respective lateral sides of the polysilicon gate electrode pattern 13GC. Further, a source extension region 11h and a drain extension region 11i of p-type are formed in the device region 11D at the respective lateral sides of the polysilicon gate electrode pattern 13GD.

Meanwhile, in the step of FIG. 15E, it should be noted that the entire surface of the device region 11B except for the part where a contact region 11tap is to be formed, and a part of the device region 11A where the contact region 11tap is to be formed are protected by the resist pattern $R_4A$ at the time when the ion implantation is conducted into the device region 11A. Further, in the step of FIG. 15E, it should be noted that the entire surface of the device region 11A except for the part where the contact region 11tap is to be formed, and a part of the device region 11B where the contact region 11tap is to be formed are protected by the resist pattern $R_4B$ at the time when the ion implantation is conducted into the device region 11B. As a result, there is formed a contact region 11e of p-type in the device region 11A adjacent to the source extension region 11a of n-type for the contact region 11tap, and in the device region 11B, a contact region 11e of n-type is formed adjacent to the source extension region 11a of p-type for the contact region 11tap.

Next, in the step of FIG. 15F, the polysilicon gate electrode patterns 13GA-13GD are formed with sidewall insulation films $13SW_1$ and $13SW_2$ at the sidewall surface of the source side and at the sidewall surface of the drain side in the device regions 11A-11D, and ion implantation of phosphorus ions (P+) or arsenic ions (As+) is conducted in the step of FIG. 15G into the device region 11A and 11C while using the polysilicon gate electrode patterns 13GA and 13GC and further a resist pattern $R_5A$ covering the device regions 11B and 11D as a mask. Further, ion implantation of boron ions (B+) is conducted in the step of FIG. 15G into the device region 11B and 11D while using the polysilicon gate electrode patterns 13GB and 13GD and further a resist pattern $R_5B$ covering the device regions 11A and 11C as a mask. With this, the source region 11c of $n^+$-type is formed adjacent to the polysilicon gate electrode pattern 13GA and the drain region 11d of $n^+$-type is formed adjacent polysilicon gate electrode 13GA at the side opposite to the source region 11c in the device region 11A. Further, in the device region 11B, the source region 11c of $p^+$-type is formed adjacent to the polysilicon gate electrode pattern 13GB and the drain region 11d of $p^+$-type is formed adjacent to the polysilicon gate electrode pattern 13GB at the side opposite to the source region 11c. Further, in the device region 11C, there are formed a source region 11j and a drain region 11k of $n^+$-type at both lateral sides of the polysilicon gate electrode pattern 13GC and at outer sides of the sidewall insulation films $13SW_1$ and $13SW_2$. Further, in the device region 11D, there are formed a source region 11l and a drain region 11m of $p^+$-type at both lateral sides of the polysilicon gate electrode pattern 13GD and at outer sides of the sidewall insulation films 13SW$_1$ and 13SW$_2$.

Meanwhile, in the step of FIG. 15G, it should be noted that the entire surface of the device region 11B except for the part where a contact region 11tap is to be formed, and a part of the device region 11A where the contact region 11tap is to be formed, are protected by the resist pattern R$_5$A at the time when the ion implantation is conducted into the device region 11A. Further, in the step of FIG. 15G, it should be noted that the entire surface of the device region 11A except for the part where the contact region 11tap is to be formed, and a part of the device region 11B where the contact region 11tap is to be formed, are protected by the resist pattern R$_5$B at the time when the ion implantation is conducted into the device region 11B. As a result, the contact region 11tap of p$^+$-type is formed in the device region 11A adjacent to the source region 11c and in overlapping with the contact region 11e of p-type, while in the device region 11B, the contact region 11tap of n$^+$-type is formed adjacent to the source region 11d of p$^+$-type and in overlapping with the contact region 11e of n-type.

Further, in the step of FIG. 15H, there is conducted silicide formation on the structure of FIG. 15G by a salicide process, and as a result, there are formed a source silicide layer 11Ss and a drain silicide layer 11Ds respectively on the source region 11c of n$^+$-type and the drain region 11d of n$^+$-type in the device region 11A. Further the silicide layer 13Gs is formed on the polysilicon gate electrode pattern 13GA of n$^+$-type. At the same time, in the device region 11B, the source silicide layer 11Ss and the drain silicide layer 11Ds are formed respectively on the source region 11c of p$^+$-type and the drain region 11d of p$^+$-type. Further, the silicide layer 13Gs is formed on the polysilicon gate electrode pattern 13GB. Similarly, in the device region 11C, the source silicide layer 11js and the drain silicide layer 11ks are formed respectively on the source region 11j of n$^+$-type and the drain region 11k of n$^+$-type. Further, the silicide layer 13GCs is formed on the polysilicon gate electrode pattern 13GC. Further, in the device region 11D, the source silicide layer 11ls and the drain silicide layer 11ms are formed respectively on the source region 11l of p$^+$-type and the drain region 11m of p$^+$-type. Further, the silicide layer 13GDs is formed on the polysilicon gate electrode pattern 13GD. In the example of FIG. 15H, it should be noted that the source silicide layer 11Ss functions also as the silicide layer of the contact region 11tap in both of the device regions 11A and 11B.

Figure 15I:
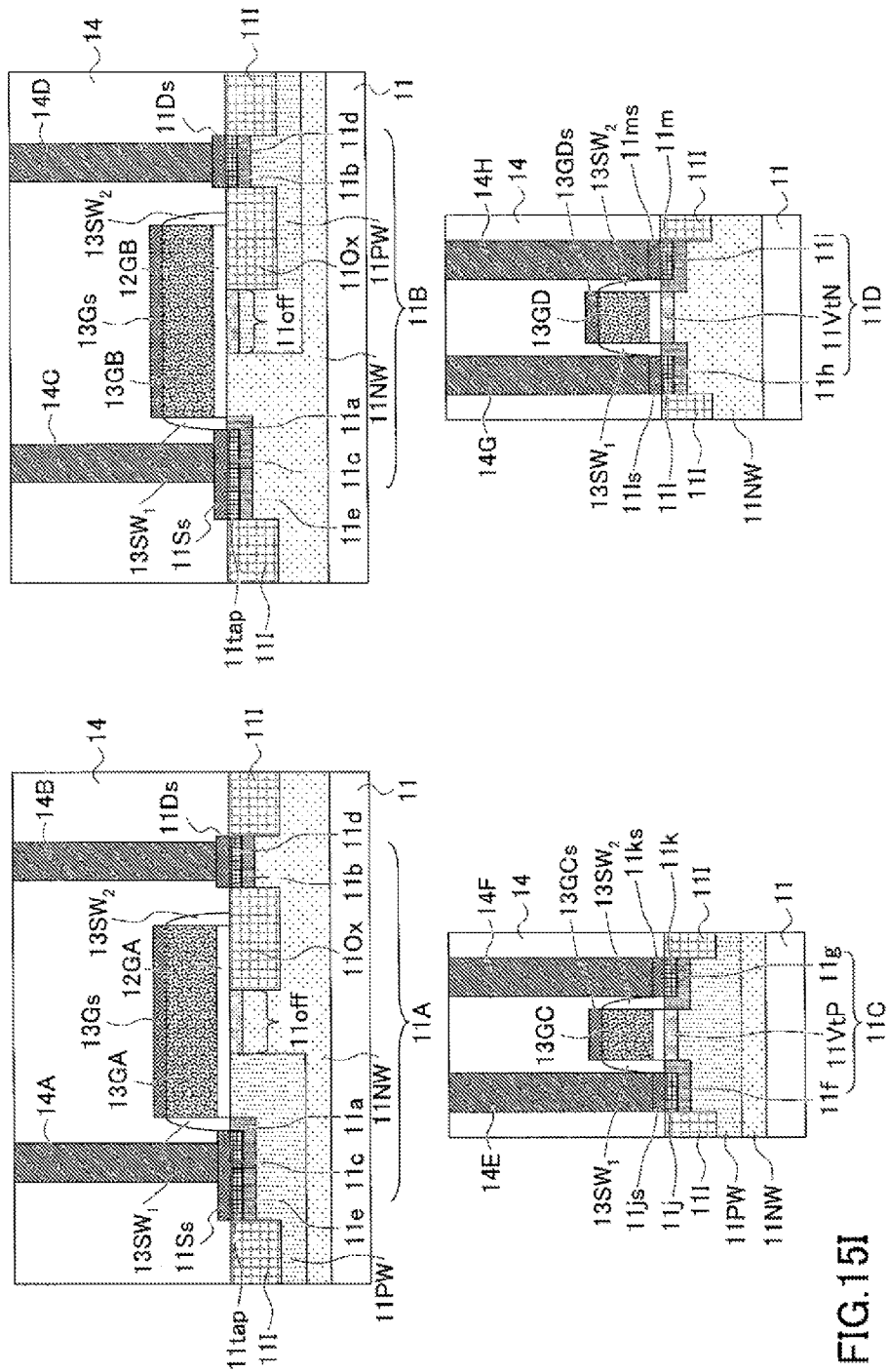
FIG. 15I is a ninth diagram explaining the fabrication process of the semiconductor integrated circuit device according to the third embodiment in partial views.

Further, in the step of FIG. 15I, there is formed an interlayer insulation film 14 over the structure of FIG. 15H to cover the device regions 11A-11D, and there is further formed a via-plug 14A in the interlayer insulation film 14 in electric contact with the n$^+$-type source region 11c and further the p$^+$-type contact region 11tap of the device region 11A via the source silicide layer 11Ss. Further, there is formed a via-plug 14B in the interlayer insulation film 14 in electric contact with the n$^+$-type drain region 11d of the device region 11A via the drain silicide layer 11Ds. Further, in the interlayer insulation film, there is formed a via-plug 14C in electric contact with the p$^+$-type source region 11c and further the n$^+$-type contact region 11tap of the device region 11B via the source silicide layer 11Ss, and there is formed a via-plug 14D in the interlayer insulation film 14 in electric contact with the p$^+$-type drain region 11d of the device region 11B via the drain silicide layer 11Ds.

Further, in the step of FIG. 15I, a via-plug 14E is formed in the interlayer insulation film 14 in electrical contact with the source region 11j of n$^+$-type in the device region 11C via the silicide layer 11js, a via-plug 14F is formed in the interlayer insulation film 14 in electrical contact with the source region 11k of n$^+$-type in the device region 11C via the silicide layer 11ks, a via-plug 14G is formed in the interlayer insulation film 14 in electrical contact with the source region 11l of p$^+$-type in the device region 11D via the silicide layer 11ls, and a via-plug 14H is formed in the interlayer insulation film 14 in electrical contact with the source region 11m of p$^+$-type in the device region 11D via the silicide layer 11ms.

According to the present embodiment, the additional ion implantation of phosphorus to the surface part of the offset region 11off in the device region is used also for the channel doping of the device region 11D, and the additional ion implantation of boron to the surface part of the offset region 11off of the device region 11B is used also for the channel doping of the device region 11C. Thus, there arises no increase of process steps.

Fourth Embodiment

In the present embodiment, it is also possible to eliminate the formation of the resist pattern R$_{31}$ on the device region 11A in the step of FIG. 15B similarly to the embodiment of FIG. 11A explained before.

Figure 16C:
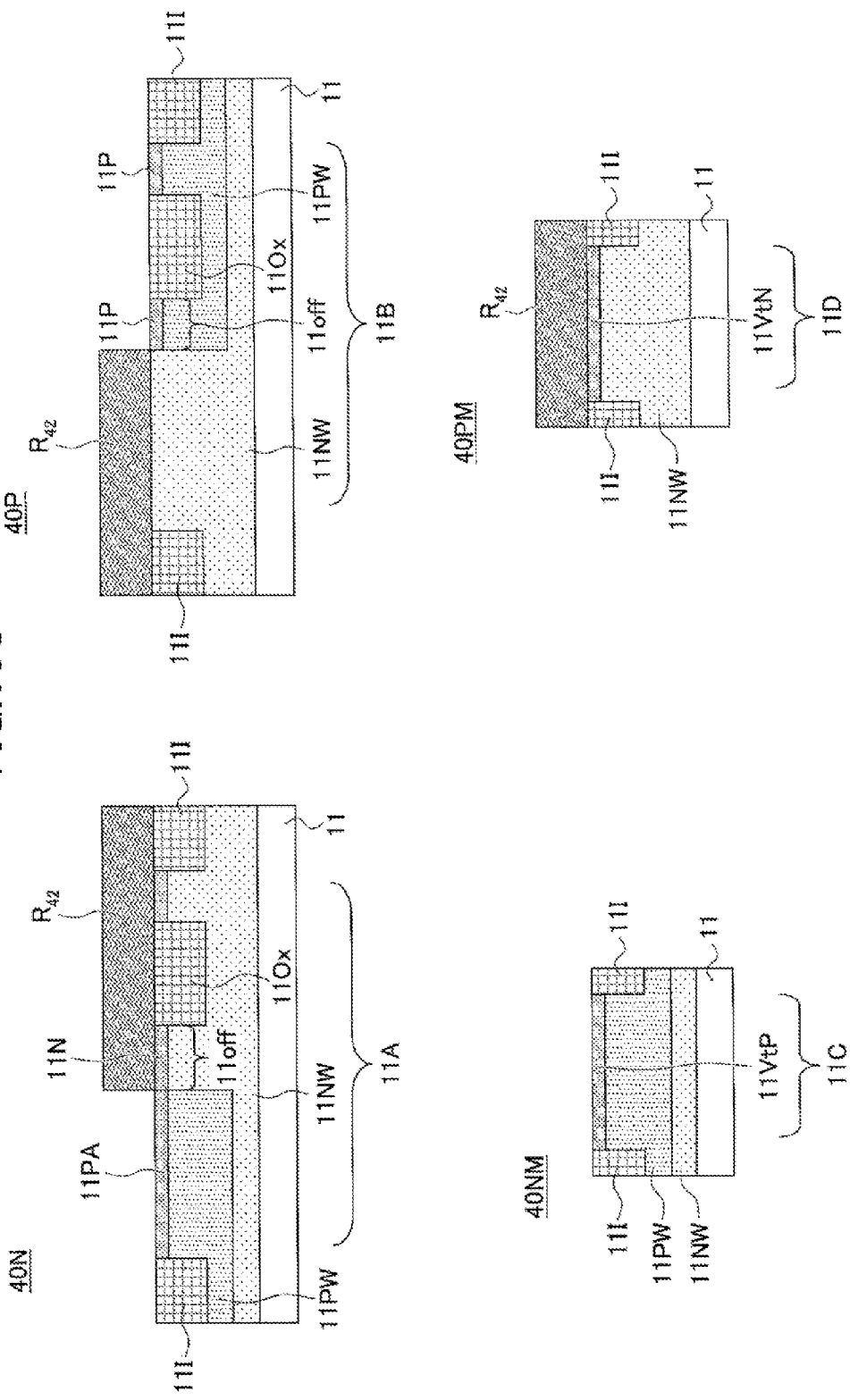
FIG. 16C is a third diagram explaining the fabrication process of the semiconductor integrated circuit device according to the fourth embodiment in partial views.

FIGS. 16A-16C are process flow diagrams representing a part of the fabrication process of a semiconductor integrated circuit device according to a fourth embodiment in which the formation of the resist pattern R$_{31}$ to the device region 11A in the step of FIG. 15B is eliminated.

In the present embodiment, the step of FIG. 16A is conducted in correspondence to FIG. 15A wherein the device regions 11A, 11B, 11C and 11D are formed on the silicon substrate 11 by the device isolation region 11I respectively in correspondence to the high-voltage n-channel MOS transistor 40N, the high-voltage p-channel MOS transistor 40P, the n-channel MOS transistor 40NM and the p-channel MOS transistor 40PM operating at the lower voltage.

Next, in the step of FIG. 16B, the device regions 11B and 11C are covered with the resist pattern R$_{41}$ and ion implantation of phosphorus is conducted into the device region 11A and the device region 11D in this state under the acceleration voltage of 15 keV and the dose of 1×10$^{12}$ cm$^{-2}$. With this, the n-type region 11N is formed in the surface part of the n-type well 11NW in the device region 11A, while in the device region 11D, the n-type region 11VtN is formed in the surface part of the n-type well 11NW. Here, the n-type region 11VtN constitutes the channel dope region of the p-channel MOS transistor 40PM formed in the device region 11D.

Further, in the step of FIG. 16C, ion implantation of boron is conducted into the silicon substrate 11 under the acceleration voltage of 400 keV and the dose of 1×10$^{12}$ cm$^{-2}$, then under the acceleration voltage of 150 keV and the dose of 5×10$^{12}$ cm$^{-2}$ and further under the acceleration voltage of 15 keV and the dose of 1.2×10$^{13}$ cm$^{-2}$ while using the resist pattern R$_{42}$ of the device regions 11A and 11B as a mask. With this, the p-type well 11PW is formed in the n-type well 11NW in the device region 11A and the p-type region 11PA is formed in the surface part of the p-type well 11PW. Here, it should be noted that the p-type region 11PA constitutes the channel dope region of the high-voltage n-channel MOS transistor formed in the device region 11A. With the formation of the p-type well 11PW, the offset region 11off of the high-voltage n-channel MOS transistor 40N is formed in the device region 11A adjacent to the p-type well 11PW by the n-type region 11n, and the offset region 11off of the high-voltage p-channel MOS transistor 40P is formed in the p-type well 11PW adjacent to the n-type well 11NW in the device region 11B.

Further, the p-type well 11PW is formed in the n-type well 11NW also in the device region 11C.

Further, in the step of FIG. 16C, the p-type region 11P is formed in the surface part of the offset region 11off and further in the part corresponding to the drain region of the high-voltage p-channel MOS transistor 40P in the device region 11B at the same time. Further, the p-type well 11PW is formed also in the n-type well 11NW in the device region 11C. Further, the p-type region 11VtP is formed in the device region 11C in the surface part of the p-type well 11PW thus formed. Here, it should be noted that the p-type region 11VtP becomes the channel dope region of the n-channel MOS transistor 40NM.

Figure 17:
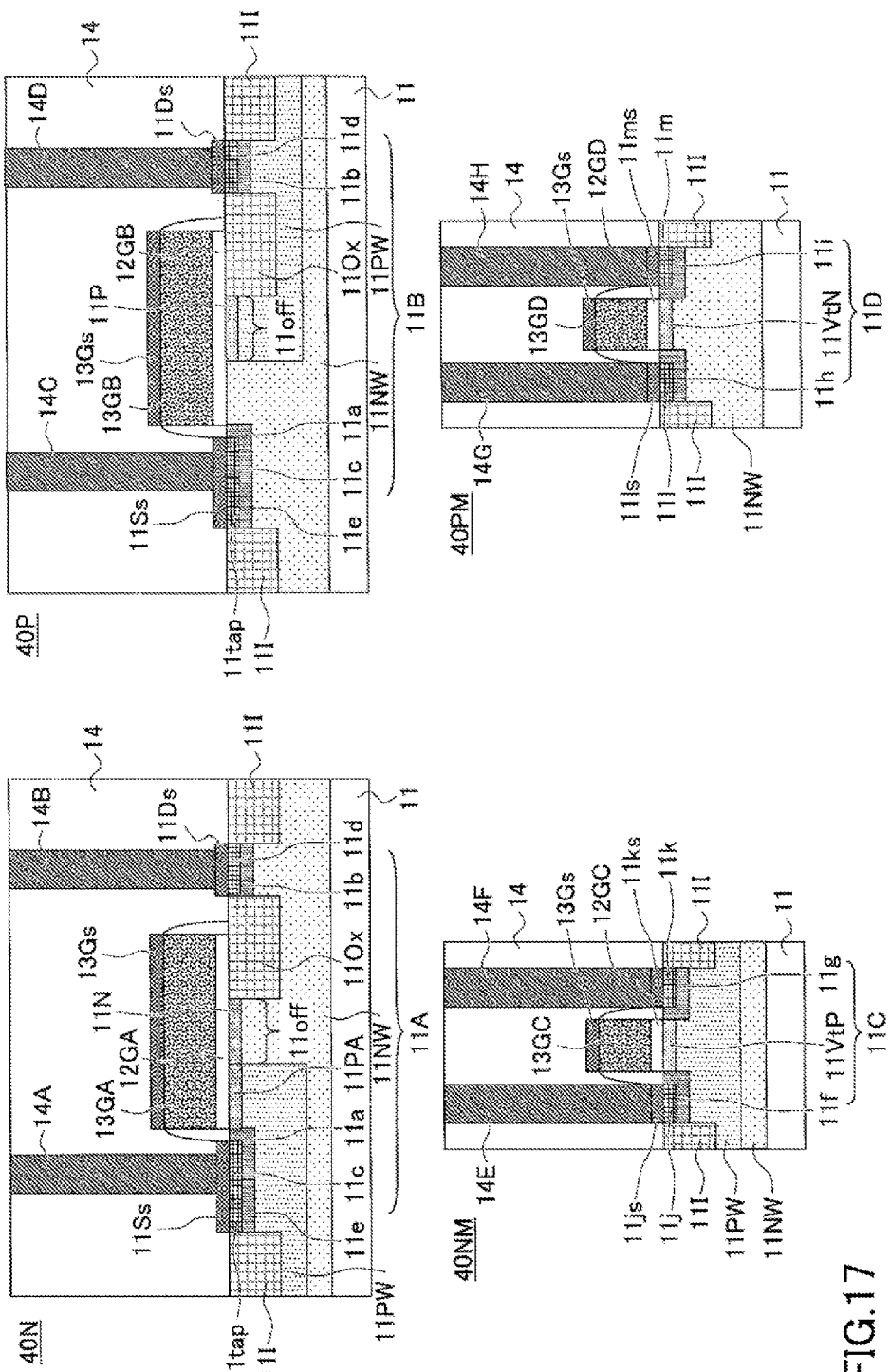
FIG. 17 is a cross-sectional diagram representing the construction of a semiconductor integrated circuit device according to the fourth embodiment in partial views.

Further, the process of FIGS. 15E-15I are conducted subsequent to the step of FIG. 16C in the present embodiment, and with this, the high-voltage n-channel MOS transistor 40N, the high-voltage p-channel MOS transistor 40P, the n-channel MOS transistor 40NM and the p-channel MOS transistor 40PM are formed on the device regions 11A-11D respectively as represented in FIG. 17.

In FIG. 17, it should be noted that the high-voltage p-channel MOS transistor 40P, the n-channel MOS transistor 40NM and the p-channel MOS transistor 40PM are identical to the high-voltage p-channel MOS transistor 30P, the n-channel MOS transistor 30NM and the p-channel MOS transistor 30PM respectively. On the other hand, the high-voltage n-channel MOS transistor 40N is different from the high-voltage n-channel MOS transistor 30N in the point that the p-type region 11PA is formed in the channel region as the channel dope region.

In the present embodiment, too, it becomes possible to eliminate the formation of the resist pattern R41 in the device region 11A, and it becomes possible to avoid the problem of variation of the transistor device characteristics caused by the positional error of the resist pattern. Further, it becomes possible to simplify the fabrication process of the semiconductor device.

Fifth Embodiment

Figure 18:
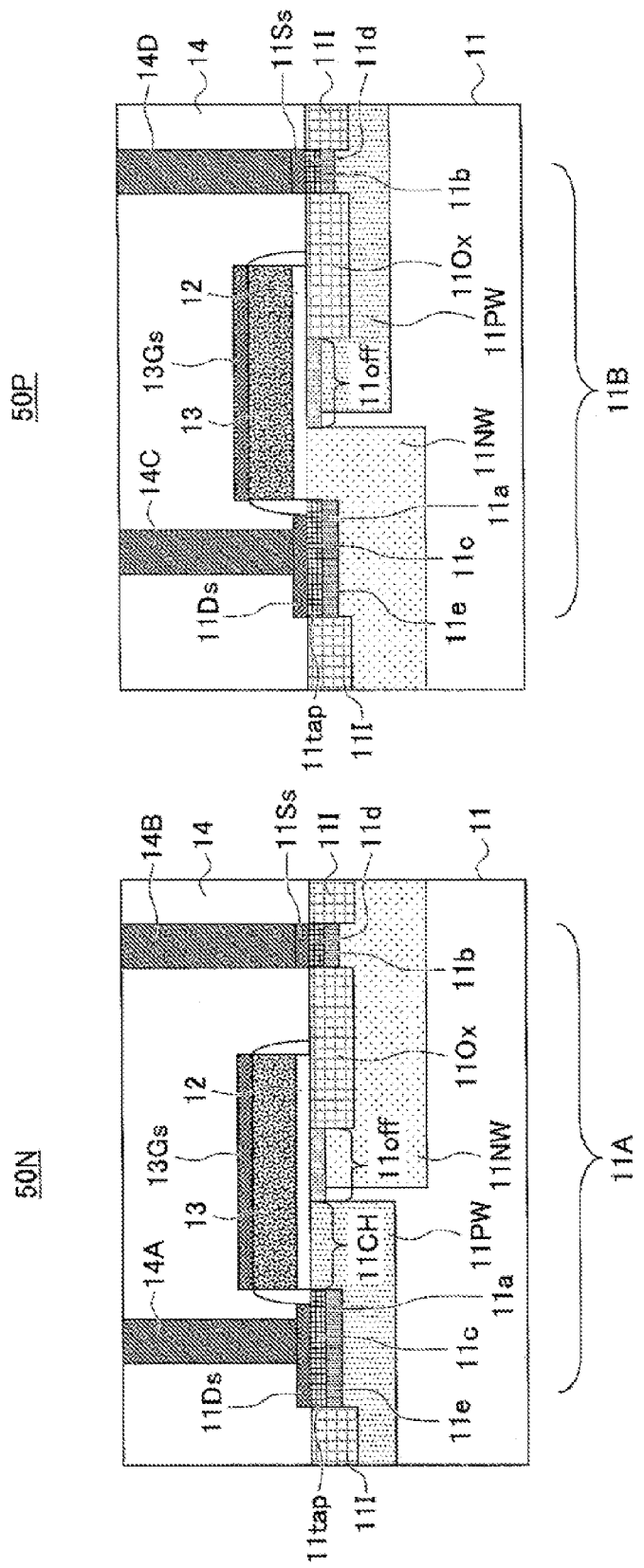
FIG. 18 is a cross-sectional diagram representing the construction of a semiconductor integrated circuit device according to a fifth embodiment in partial views.

In the various embodiments described heretofore, explanation has been made for the high-voltage n-channel MOS transistor and the high-voltage p-channel MOS transistor based on the construction in which the p-type well 11PW is included in the n-type well. On the other hand, because the offset region 11off is doped and has increased conductivity, it is also possible, as in the present embodiment, to construct a high-voltage n-channel MOS transistor 50N and a high-voltage p-channel MOS transistor 50P as represented in FIG. 18 such that the n-type well 11NW and the p-type well 11PW are separated in surface of the silicon substrate 11. In FIG. 18, those parts explained before are designated by the same reference numerals and the description thereof will be omitted.

Referring to FIG. 19, it will be noted that the silicon substrate 11 of p$^-$-type or n$^-$-type exists in the device region 11A between the n-type well 11NW and the p-type well 11PW. However, because the offset region 11off doped to the n-type extends from the p-type well 11PW to the buried insulation film 11Ox, the electrons passed through the channel region 11CH in the p-type well 11PW travels through the offset region 11off of low resistance and reaches the drain region 11d of n$^+$-type along a path underneath the buried insulation film 11Ox similar to the one explained with reference to FIG. 2. As a result, the ON-resistance Ron of the high-voltage n-channel MOS transistor 50N is reduced similarly to other embodiments.

Further, in the case of the high-voltage p-channel MOS transistor 50P formed in the device region 11B, too, the offset region 11off doped to the p-type extends from the n-type well 11NW to the buried insulation film 11Ox. Thus, the holes passed through the channel region 11CH in the n-type well 11NW travels through the offset region 11off of low resistance and reaches the drain region 11d of p$^+$-type along a path underneath the buried insulation film 11Ox similar to the one explained with reference to FIG. 2. As a result, the ON-resistance Ron of the high-voltage p-channel MOS transistor 50P is also reduced similarly to other embodiments.

FIGS. 19A-19E are diagrams representing a part of the fabrication process of a semiconductor integrated circuit device of FIG. 18. In the drawings, those parts explained before are designated by the same reference numerals and the description thereof will be omitted. In the device region 11A, the high-voltage n-channel MOS transistor 50N is formed. In the device region 11B, the high-voltage n-channel MOS transistor 50P is formed. In the device region 11C, an ordinary n-channel MOS transistor 50NM similar to the MOS transistor 30N is formed. Further, in the device region 11D, an ordinary p-channel MOS transistor 50PM similar to the MOS transistor 30P is formed.

Referring to FIG. 19A, the device regions 11A-11D are doped with phosphorus first under the acceleration voltage of 2 MeV and the dose of $2 \times 10^{12}$ cm$^{-2}$ and then under the acceleration voltage of 500 keV and the dose of $2 \times 10^{12}$ cm$^{-2}$. With this, the n-type well 11NW is formed in the respective device regions.

Next, in the step of FIG. 19B, the device region 11A and 11B and further the device region 11C are subjected to ion implantation of boron under the acceleration voltage of 400 keV and the dose of $1 \times 10^{13}$ cm$^{-2}$ and then under the acceleration voltage of 150 keV and the dose of $5 \times 10^{12}$ cm$^{-2}$. With this, the p-type well 11PW is formed such that the p-type well 11PW is located at an outside of the n-type well 11NW formed previously in the device regions 11A and 11B and such that the p-type well 11PW is included in the n-type well 11NW in the device region 11C.

Figure 19C:
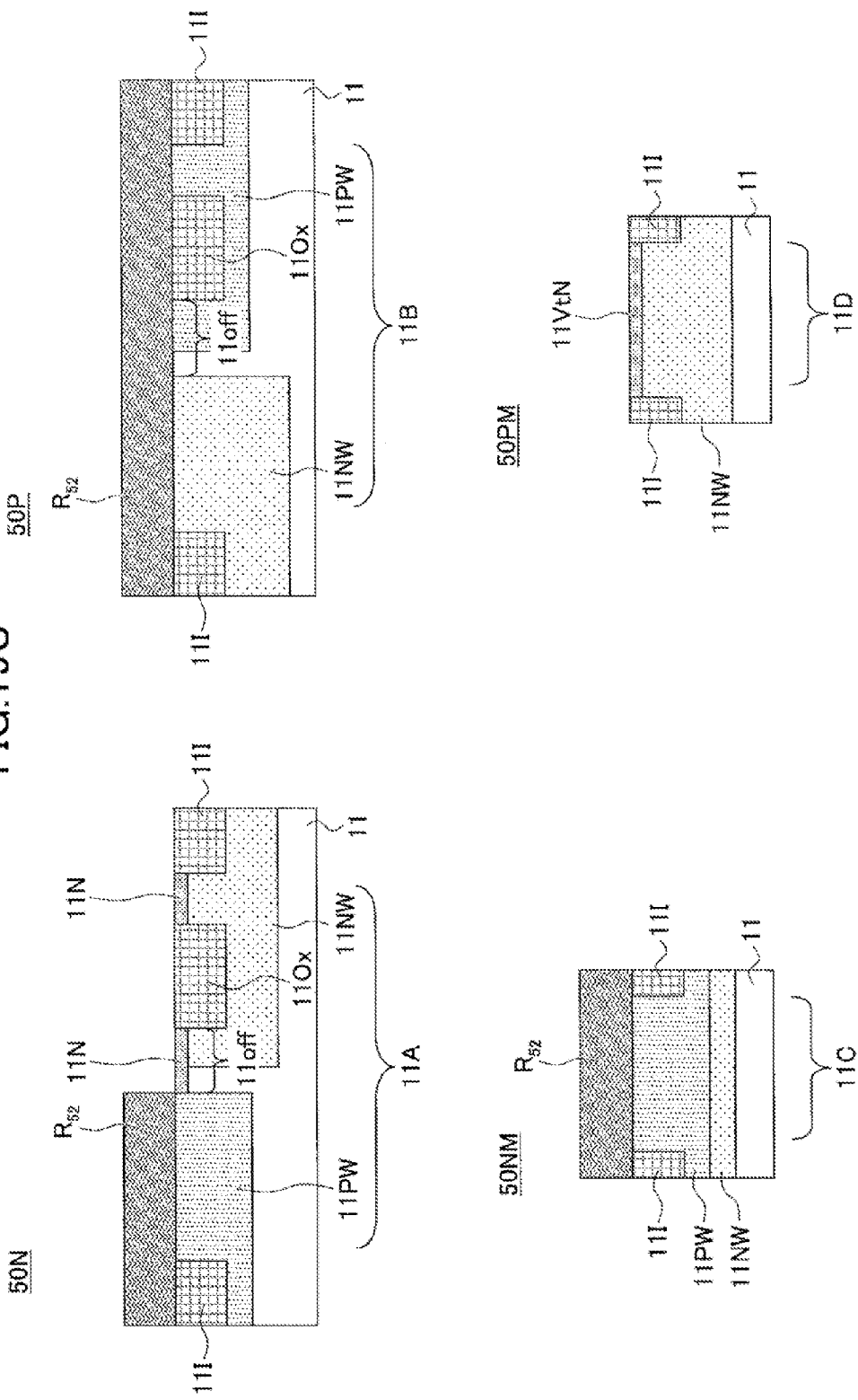
FIG. 19C is a third diagram explaining the fabrication process of the semiconductor integrated circuit device according to the fifth embodiment in partial views.
Figure 19D:
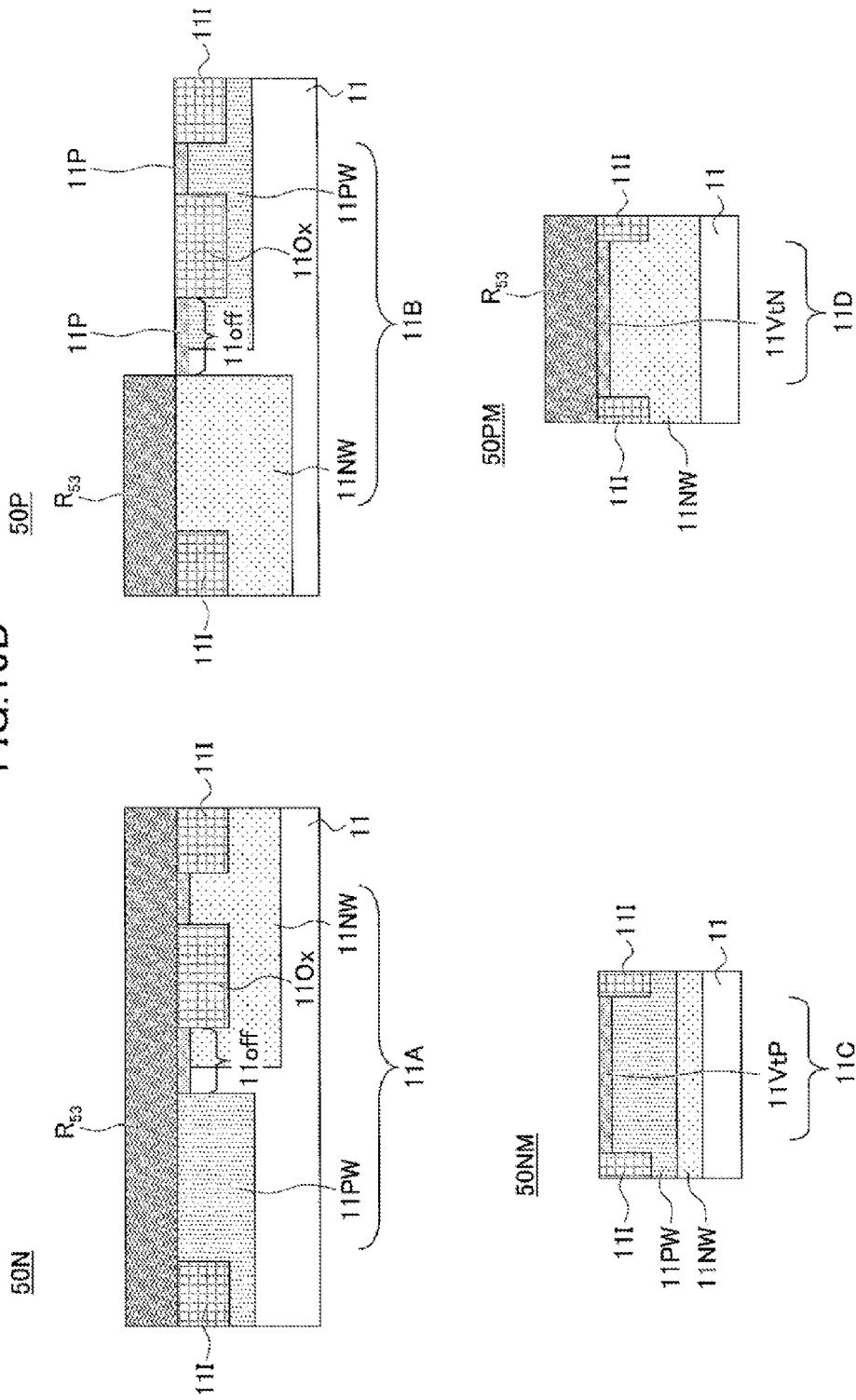
FIG. 19D is a fourth diagram explaining the fabrication process of the semiconductor integrated circuit device according to the fifth embodiment in partial views.

Further, in the step of FIG. 19C, the device region 11B and the device region 11C are protected by the resist pattern R$_{52}$, and ion implantation of phosphorus is conducted into the device regions 11A and 11D under the acceleration voltage of 15 keV and the dose of $1 \times 10^{12}$ cm$^{-2}$ while using the resist pattern R$_{52}$ as a mask. With this, the n-type region 11N is formed in the surface region of the offset region 11off and further in the region to become the drain region in the device region 11A. Further, the n-type threshold ion implantation region 11VtN is formed in the surface part of the n-type well 11D in the device region 11D.

Further, in the step of FIG. 19C, the device region 11B and the device region 11C are protected by the resist pattern R$_{52}$, and ion implantation of phosphorus is conducted into the device regions 11A and 11D under the acceleration voltage of 15 keV and the dose of $1 \times 10^{12}$ cm$^{-2}$ while using the resist pattern R$_{52}$ as a mask. With this, the n-type region 11N is formed in the surface region of the offset region 11off and further in the region to become the drain region in the device region 11A. Further, the n-type threshold ion implantation region 11VtN is formed in the surface part of the n-type well 11D in the device region 11D.

Further, in the step of FIG. 19E, the polysilicon gate electrode patterns 13GA-13GD and the gate insulation film patterns 12GA-12GD are formed on the device regions 11A-11D. Further, by conducting the process similar to those explained with reference to FIGS. 15E-15I, the structure of FIG. 18 is obtained.

In the various embodiments explained heretofore, it is possible to exchange the n-type and the p-type.

While the present invention has been explained for preferred embodiments, the present invention is not limited to such specific embodiments and various variations and modifications may be made within the scope of the invention described in patent claims.

According to the foregoing embodiments, it becomes possible to decrease the ON-resistance of the MOS transistor by increasing the concentration of the first conductivity type carriers at least in a part of the offset region along the surface of the semiconductor substrate as compared with the first well while suppressing degradation of the breakdown characteristics.

Thus, the present disclosures have been described herein with reference to preferred embodiments. While the present disclosures have been shown and described with particular examples, it should be understood that various changes and modifications may be made to the particular examples without departing from the scope of the broad spirit and scope of the present disclosures as defined in the claims.

All examples and conditional language used herein are intended for pedagogical purposes to aid the reader in understanding the principles of the disclosures and the concepts contributed by the inventor to furthering the art, and are to be construed as being without limitation to such specifically recited examples and conditions, nor does the organization of such examples in the specification relate to a showing of the superiority or inferiority of the disclosures. Although the embodiment of the present disclosures has been described in detail, it should be understood that various changes, substitutions, and alterations could be made hereto without departing from the spirit and scope of the disclosures.

What is claimed is:

1. A semiconductor device, comprising:
    a semiconductor substrate including a first well of a first conductivity type and a second well of a second conductivity type opposite to said first conductivity type;
    a channel region formed in said second well and having said second conductivity type, said channel region having a first end and a second end, said second end coinciding with an end surface of said second well facing said first well;
    a source extension region having said first conductivity type formed in said second well adjacent to said first end of said channel region;
    a buried insulation film region formed in said first well with a separation from said second well with a bottom edge located at a depth of 400 nm, shallower than a bottom edge of said first well;
    an offset region formed in said semiconductor substrate between said second well and said buried insulation film region;
    a drain extension region having said first conductivity type and formed in said first well at a side opposite to said offset region with regard to said buried insulation film; and
    a gate structure formed above said channel region, said offset region and said buried insulation film region,
    said gate structure comprising:
    a gate insulation film formed above said channel region, said offset region and said buried insulation film region; and
    a gate electrode on said gate insulation film, there being formed a region containing an impurity element of said first conductivity type at least in a part of said offset region along a surface of said semiconductor substrate with a concentration higher than in said first well,
    wherein said region is formed such that said concentration of said impurity element of said first conductivity type does not exceed a concentration level of about $2.5 \times 10^{16}$ $cm^{-3}$ at a death of 400 nm.

2. The semiconductor device as claimed in claim 1, wherein said first well and said second well are in contact with each other in said semiconductor substrate.

3. The semiconductor device as claimed in claim 1, wherein said second well is formed in said first well.

4. The semiconductor device as claimed in claim 1, wherein said first well is formed in said second well.

5. The semiconductor device as claimed in claim 1, wherein said second well is formed outside said first well with a separation from said first well.

6. The semiconductor device as claimed in claim 1, wherein said region containing said impurity element of said first conductivity type with a concentration higher than said first well extends in said offset region from a first end in contact with said buried insulation film region to a second end in contact with said second well.

7. The semiconductor device as claimed in claim 1, wherein said region containing said impurity element of said first conductivity type with a concentration higher than said first well extends in said offset region from a first end in contact with said buried insulation film region to a second end toward said second well, said second end of said region containing said impurity element of said first conductivity type with a concentration higher than said first well being separated from said second well.

8. The semiconductor device as claimed in claim 1, wherein, in said region in which said impurity element of said first conductivity type is contained with a concentration exceeding said first well, said concentration of said impurity element of said first conductivity type is generally constant from said bottom edge of said buried insulation film to a surface of said semiconductor substrate.

9. The semiconductor device as claimed in claim 1, wherein there is formed a device isolation region of an STI in said semiconductor substrate, and wherein a depth of said bottom edge of said buried insulation film is identical with a depth of a bottom edge of said device isolation region.

10. A semiconductor device, comprising:
    a semiconductor substrate including a first well of a first conductivity type and a second well of a second conductivity type opposite to said first conductivity type;
    a channel region formed in said second well and having said second conductivity type, said channel region having a first end and a second end, said second end coinciding with an end surface of said second well facing said first well;
    a source extension region having said first conductivity type formed in said second well adjacent to said first end of said channel region;
    a buried insulation film region formed in said first well with a separation from said second well with a bottom edge located at a depth shallower than a bottom edge of said first well;
    an ion implanted region having said first conductivity type formed in said first well between said second well and said buried insulation film region, and being along a surface of said semiconductor substrate;
    a drain extension region having said first conductivity type and formed in said first well at a side opposite to said ion implanted region with regard to said buried insulation film; and a gate structure formed above said channel region, said ion implanted region and said buried insulation film region,
said gate structure comprising:
a gate insulation film formed above said channel region, said ion implanted region and said buried insulation film region; and
a gate electrode on said gate insulation film,
wherein each of said ion implanted region and said first well has a first peak and a second peak in a depth profile of an impurity element concentration of said first conductivity type, respectively, a position of said first peak is shallower than a position of said second peak and a bottom edge of said buried insulation film region.

* * * * *

UNITED STATES PATENT AND TRADEMARK OFFICE
CERTIFICATE OF CORRECTION

| | |
|---|---|
| PATENT NO. | : 8,981,472 B2 |
| APPLICATION NO. | : 13/293252 |
| DATED | : March 17, 2015 |
| INVENTOR(S) | : Takae Sukegawa and Youichi Momiyama |

It is certified that error appears in the above-identified patent and that said Letters Patent is hereby corrected as shown below:

Title page, the Inventors should be corrected as shown below:

-- Item (75)    Inventors: Takae Sukegawa, Yokohama (JP);
    Youichi Momiyama, Yokohama (JP) --

Signed and Sealed this
Fourth Day of August, 2015

Michelle K. Lee
*Director of the United States Patent and Trademark Office*